(12) United States Patent
Nekado et al.

(10) Patent No.: US 9,632,265 B2
(45) Date of Patent: Apr. 25, 2017

(54) OPTICAL MODULE, OPTICAL MODULE MOUNTING METHOD, OPTICAL MODULE-MOUNTED CIRCUIT SUBSTRATE, OPTICAL MODULE EVALUATION KIT SYSTEM, CIRCUIT SUBSTRATE, AND COMMUNICATION SYSTEM

(71) Applicant: Furukawa Electric Co., Ltd., Tokyo (JP)

(72) Inventors: Yoshinobu Nekado, Tokyo (JP); Yozo Ishikawa, Tokyo (JP); Naoya Nishimura, Tokyo (JP); Toshinori Uemura, Tokyo (JP); Hideyuki Nasu, Tokyo (JP)

(73) Assignee: FURUKAWA ELECTRIC CO. LTD., Tokyo (JP)

( * ) Notice: Subject to any disclaimer, the term of this patent is extended or adjusted under 35 U.S.C. 154(b) by 0 days.

(21) Appl. No.: 14/987,016

(22) Filed: Jan. 4, 2016

(65) Prior Publication Data
US 2016/0116695 A1 Apr. 28, 2016

Related U.S. Application Data

(63) Continuation of application No. PCT/JP2013/068563, filed on Jul. 5, 2013.

(51) Int. Cl.
*G02B 6/12* (2006.01)
*G02B 6/42* (2006.01)
(Continued)

(52) U.S. Cl.
CPC ............ *G02B 6/4293* (2013.01); *G02B 6/30* (2013.01); *G02B 6/32* (2013.01); *G02B 6/421* (2013.01);
(Continued)

(58) Field of Classification Search
CPC .......... G02B 6/4293; G02B 6/30; G02B 6/32; G02B 6/4204; G02B 6/421
(Continued)

(56) References Cited

U.S. PATENT DOCUMENTS 7,121,743 B2 * 10/2006 Mizue ................. G02B 6/4201
385/88
7,404,680 B2 * 7/2008 Ono ..................... G02B 6/4292
385/14
(Continued)

FOREIGN PATENT DOCUMENTS

JP 9-298257 11/1997
JP 2000-98153 4/2000
(Continued)

OTHER PUBLICATIONS

International Search Report issued Jul. 30, 2013 in PCT/JP2013/068563, filed Jul. 5, 2013 (with English Translation).
(Continued)

*Primary Examiner* — Ellen Kim
(74) *Attorney, Agent, or Firm* — Oblon, McClelland, Maier & Neustadt, L.L.P.

(57) ABSTRACT

An optical module includes a housing including an internal space that has an opening in a substrate mounting surface, an element mounting surface that forms a portion of an inner surface of the internal space, and a waveguide introduction opening that is formed in a side surface intersecting the substrate mounting surface and is opened to the opening of the substrate mounting surface and communicated with the internal space, an optical element that is mounted on the element mounting surface, and an electronic element that is mounted on the element mounting surface and is connected to the optical element. When the substrate mounting surface is mounted on a circuit substrate, an optical waveguide that protrudes from a surface of the circuit substrate is introduced (Continued)

into the internal space through the waveguide introduction opening.

25 Claims, 40 Drawing Sheets

(51) Int. Cl.
  *G02B 6/30* (2006.01)
  *G02B 6/32* (2006.01)
(52) U.S. Cl.
  CPC ........... *G02B 6/4204* (2013.01); *G02B 6/428* (2013.01); *G02B 6/4231* (2013.01); *G02B 6/4232* (2013.01); *G02B 6/4249* (2013.01); *G02B 6/4257* (2013.01); *G02B 6/4292* (2013.01)
(58) Field of Classification Search
  USPC ......................................... 385/31, 33, 88, 14
  See application file for complete search history.

(56) References Cited

U.S. PATENT DOCUMENTS

| | | | | |
|---|---|---|---|---|
| 7,427,164 | B2* | 9/2008 | Schempp | G02B 6/421 385/53 |
| 8,374,470 | B2* | 2/2013 | Ban | G02B 6/43 385/34 |
| 8,634,683 | B2* | 1/2014 | Yanagisawa | G02B 6/43 385/129 |
| 2002/0021871 | A1 | 2/2002 | Auburger et al. | |
| 2004/0184737 | A1* | 9/2004 | Oono | G02B 6/4201 385/52 |
| 2004/0202477 | A1 | 10/2004 | Nagasaka et al. | |
| 2009/0028575 | A1 | 1/2009 | Epitaux et al. | |
| 2010/0054671 | A1 | 3/2010 | Ban et al. | |
| 2010/0061683 | A1 | 3/2010 | Sasaki | |
| 2010/0202732 | A1 | 8/2010 | Sameshima et al. | |
| 2011/0108716 | A1 | 5/2011 | Shiraishi | |
| 2011/0207344 | A1 | 8/2011 | McColloch | |
| 2012/0027345 | A1 | 2/2012 | Castagna et al. | |
| 2012/0063718 | A1 | 3/2012 | Steijer et al. | |
| 2013/0156386 | A1 | 6/2013 | Miller | |
| 2013/0251619 | A1 | 9/2013 | Rikihisa et al. | |
| 2013/0321662 | A1 | 12/2013 | Ishikawa et al. | |
| 2013/0322834 | A1 | 12/2013 | Ishikawa et al. | |
| 2014/0064662 | A1* | 3/2014 | Ootorii | G02B 6/26 385/33 |
| 2014/0064675 | A1 | 3/2014 | Tanaka et al. | |
| 2014/0328561 | A1 | 11/2014 | Tanaka et al. | |
| 2014/0346697 | A1 | 11/2014 | Rikihisa et al. | |

FOREIGN PATENT DOCUMENTS

| | | |
|---|---|---|
| JP | 2002-189137 | 7/2002 |
| JP | 2003-131080 | 5/2003 |
| JP | 2003-139979 | 5/2003 |
| JP | 2004-29621 | 1/2004 |
| JP | 2004-246279 | 9/2004 |
| JP | 2005-70082 | 3/2005 |
| JP | 2007086367 A * | 4/2007 |
| JP | 2010-67731 | 3/2010 |
| JP | 2010-152075 | 7/2010 |
| JP | 2011-107206 | 6/2011 |
| JP | 2011-210708 | 10/2011 |
| JP | 5117640 | 1/2013 |
| JP | 2013-178348 | 9/2013 |
| WO | WO 2006/060909 A1 | 6/2006 |
| WO | WO 2009/020165 A1 | 2/2009 |
| WO | WO 2013/099415 A1 | 7/2013 |

OTHER PUBLICATIONS

Written Opinion issued Jul. 30, 2013 in PCT/JP2013/068563, filed Jul. 5, 2013.
"Cover Story: Part 2: The Optical Components That Have Thus Far Assisted Electrical Transmission", Nikkei Electronics, Dec. 3, 2011, 22 pages (with English Translation).
Office Action issued in Japanese Patent Application No. 2014-513612 on May 13, 2014 with English-language translation, 4 pages.
Office Action issued in Japanese Patent Application No. 2014-197593 on Nov. 25, 2014 with English-language translation, 5 pages.
Office Action issued in Japanese Patent Application No. 2012-041528 on Jul. 29, 2015 with English-language translation, 9 pages.
Supplementary European Search Report issued Feb. 10, 2017 in European Patent Application No. 13 88 8578.5.

* cited by examiner

OPTICAL MODULE, OPTICAL MODULE MOUNTING METHOD, OPTICAL MODULE-MOUNTED CIRCUIT SUBSTRATE, OPTICAL MODULE EVALUATION KIT SYSTEM, CIRCUIT SUBSTRATE, AND COMMUNICATION SYSTEM

CROSS-REFERENCE TO RELATED APPLICATION

This application is a continuation of PCT International Application No. PCT/JP2013/068563 filed on Jul. 5, 2013, the entire contents of which are incorporated herein by reference.

BACKGROUND OF THE INVENTION

1. Field of the Invention

The present invention relates to an optical module, an optical module mounting method, an optical module-mounted circuit substrate, an optical module evaluation kit system, a circuit substrate, and a communication system.

2. Description of the Related Art

Optical interconnection between boards has been studied in order to achieve exascale computing. In the optical interconnection, an optical module which is an optical transmitter or an optical receiver transmits or receives optical signals through an optical transmission line. Japanese Laid-open Patent Publication No. 2004-29621, Japanese Laid-open Patent Publication No. 2000-98153, Japanese Laid-open Patent Publication No. 2002-189137, Japanese Laid-open Patent Publication No. 2003-139979, and Japanese Patent No. 5117640 disclose a structure in which an optical module and an optical transmission line are formed on a circuit substrate.

SUMMARY OF THE INVENTION

It is an object of the present invention to at least partially solve the problems in the conventional technology.

In accordance with one aspect of the present invention, an optical module includes: a housing including an internal space that has an opening in a substrate mounting surface, an element mounting surface that forms a portion of an inner surface of the internal space, and a waveguide introduction opening that is formed in a side surface intersecting the substrate mounting surface and is connected to the opening and the internal space; an optical element that is mounted on the element mounting surface; and an electronic element that is mounted on the element mounting surface and is connected to the optical element. When the substrate mounting surface is mounted on a circuit substrate, an optical waveguide that protrudes from a surface of the circuit substrate is introduced into the internal space through the waveguide introduction opening.

In accordance with another aspect of the present invention, a circuit substrate includes: an optical waveguide that protrudes from a surface of the circuit substrate; and the optical module according to an aspect of the present invention that has the substrate mounting surface mounted on the circuit substrate such that the optical waveguide is introduced into the internal space through the waveguide introduction opening.

In accordance with still another aspect of the present invention, an optical module-mounted circuit substrate includes: the optical module according to an aspect of the present invention; an optical coupling member that is optically coupled with the optical module; and a circuit substrate on which the optical module and the optical coupling member are mounted and which has a main surface having an opening formed therein and is electrically connected to the optical module. The positioning of the optical module and the optical coupling member in at least a horizontal direction of the main surface of the circuit substrate is performed through the opening.

In accordance with still another aspect of the present invention, an optical module evaluation kit system for evaluating an optical module, includes the optical module-mounted circuit substrate according to an aspect of the present invention.

In accordance with still another aspect of the present invention, a communication system includes: the optical module, the circuit substrate, or the optical module-mounted circuit substrate according to an aspect of the present invention.

In accordance with still another aspect of the present invention, an optical module mounting method includes: placing the optical module an aspect of the present invention such that the substrate mounting surface faces a circuit substrate; aligning three alignment guide holes which are formed in the housing so as to extend from a surface opposite to the substrate mounting surface to the substrate mounting surface with three markers which are provided on the circuit substrate so as to correspond to the arrangement of the three alignment guide holes, while observing the three markers through the three alignment guide holes, thereby aligning the optical module with the circuit substrate; and mounting the aligned optical module on the circuit substrate.

In accordance with still another aspect of the present invention, an optical module mounting method includes: attaching, to the optical module according to an aspect of the present invention, a protector that covers and protects a surface from which the optical element is exposed; and mounting the optical module on the circuit substrate, with the substrate mounting surface facing the circuit substrate.

In accordance with still another aspect of the present invention, an optical module mounting method includes: mounting the optical module according to an aspect of the present invention on the circuit substrate, with the substrate mounting surface facing the circuit substrate; attaching a height adjuster including a height adjustment portion to the optical module such that a lower end of the height adjustment portion is substantially flush with or lower than the substrate mounting surface in the waveguide introduction opening; and filling a gap between the circuit substrate and the optical module having the height adjuster attached thereto with an underfill material.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
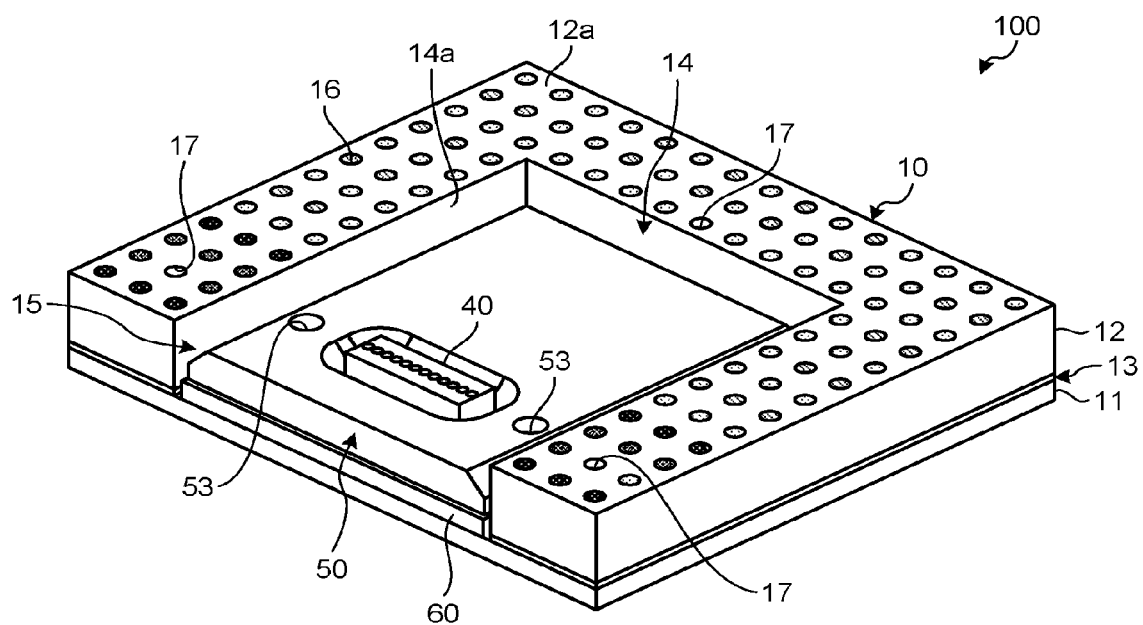
FIG. 1 is a perspective view schematically illustrating an optical module according to a first embodiment.

Hereafter, embodiments of an optical module, an optical module mounting method, an optical module-mounted circuit substrate, an optical module evaluation kit system, a circuit substrate, and a communication system according to embodiments of the present invention will be explained with reference to the drawings. The embodiments do not limit the present invention. In all the drawings, identical or corresponding elements are given same reference numerals. It should be noted that the drawings show schematic examples. Accordingly, a relationship between respective elements may be different from real values. Among the drawings, there may be parts where the relationships and ratios of the shown sizes are different from one another.

In the optical interconnection between the boards, an organic optical waveguide made of an organic optical material is expected to be applied as the optical transmission line. However, since the organic optical waveguide is attached onto the circuit substrate, it protrudes from the surface of the substrate. Therefore, when the organic optical waveguide is mounted on the circuit substrate, there is a concern that the organic optical waveguide will physically interfere with a housing of an optical module which is optically coupled to the organic optical waveguide.

In contrast, according to the embodiment described below, physical interference with an optical waveguide is prevented.

First Embodiment

Figure 2:
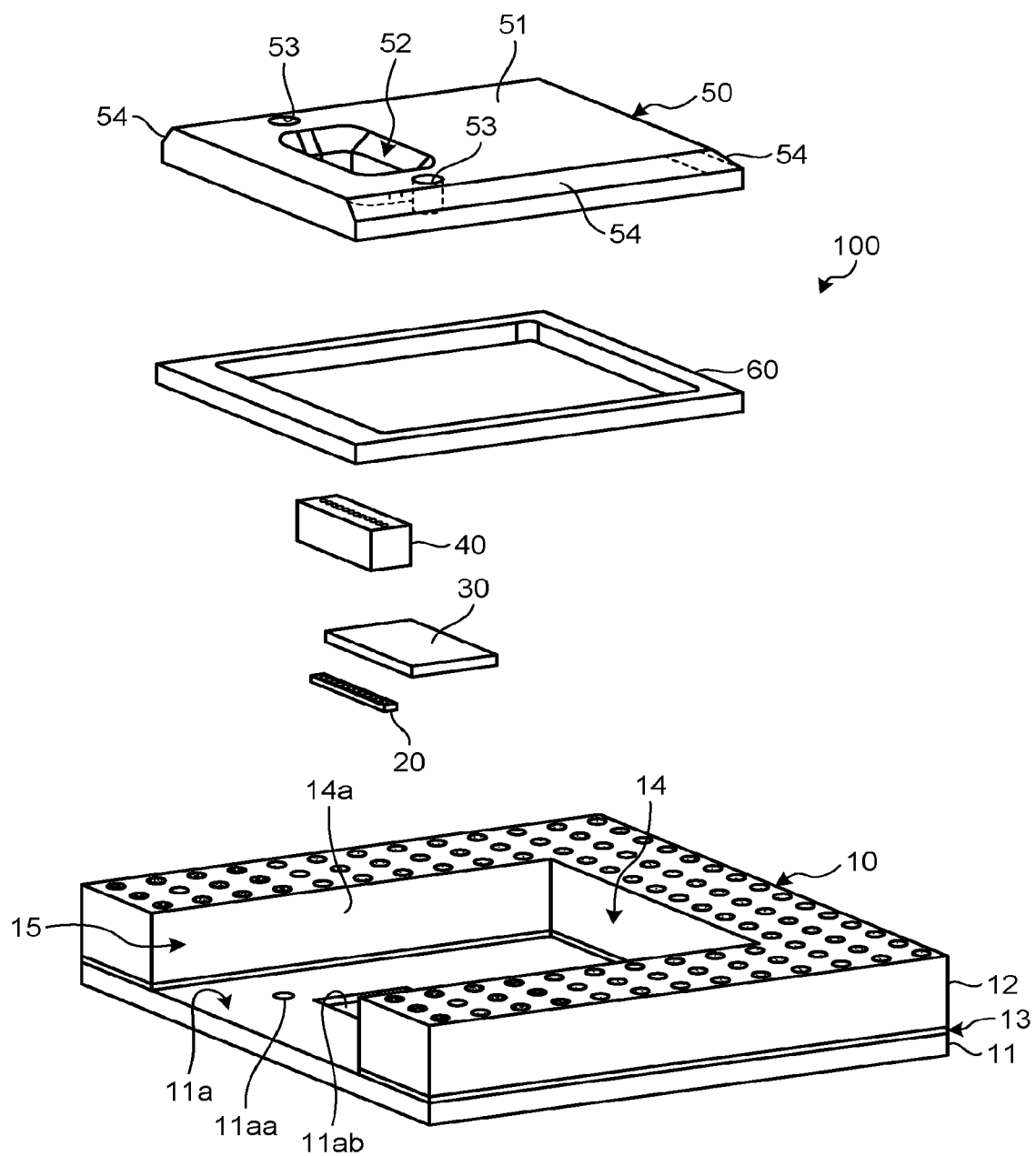
FIG. 2 is an exploded view illustrating the optical module illustrated in FIG. 1.
Figure 3:
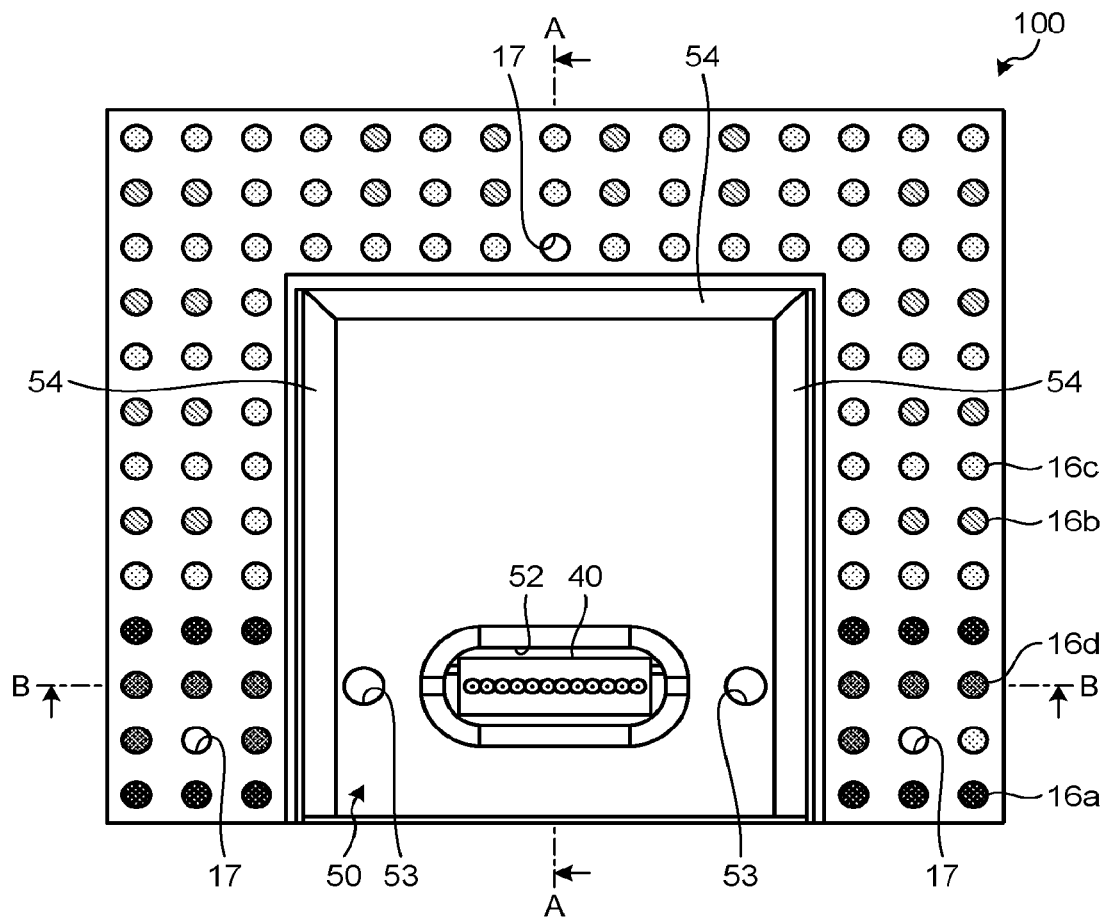
FIG. 3 is a plan view illustrating the optical module illustrated in FIG. 1.
Figure 4:
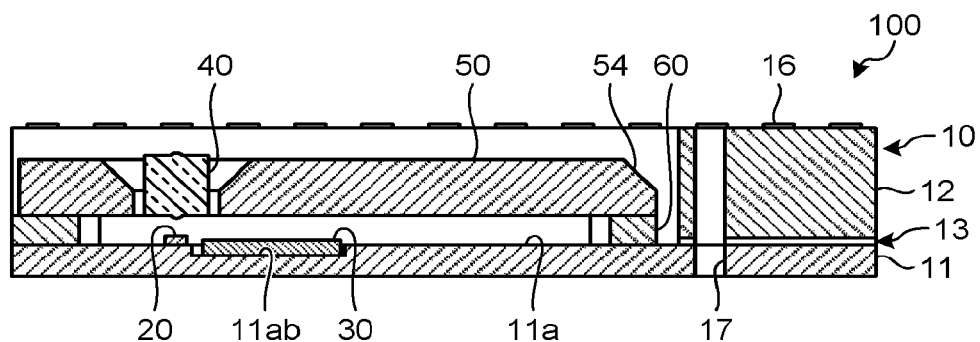
FIG. 4 is a cross-sectional view taken along the line A-A of FIG. 3.
Figure 5:
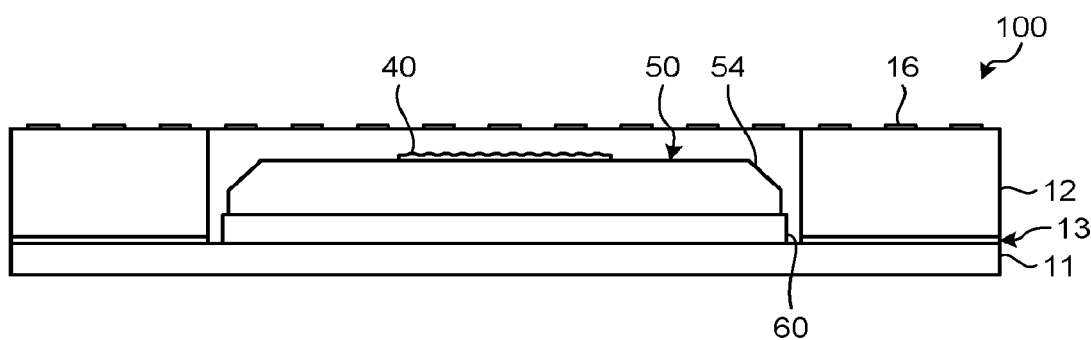
FIG. 5 is a front view illustrating the optical module illustrated in FIG. 1.
Figure 6:
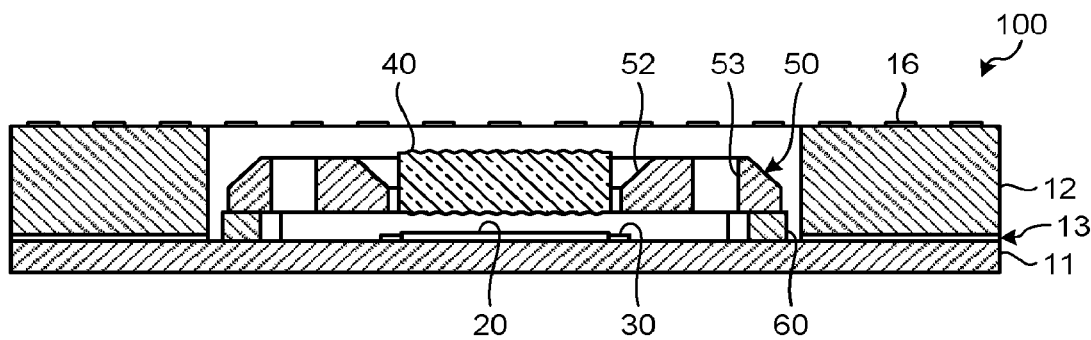
FIG. 6 is a cross-sectional view taken along the line B-B of FIG. 3.

FIG. 1 is a perspective view schematically illustrating an optical module according to a first embodiment. FIG. 2 is an exploded view illustrating the optical module illustrated in FIG. 1. FIG. 3 is a plan view illustrating the optical module illustrated in FIG. 1. FIG. 4 is a cross-sectional view taken along the line A-A of FIG. 3. FIG. 5 is a front view illustrating the optical module illustrated in FIG. 1. FIG. 6 is a cross-sectional view taken along the line B-B of FIG. 3. Hereinafter, the optical module according to the first embodiment will be described with reference to FIGS. 1 to 6.

An optical module 100 includes a housing 10, a vertical cavity surface emitting laser (VCSEL) array element 20, a driver IC 30, a microlens array element 40, a lens array element holder 50, and a spacer 60.

The housing 10 includes a rectangular plate member 11 and a U-shaped frame member 12. The plate member 11 has, for example, a stacked substrate structure in which five dielectric films, such as five resin films, and five copper films forming a wiring pattern are alternately stacked. The frame member 12 has, for example, a stacked substrate structure in which nine dielectric films, such as nine resin films, and nine copper films forming a wiring pattern are alternately stacked. The plate member 11 and the frame member 12 are bonded by a bonding layer 13 with, for example, solder or Au bumps so as to ensure the electrical connection between the wiring patterns of the plate member 11 and the frame member 12. The plate member 11 and the frame member 12 are bonded to each other to form an internal space 14, an element mounting surface 11a, and a waveguide introduction opening 15 in the housing 10. The internal space 14 includes an opening 14a which is formed in a substrate mounting surface 12a of the frame member 12 opposite to a surface bonded to the plate member 11 and is surrounded by the frame member 12. The element mounting surface 11a is a portion of the surface of the plate member 11 to which the frame member 12 is not bonded and forms a portion of the inner surface of the internal space 14. The waveguide introduction opening 15 is formed in a side surface which intersects the substrate mounting surface 12a by the opening of the frame member 12 and is connected to the opening 14a and the internal space 14.

A marker 11aa and a concave portion 11ab for mounting the driver IC 30 are formed in the element mounting surface 11a. A land grid array in which planar electrode pads 16 having a diameter of 450 μm are arranged in a lattice shape at a pitch of, for example, 1 mm is formed on the substrate mounting surface 12a. The planar electrode pads 16 include, for example, a planar electrode pad 16a for power supply, a planar electrode pad 16b for a differential high frequency signal, a planar electrode pad 16c for ground, and a planar electrode pad 16d for a control signal. In the drawings, the same type of planar electrode pad is hatched in the same manner.

Three guide holes 17 for alignment are formed in the housing 10 so as to extend from the substrate mounting surface 12a of the frame member 12 to a rear surface of the plate member 11 opposite to the substrate mounting surface 12a. The guide holes 17 are arranged so as to form an isosceles triangle in FIG. 3.

The VCSEL array element 20 which is an optical element includes a plurality of (for example, 12) VCSEL elements which are arranged in a one-dimensional array and is mounted in the vicinity of the concave portion 11ab of the element mounting surface 11a. The driver IC 30 which is an electronic element is used to drive the VCSEL array element 20 and is mounted in the concave portion 11ab of the element mounting surface 11a. The microlens array element 40 is arranged so as to correspond to the VCSEL array element 20 and includes, for example, 12 microlenses which correspond to the number of VCSEL elements in the VCSEL array element 20 and are arranged in a one-dimensional array. Each microlens in the microlens array element 40 receives a laser optical signal output from each VCSEL element, focuses the laser optical signal, and achieves predetermined optical coupling with, for example, an external optical component. The microlens array element 40 is made of a translucent material including glass, such as silica-based glass, or a resin which transmits light emitted from the VCSEL array element.

The lens array element holder 50 holds the microlens array element 40 using a holding hole 52 formed in a main surface 51 such that the optical axis of each microlens in the microlens array element 40 is aligned with the optical axis of each VCSEL element in the VCSEL array element 20. The lens array element holder 50 includes guide holes 53 which are formed on both side of the holding hole 52 and function as a guide mechanism for alignment. The use of the guide holes 53 makes it possible to fit an MT-type optical connector to the optical module 100 and to easily test and evaluate the characteristics of the optical module 100. The MT-type optical connector means an optical connector in which guide pin holes into which fitting pins can be inserted are formed at both sides of a connection end surface and an optical fiber is arranged between the guide pin holes, like an MT connector defined by JIS C5981. The spacer 60 is interposed between the element mounting surface 11a of the plate member 11 and the lens array element holder 50. When the thickness of the spacer 60 is changed, the distance between the microlens array element 40 and the VCSEL array element 20 is changed. Then, the focusing position of the laser light emitted from the VCSEL array element 20 through the microlens array element 40 is also changed. This makes it possible to perform correction such that a variation in the distance from the substrate mounting surface 12a to a focusing point of the microlens array element 40 due to the tolerance of the height of the internal space 14 of the housing 10 is reduced. In the lens array element holder 50, a portion of a side surface 54 which faces the frame member 12 is chamfered so as to be inclined with respect to the main surface 51. It is preferable that the lens array element holder 50 and the spacer 60 be made of a metal material with high thermal conductivity, such as copper.

Next, the operation of the optical module 100 will be described. First, the driver IC 30 is supplied with, for example, a power supply voltage signal, a differential high frequency signal, and a control signal from the outside through the planar electrode pad 16 and the wiring pattern formed in the housing 10 and drives the VCSEL array element 20 on the basis of these signals. Each VCSEL element in the VCSEL array element 20 outputs a laser optical signal with a wavelength of, for example, 1.1 µm to 1.5 µm including the differential high frequency signal. Each microlens in the microlens array element 40 receives the laser optical signal output from each VCSEL element, focuses the laser optical signal, and achieves predetermined optical coupling with, for example, an external optical component. It is preferable to use a lens element, such as the microlens array element 40, in order to achieve the optical coupling. In this case, it is possible to improve coupling efficiency, as compared to so-called butt coupling without using the lens element.

Next, a method for assembling the optical module 100 will be described. First, the plate member 11 and the frame member 12 are bonded to each other by, for example, solder reflow or Au bump welding. In this case, for example, SnAgCu-based solder having a melting point of about 220° C. is used. In addition, three guide holes 17 can be used for the alignment between the plate member 11 and the frame member 12.

Then, the VCSEL array element 20 is mounted on the element mounting surface 11a. It is preferable to use the marker 11aa for the alignment. In this case, it is possible to mount the VCSEL array element 20 at an exact position. Then, the driver IC 30 is mounted in the concave portion 11ab of the element mounting surface 11a. The driver IC 30 is bonded to an electrode pad formed on the element mounting surface 11a by a wire. The VCSEL array element 20 and the driver IC 30 are bonded to each other by wire bonding. Since the driver IC 30 is mounted in the concave portion 11ab, the difference in height between the VCSEL array element 20 and the driver IC 30 is reduced. Therefore, it is possible to reduce the length of a bonding wire. As a result, the deterioration of the quality of the differential high frequency signal which is output from the driver IC 30 to the VCSEL array element 20 through wire bonding is prevented.

Among the planar electrode pads 16, the planar electrode pad 16a for power supply and the planar electrode pad 16d for a control signal are arranged close to the waveguide introduction opening 15 (U-shaped leading end) of the frame member 12. According to this structure, a wiring pattern for a signal other than the differential high frequency signal is not present on a path from the planar electrode pad 16b for a differential high frequency signal to the driver IC 30 through the wiring pattern in the housing 10. Therefore, it is easy to treat a wiring pattern for a differential high frequency signal and it is possible to reduce the length of the pattern and to prevent the influence of a low-frequency component of a power supply. As a result, the deterioration of the quality of the differential high frequency signal is prevented.

Then, the spacer 60 is bonded to the element mounting surface 11a by, for example, an adhesive. It is preferable that the thickness of the plate member 11 be small in order to reduce the height (thickness) of the optical module 100 and thus reduce the size of the optical module 100 while ensuring the height of the internal space 14 and in order to effectively dissipate heat generated during the operation of the driver IC 30. However, when the plate member 11 is too small, there is a concern that the deformation, such as warpage or flexure, of the plate member 11 will occur due to heat from the driver IC 30. In this case, for example, the distance between the VCSEL array element 20 and the microlens array element 40 is changed, which may cause the deterioration of the state of the above-mentioned predetermined optical coupling. In contrast, when the spacer 60 is made of a material, such as metal with a higher rigidity than that forming the housing 10, the deformation of the plate member 11 is prevented. Therefore, the deterioration of the state of the predetermined optical coupling is also prevented.

As described above, since the frame member 12 has the structure in which dielectrics and copper films are alternately stacked, an error in the thickness of the frame member 12 from the design value is likely to occur due to, for example, a manufacturing error. When there is an error in the thickness of the frame member 12, an error in the height of the internal space 14 also occurs. As a result, an error occurs in the predetermined optical coupling achieved by the microlens array element 40. For this reason, spacers 60 with different thicknesses are prepared in advance and a spacer 60 with a thickness capable of cancelling an error in the thickness (the height of the internal space 14) of the frame member 12 which has been measured in advance is selected and used. According to this structure, the above-mentioned optical coupling error problem is solved.

Then, the microlens array element 40 is inserted into the holding hole 52 of the lens array element holder 50 and is then bonded thereto. Then, the lens array element holder 50 is placed on the spacer 60 and the VCSEL array element 20 and the microlens array element 40 are aligned with each other. Then, the lens array element holder 50 is bonded to the spacer 60. At that time, it is preferable that the gap between the lens array element holder 50 or the spacer 60 and the driver IC 30 be filled with a resin with high thermal conductivity, such as silicone. In this case, heat generated during the operation of the driver IC 30 is dissipated from the lens array element holder 50 or the spacer 60 through the resin.

The alignment between the VCSEL array element 20 and the microlens array element 40 can be performed by a so-called active alignment method which operates the VCSEL array element 20 such that laser light is output and observes the state of light transmitted through the microlens array element 40. In addition, the state of light transmitted through the microlens array element 40 may be observed by, for example, a microscope.

Alternatively, an MT connector of an optical fiber array with a known MT connector may be arranged so as to face the microlens array element 40 and the intensity of laser light output from the optical fiber array may be measured. In this embodiment, the MT connector is used. However, any member having an optical fiber with a positioning structure provided therein can be used. The guide holes 53 are provided for alignment with an MT connector for evaluation through guide pins. In this case, the guide pins are inserted into the guide holes of the MT connector and the guide holes 53 of the lens array element holder 50 to easily fit the MT connector to the lens array element holder 50. At that time, a spacer is inserted between a light input/output end surface of an organic waveguide and the MT connector such that light is coupled to an optical connection end surface of the MT connector. According to this structure, it is possible to accurately align the MT connector with the microlens array element 40 and to easily evaluate the characteristics of the optical module 100. Therefore, active alignment with high positioning accuracy is achieved.

As described above, in the lens array element holder 50, a portion of the side surface 54 which faces the frame member 12 is chamfered. Therefore, an adhesive for bonding the lens array element holder 50 to the spacer 60 is likely to flow into the holding hole and workability is improved.

Figure 7:
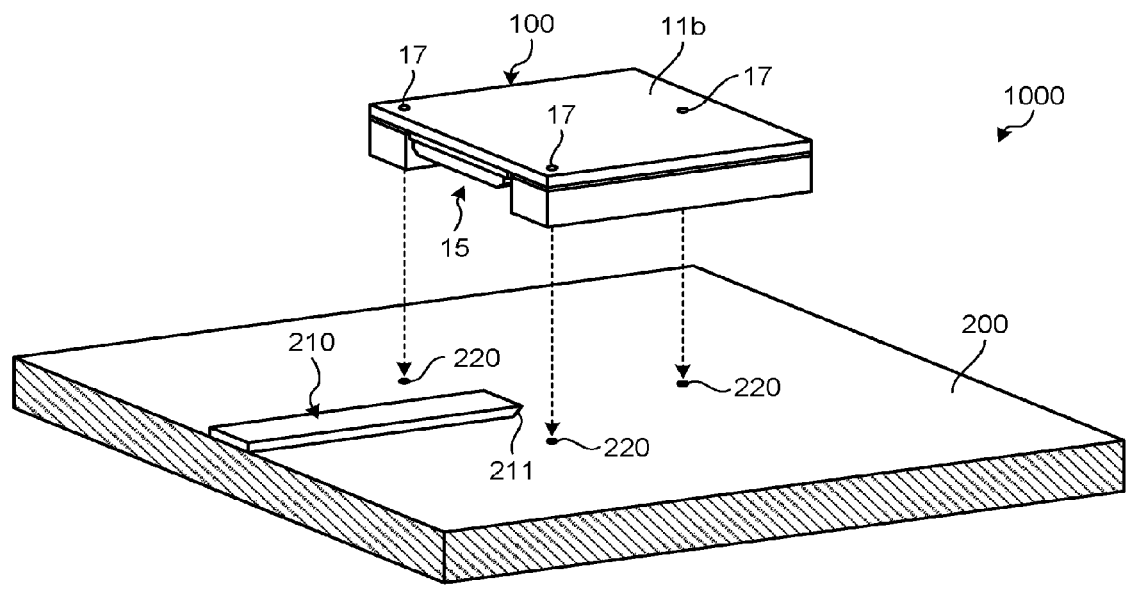
FIG. 7 is a diagram illustrating a method for mounting the optical module on a circuit substrate.

Then, a method for mounting the optical module 100 on a circuit substrate will be described. FIG. 7 is a diagram illustrating the method for mounting the optical module on the circuit substrate. As illustrated in FIG. 7, an organic optical waveguide 210 is mounted on a circuit substrate 200 by adhesion. One end of the organic optical waveguide 210 is processed into a wedge portion 211. In addition, three markers 220 which are arranged so as to correspond to the arrangement of the guide holes 17 in the optical module 100 are provided on the circuit substrate 200.

For example, a known flip-chip bonder can be used to mount the optical module 100 on the circuit substrate 200. In this case, the rear surface 11b of the optical module 100 is sucked and lifted by the head of the flip-chip bonder and the optical module 100 is moved and placed at a predetermined position on the circuit substrate 200. Then, heat is applied from the head through the housing 10 to solder each planar electrode pad 16 of the optical module 100 to each electrode pad of the circuit substrate 200. In this way, a circuit substrate 1000 having the optical module 100 mounted thereon is completed.

During the mounting, the substrate mounting surface 12a of the optical module 100 faces the circuit substrate 200 and the alignment between the guide holes 17 and the markers 220 on the circuit substrate 200 is performed while the markers 220 on the circuit substrate 200 are observed through the guide holes 17 of the optical module 100. In this way, it is possible to accurately mount the optical module 100 at a desired position on the circuit substrate 200.

In particular, in the first embodiment, since the three guide holes 17 are aligned with the three markers 220, it is easy to check the positional deviation of the optical module 100 in the rotation direction and the amount of deviation of the optical module 100 and to correct the positional deviation. Therefore, it is easier to accurately mount the optical module 100 at a desired position on the circuit substrate 200 with high positioning accuracy. In this embodiment, the three guide holes 17 and the three markers 220 are arranged so as to form an isosceles triangle. However, they may be arranged so as to form other triangles.

The organic optical waveguide 210 protrudes from the surface of the circuit substrate 200. When the optical module 100 is mounted on the circuit substrate 200, the organic optical waveguide 210 is introduced into the internal space 14 through the waveguide introduction opening 15. Therefore, it is possible to prevent the physical interference between the organic optical waveguide 210 and the optical module 100.

When the flip-chip bonder is used for mounting, it is preferable to use low-melting-point solder with a lower melting point than high-melting-point solder for bonding the plate member 11 and the frame member 12 such that the high-melting-point solder is not melted by heat applied from the head. Examples of the low-melting-point solder include SnAgCu-based solder with a melting point of about 220° C., SnPb-based solder with a melting point of about 183° C., and SnBi-based solder with a melting point of about 137° C. However, even when SnAgCu solder is used to bond the frame member and the plate member, the melting point of the solder increases after the solder is melted. When the temperature is accurately managed during the mounting of the optical module, it is also possible to use SnAgCu-based solder. In addition, it is preferable that the microlens array element 40 be made of glass. In this case, even when heat is applied from the flip-chip bonder in order to mount the optical module, deformation caused by heat is less likely to occur. In addition, it is preferable that an adhesive used to bond the microlens array element 40, the lens array element holder 50, or the spacer 60 be made of, for example, an epoxy resin with high heat resistance.

Figure 8:
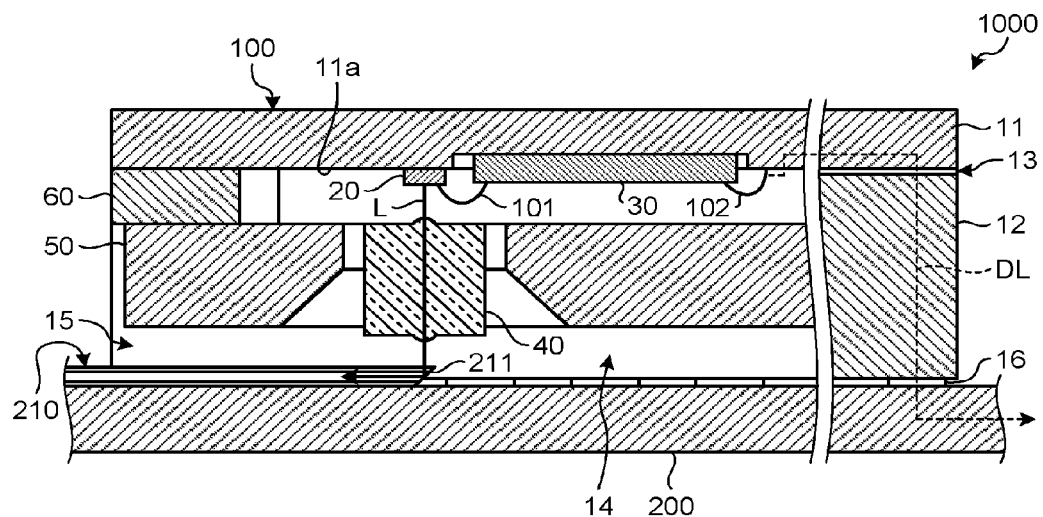
FIG. 8 is a diagram illustrating the optical module mounted on the circuit substrate.

FIG. 8 is a diagram illustrating the optical module mounted on the circuit substrate. As illustrated in FIG. 8, the VCSEL array element 20 is electrically connected to the driver IC 30 by a bonding wire 101. The driver IC 30 is electrically connected to the electrode pad (not illustrated) on the element mounting surface 11a by a bonding wire 102. The electrode pad is electrically connected from the wiring pattern formed on the element mounting surface 11a to the wiring pattern on the circuit substrate 200 through the plate member 11, the bonding layer 13, the frame member 12, and each planar electrode pad 16, as represented by an electrical path DL.

The alignment between the guide holes 17 in the optical module 100 and the markers 220 on the circuit substrate 200 is performed to align the VCSEL element with the guide hole 17 of the optical module 100 and to align the markers 220 on the circuit substrate 200 with the organic optical waveguide 210. Therefore, the optical module 100 is mounted such that the exact positional relationship between the microlens array element 40 and the organic optical waveguide 210 is established.

Since the organic optical waveguide 210 is introduced into the internal space 14 through the waveguide introduction opening 15, the organic optical waveguide 210 does not physically interfere with the optical module 100. The thickness of the frame member 12 is appropriately set to prevent the physical interference between the organic optical waveguide 210 and the microlens array element 40 and between the organic optical waveguide 210 and the lens array element holder 50. In this case, the waveguide introduction opening 15 may be closed with, for example, grease or a resin such that dust does not get into the internal space 14.

When the optical module 100 is used, the driver IC 30 is supplied with, for example, the power supply voltage signal, the differential high frequency signal, and the control signal from the circuit substrate 200 through the planar electrode pads 16. The VCSEL array element 20 is driven by the driver IC 30. Each VCSEL element outputs a laser optical signal L including the differential high frequency signal. Each microlens of the microlens array element 40 receives the laser optical signal L output from each VCSEL element and focuses the laser optical signal L on the organic optical waveguide 210 from the upper side of the organic optical waveguide 210. The wedge portion 211 reflects the focused laser optical signal L so as to be coupled to the organic optical waveguide 210. The organic optical waveguide 210 transmits the laser optical signal L to, for example, another circuit substrate.

As described above, the spacer 60 has the effect of preventing the deformation of the plate member 11 and the effect of reducing a variation in the distance from the substrate mounting surface 12a to the focusing point of the microlens array element 40 due to the tolerance of the thickness of the frame member 12. Therefore, the proper coupling of the laser optical signal L to the organic optical waveguide 210 is obtained by the spacer 60.

In this embodiment, instead of the VCSEL array element 20, a photodiode array element which is a light receiving element and has substantially the same structure as the optical module 100 is mounted on the circuit substrate 200. In addition, instead of the driver IC 30, an optical module for reception which has, for example, a trans-impedance amplifier or a limiting amplifier mounted thereon is mounted on the circuit substrate 200. The optical module for reception can receive a laser optical signal which is transmitted from another circuit substrate through another organic optical waveguide. In this way, boards are optically interconnected.

As described above, according to the optical module 100 of the first embodiment, the physical interference between the optical module 100 and the organic optical waveguide 210 is prevented. In addition, it is easy to accurately mount the optical module 100 at a desired position on the circuit substrate 200 with high positioning accuracy. Therefore, it is possible to easily align the optical axis of the VCSEL array element 20 with the optical axis of the organic optical waveguide 210 with high accuracy. As a result, it is easy to obtain the proper optical coupling between the laser optical signal L output from the VCSEL array element 20 and the organic optical waveguide 210.

Second Embodiment

Figure 9:
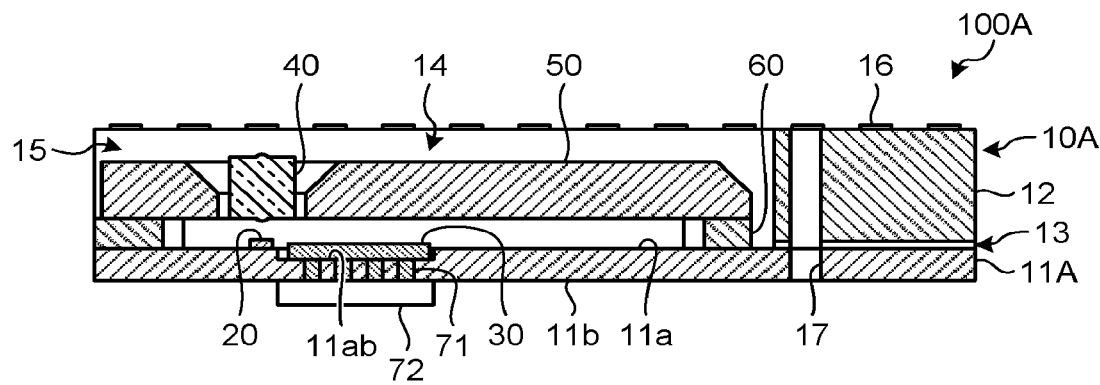
FIG. 9 is a cross-sectional view schematically illustrating an optical module according to a second embodiment.

FIG. 9 is a cross-sectional view schematically illustrating an optical module according to a second embodiment of the invention. As illustrated in FIG. 9, an optical module 100A according to the second embodiment differs from the optical module 100 according to the first embodiment in that a housing 10A replaces the housing 10 in the optical module 100. The housing 10A differs from the housing 10 in that a plate member 11A replaces the plate member 11 in the housing 10.

The plate member 11A differs from the plate member 11 in that a plurality of rod-shaped radiation members 71 are provided so as to pass through the plate member 11A from the bottom of the concave portion 11ab on the rear surface side of the driver IC 30. The radiation member 71 is made of a material with high thermal conductivity and is preferably made of, for example, copper or aluminum. In addition, a heat sink 72 is provided on the rear surface 11b of the plate member 11A so as to come into contact with the radiation members 71. The heat sink 72 is also made of a material with high thermal conductivity and is preferably made of, for example, copper or aluminum.

In the optical module 100A, the radiation members 71 and the heat sink 72 dissipate heat generated during the operation of the driver IC 30, which is further preferable. In addition, via holes are formed in the plate member 11A and the radiation members 71 with high thermal conductivity are inserted into the via holes.

A mounting method using solder will be described as another example of the method for mounting the optical module.

In general, the optical module 100 has a ball grid array (BGA) in which solder balls are provided on the planar electrode pads 16 on the surface (substrate mounting surface 12a) of the optical module 100 having the planar electrode pads 16 formed thereon in the first stage in which the optical module 100 is manufactured or after the optical module 100 is manufactured. Then, the solder is melted to mount the optical module 100 on a circuit substrate (Opto-substrate).

However, in this embodiment, as in the drawing, the planar electrode pads 16 of the optical module 100 are arranged in a land grid array (LGA) and the optical module 100 is mounted by a method without using a solder ball.

Specifically, a mask plate with a thickness of about 10 μm in which a hole for electrical connection is formed at a predetermined position is placed on the Opto-substrate. Then, a solder cream is applied onto the mask plate and is then uniformly spread so as to get into the hole. In addition, the extra solder cream thicker than the mask plate is removed. In this way, a solder cream layer with a thickness of about 100 μm is formed at a predetermined position for electrical connection.

Then, the optical module 100 and the Opto-substrate are aligned with each other and the solder is melted to mount the optical module 100 on the Opto-substrate. For example, a mounting method with a flip-chip bonder or a reflow mounting method with a reflow furnace is used as the mounting method.

Then, the gap of the mounting surface is filled with a general underfill material such as a resin material.

The solder cream layer which has a thickness of about 100 μm and is formed at a predetermined position for electrical connection may be formed on the optical module.

It was confirmed that the object (the Opto-substrate having the optical module mounted thereon) soldered by the method without using a solder ball did not have a reliability problem.

When the above-mentioned mounting method is used, it is possible to reduce the thickness of the solder layer, as compared to the BGA. Therefore, it is possible to reduce a variation in the distance between the frame member and the circuit substrate. As a result, it is possible to stably couple light output from the optical module to the organic optical waveguide.

In the above-described embodiment, the housing is formed by bonding the plate member and the frame member. However, the invention is not limited thereto. The housing may have any structure as long as it has the opening, the internal space, the waveguide introduction opening. For example, the plate member and the frame member may be integrated with each other to form the housing. It is preferable that the housing have a U-shape. In this case, an area capable of arranging the LGA is large. In addition, the plate member is not limited to the rectangular shape. The frame member is not limited to the U shape in which one side of the rectangular frame is entirely opened, as described in the above-described embodiment. For example, the frame member may have a shape in which only a portion of one side of the frame is opened or some or all of a plurality of sides are opened.

Third Embodiment

Figure 10:
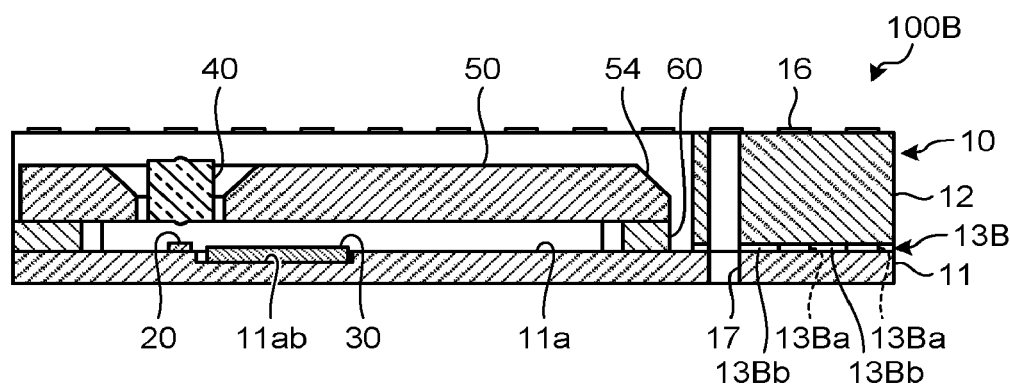
FIG. 10 is a diagram illustrating an optical module according to a third embodiment and corresponds to the cross-sectional view of FIG. 4.
Figure 11:
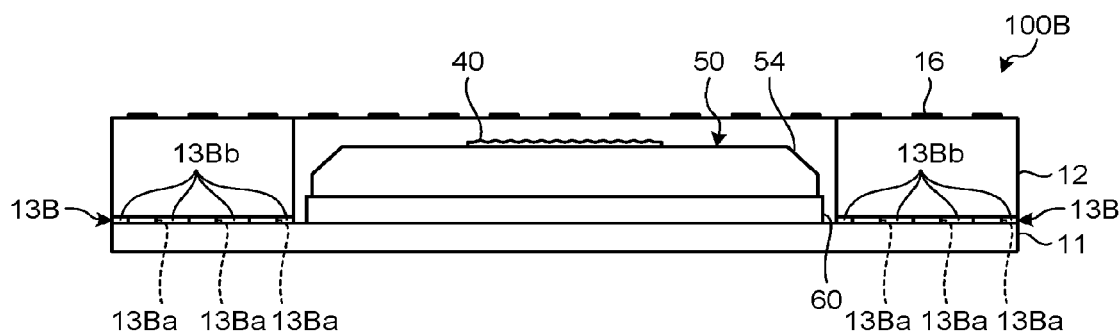
FIG. 11 is a front view illustrating the optical module according to the third embodiment.
Figure 12:
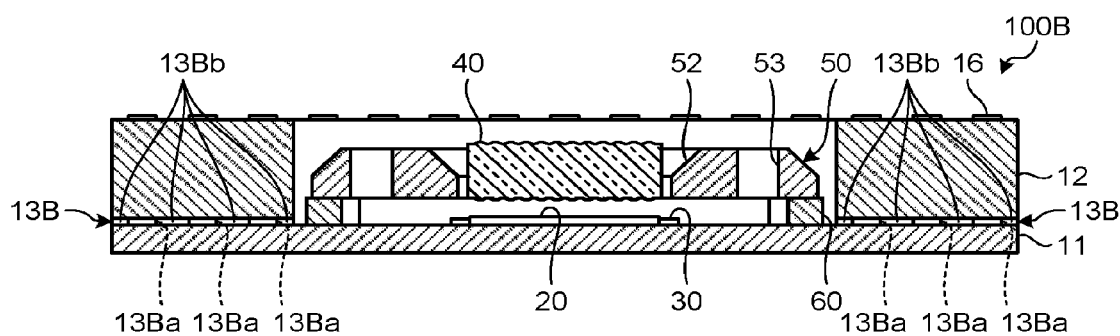
FIG. 12 is a diagram illustrating the optical module according to the third embodiment and corresponds to the cross-sectional view of FIG. 6.
Figure 13:
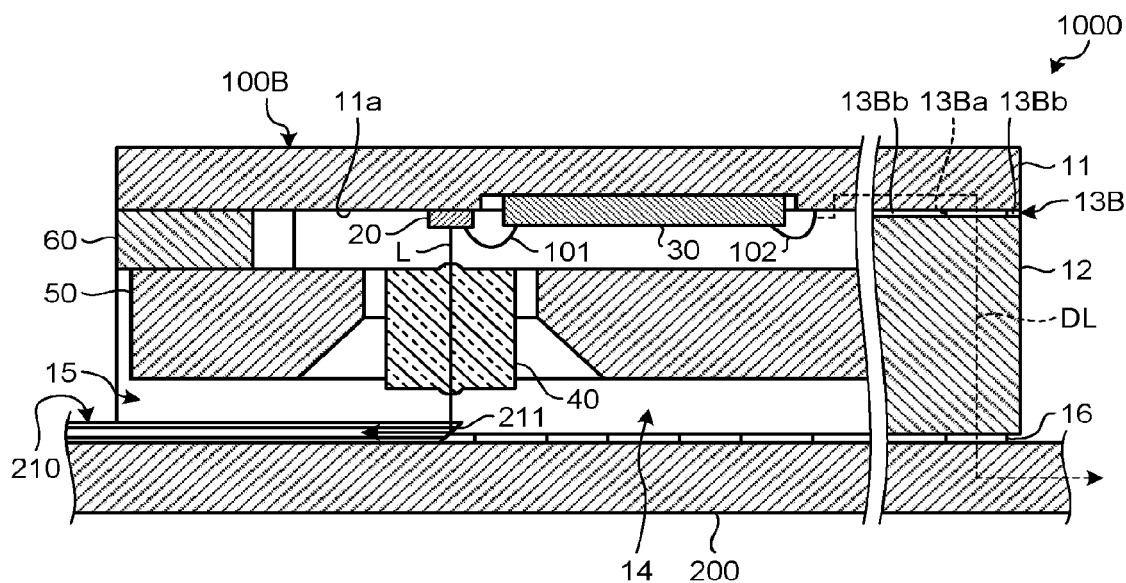
FIG. 13 is a diagram illustrating the optical module mounted on a circuit substrate.

FIG. 10 is a diagram which illustrates an optical module according to a third embodiment of the invention and corresponds to the cross-sectional view of FIG. 4. FIG. 11 is a front view illustrating the optical module according to the third embodiment. FIG. 12 is a diagram which illustrates the optical module according to the third embodiment of the invention and corresponds to the cross-sectional view of FIG. 6. FIG. 13 is a diagram illustrating the optical module mounted on a circuit substrate.

As illustrated in FIGS. 10 to 13, an optical module 100B according to the third embodiment differs from the optical module 100 according to the first embodiment in that a bonding layer 13B replaces the bonding layer 13 in the optical module 100.

The plate member 11 and the frame member 12 are bonded to each other by a metal bonding material 13Ba serving as a first bonding material, such as solder, an Au bump, or a conductive resin, and a resin adhesive 13Bb serving as a second bonding material which is provided so as to fill a gap between the metal bonding materials 13Ba, in the bonding layer 13B so as to connect the wiring patterns of the plate member 11 and the frame member 12 and to ensure the electrical connection thereof.

The optical module 100B has the same operation as the optical module 100.

Next, a method for assembling the optical module 100B will be described. First, the plate member 11 and the frame member 12 are bonded to each other. The bonding is performed by a plurality of metal bonding materials 13Ba and the resin adhesive 13Bb which is provided so as to fill the gap between the metal bonding materials 13Ba. The metal bonding material 13Ba is bonded by, for example, solder reflow or Au bump welding. In this case, for example, SnAgCu-based solder having a melting point of about 220° C. is used. Alternatively, for example, solder in which a re-melting temperature after reflow is higher than a melting temperature during reflow, such as solder using metal nano-particle paste, may be used. In addition, the alignment between the plate member 11 and the frame member 12 can be performed using three guide holes 17.

It is preferable that the thickness of the plate member 11 be small in order to reduce the height (thickness) of the optical module 100B and thus reduce the size of the optical module 100B while ensuring the height of the internal space 14 and in order to effectively dissipate heat generated during the operation of the driver IC 30. However, when the plate member 11 is too thin, there is a concern that the mechanical strength of the plate member 11 will not be ensured. As a result, there is a concern that the deformation, such as warpage or flexure, of the plate member 11 will occur due to heat from the driver IC 30. In this case, for example, the distance between the VCSEL array element 20 and the microlens array element 40 is changed, which may cause the deterioration of the state of the above-mentioned predetermined optical coupling. However, in the third embodiment, the plate member 11 and the frame member 12 are bonded to each other by not only the metal bonding materials 13Ba, but also the resin adhesive 13Bb which is provided so as to fill the gap between the metal bonding materials 13Ba. Therefore, the bonding area between the plate member 11 and the frame member 12 increases. Even when the plate member 11 is thin, the insufficient mechanical strength of the plate member 11 is supplemented and the deformation of the plate member 11 is prevented. In addition, since the bonding area between the plate member 11 and the frame member 12 is large, the radiation performance is further improved.

Then, the VCSEL array element 20 is mounted on the element mounting surface 11a. It is preferable to use the marker 11aa for alignment. In this case, it is possible to mount the VCSEL array element 20 at an exact position. Then, the driver IC 30 is mounted in the concave portion flab of the element mounting surface 11a. The driver IC 30 is bonded to an electrode pad formed on the element mounting surface 11a by a wire. The VCSEL array element 20 and the driver IC 30 are bonded to each other by wire bonding. Since the driver IC 30 is mounted in the concave portion 11ab, a difference in height between the VCSEL array element 20 and the driver IC 30 is reduced. Therefore, it is possible to reduce the length of a bonding wire. As a result, the deterioration of the quality of a differential high frequency signal which is output from the driver IC 30 to the VCSEL array element 20 through wire bonding is prevented. In addition, since the thickness of the plate member 11 at the concave portion 11ab is small, the radiation performance is improved.

Among the planar electrode pads 16, the planar electrode pad 16a for power supply and the planar electrode pad 16d for a control signal are arranged close to the waveguide introduction opening 15 (U-shaped leading end) of the frame member 12. According to this structure, a wiring pattern for a signal other than the differential high frequency signal is not present on a path from the planar electrode pad 16b for a differential high frequency signal to the driver IC 30 through the wiring pattern in the housing 10. Therefore, it is easy to treat a wiring pattern for a differential high frequency signal and it is possible to reduce the length of the pattern and to prevent the influence of a low-frequency component of a power supply. As a result, the deterioration of the quality of the differential high frequency signal is prevented.

Then, the spacer 60 is bonded to the element mounting surface 11a by, for example, an adhesive. When the spacer 60 is made of a material, such as metal, having a higher rigidity than that forming the housing 10, the insufficient mechanical strength of the plate member 11 is supplemented and the deformation of the plate member 11 is prevented. Therefore, the deterioration of the state of the predetermined optical coupling is prevented.

As described above, since the frame member 12 has the structure in which dielectrics and copper films are alternately stacked, an error in the thickness of the frame member 12 from the design value is likely to occur due to, for example, a manufacturing error. When there is an error in the thickness of the frame member 12, an error in the height of the internal space 14 also occurs. As a result, an error occurs in the predetermined optical coupling achieved by the microlens array element 40. For this reason, the spacers 60 with different thicknesses are prepared in advance and a spacer 60 with a thickness capable of cancelling an error in the thickness (the height of the internal space 14) of the frame member 12 which has been measured in advance is selected and used. According to this structure, the above-mentioned optical coupling error problem is solved.

Then, the microlens array element 40 is inserted into the holding hole 52 of the lens array element holder 50 and is then bonded thereto. Then, the lens array element holder 50 is placed on the spacer 60 and the VCSEL array element 20 and the microlens array element 40 are aligned with each other. Then, the lens array element holder 50 is bonded to the spacer 60. At that time, it is preferable that the gap between the lens array element holder 50 or the spacer 60 and the driver IC 30 be filled with a resin with high thermal conductivity, such as silicone. In this case, heat generated during the operation of the driver IC 30 is dissipated from the lens array element holder 50 or the spacer 60 through the resin.

The alignment between the VCSEL array element 20 and the microlens array element 40 can be performed by a so-called active alignment method which operates the VCSEL array element 20 such that laser light is output and observes the state of light transmitted through the microlens array element 40. In addition, the state of light transmitted through the microlens array element 40 may be observed by, for example, a microscope. Alternatively, an MT connector of an optical fiber array with a known MT connector may be arranged so as to face the microlens array element 40 and the intensity of laser light output from the optical fiber array may be measured. In this embodiment, the MT connector is used. The guide holes 53 are formed so as to be fitted to an MT connector for evaluation through guide pins and are provided for alignment. In this case, the guide pins are inserted into the guide holes of the MT connector and the guide holes 53 of the lens array element holder 50 to easily fit the MT connector to the lens array element holder 50. At that time, a spacer is inserted between a light input/output end surface of an organic optical waveguide and the MT connector such that light is coupled to an optical connection end surface of the MT connector. According to this structure, it is possible to accurately align the MT connector with the microlens array element 40 and to easily evaluate the characteristics of the optical module 100B. Therefore, active alignment with high positioning accuracy is achieved.

As described above, in the lens array element holder 50, a portion of the side surface 54 which faces the frame member 12 is chamfered. Therefore, an adhesive for bonding the lens array element holder 50 to the spacer 60 is likely to flow into the holding hole and workability is improved.

For example, a known flip-chip bonder can be used to mount the optical module 100B on the circuit substrate 200.

When the flip-chip bonder is used for mounting, it is preferable to use low-melting-point solder with a lower melting point than high-melting-point solder such that the metal bonding material 13Ba bonding the plate member 11 and the frame member 12, for example, the high-melting-point solder is not melted by heat applied from the head. Examples of the low-melting-point solder include SnAgCu-based solder with a melting point of about 220° C., SnPb-based solder with a melting point of about 183° C., and SnBi-based solder with a melting point of about 137° C. However, even when SnAgCu solder is used to bond the frame member and the plate member, the melting point of the solder increases after the solder is melted. Therefore, when the temperature is accurately managed during the mounting of the optical module, it is also possible to use SnAgCu-based solder. In addition, it is preferable that the microlens array element 40 be made of glass. In this case, even when heat is applied from the flip-chip bonder in order to mount the optical module, deformation caused by heat is less likely to occur. In addition, it is preferable that an adhesive used to bond the microlens array element 40, the lens array element holder 50, or the spacer 60 be made of, for example, an epoxy resin with high heat resistance.

However, even when the metal bonding material 13Ba bonding the plate member 11 and the frame member 12 is melted by mounting with the flip-chip bonder or heat generated from the driver IC 30, the bonding between the plate member 11 and the frame member 12 may be maintained by the resin adhesive 13Bb such that resistance to welding pressure which is applied to the housing 10 during mounting is obtained. From this point of view, it is preferable that the resin adhesive 13Bb be made of a material which is less likely to be deformed by heat than the metal bonding material 13Ba. A material with high heat resistance, such as an epoxy resin, can be used as an example of the resin adhesive 13Bb. In addition, when it is not mixed with the metal bonding material 13Ba which is used for electrical connection, it may be made of a material with insulating properties.

FIG. 13 is a diagram illustrating the optical module mounted on the circuit substrate. As illustrated in FIG. 13, the VCSEL array element 20 is electrically connected to the driver IC 30 by a bonding wire 101. The driver IC 30 is electrically connected to an electrode pad (not illustrated) on the element mounting surface 11a by a bonding wire 102. The electrode pad is electrically connected from the wiring pattern formed on the element mounting surface 11a to the wiring pattern on the circuit substrate 200 through the plate member 11, the bonding layer 13B, the frame member 12, and each planar electrode pad 16, as represented by an electrical path DL.

According to the optical module 100B of the third embodiment, even though the thickness of the plate member 11 is small, the deformation of the plate member 11 is suppressed. Therefore, a reduction in the size of the optical module 100B and a high radiation performance are achieved while the sufficient strength of the housing is ensured. In addition, the proper optical coupling between the laser optical signal L output from the VCSEL array element 20 and the organic optical waveguide 210 is achieved.

Fourth Embodiment

Figure 14:
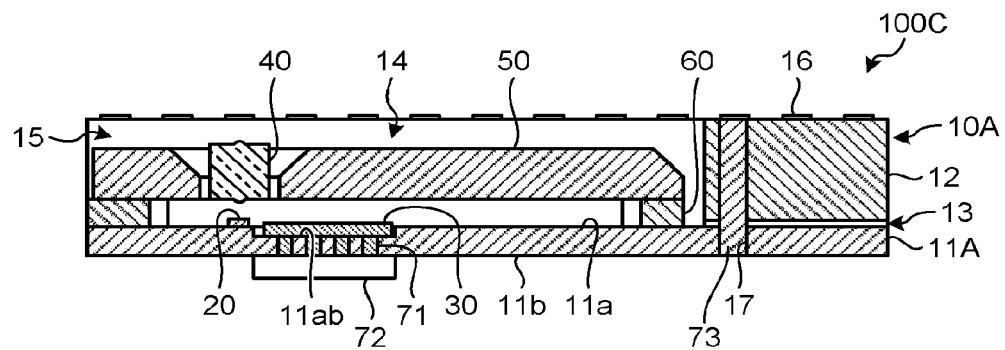
FIG. 14 is a cross-sectional view schematically illustrating an optical module according to a fourth embodiment.

FIG. 14 is a cross-sectional view schematically illustrating an optical module according to a fourth embodiment of the invention. As illustrated in FIG. 14, an optical module 100C according to the fourth embodiment differs from the optical module 100B according to the third embodiment in that the housing 10A replaces the housing 10 in the optical module 100B. The housing 10A differs from the housing 10 in that the plate member 11A replaces the plate member 11 and a supporting member 73 is inserted into the guide hole 17 in the housing 10.

The plate member 11A differs from the plate member 11 in that the plurality of rod-shaped radiation members 71 are provided so as to pass through the plate member 11A from the bottom of a concave portion 11ab on the rear surface side of the driver IC 30. The radiation member 71 is made of a material with high thermal conductivity and is preferably made of, for example, copper or aluminum. In addition, the heat sink 72 is provided on the rear surface 11b of the plate member 11A so as to come into contact with the radiation members 71. The heat sink 72 is also made of a material with high thermal conductivity and is preferably made of, for example, copper or aluminum.

The supporting member 73 is made of metal, such as copper or aluminum, and is inserted into the guide hole 17 to further improve the mechanical strength of the housing 10A. It is preferable that the supporting member 73 be inserted into the guide hole 17 by press fitting or fixed to the guide hole 17 by, for example, an adhesive. In this case, it is possible to further improve the mechanical strength of the housing 10A.

In the optical module 100C, heat generated during the operation of the driver IC 30 is dissipated by the radiation members 71 and the heat sink 72, which is further preferable. In addition, instead of burying the radiation members 71 in the plate member 11A, via holes may be formed in the plate member 11A and the radiation members 71 with high thermal conductivity may be inserted into the via holes. In addition, as a structure which brings the supporting member 73 into contact with the circuit substrate, heat generated from the optical module 100C may be dissipated to the circuit substrate through the supporting member 73.

Alternatively, the lens array element holder 50 and the circuit substrate may be thermally connected to each other by, for example, a thermally conductive resin to dissipate heat.

In the above-described embodiment, the resin adhesive is used as the second bonding material. However, instead of the resin adhesive, for example, an adhesive plate member having an adhesive applied thereon may be provided so as to fill the gap between the first bonding materials.

For example, the supporting member 73 according to the fourth embodiment may be applied to other embodiments. Since the strength of the housing is ensured, for example, other elements may be further mounted on the optical module according to each embodiment. In this case, the deformation of the housing is suppressed even though pressure is applied to the housing during the flip-chip bonding of other elements.

Fifth Embodiment

Figure 15:
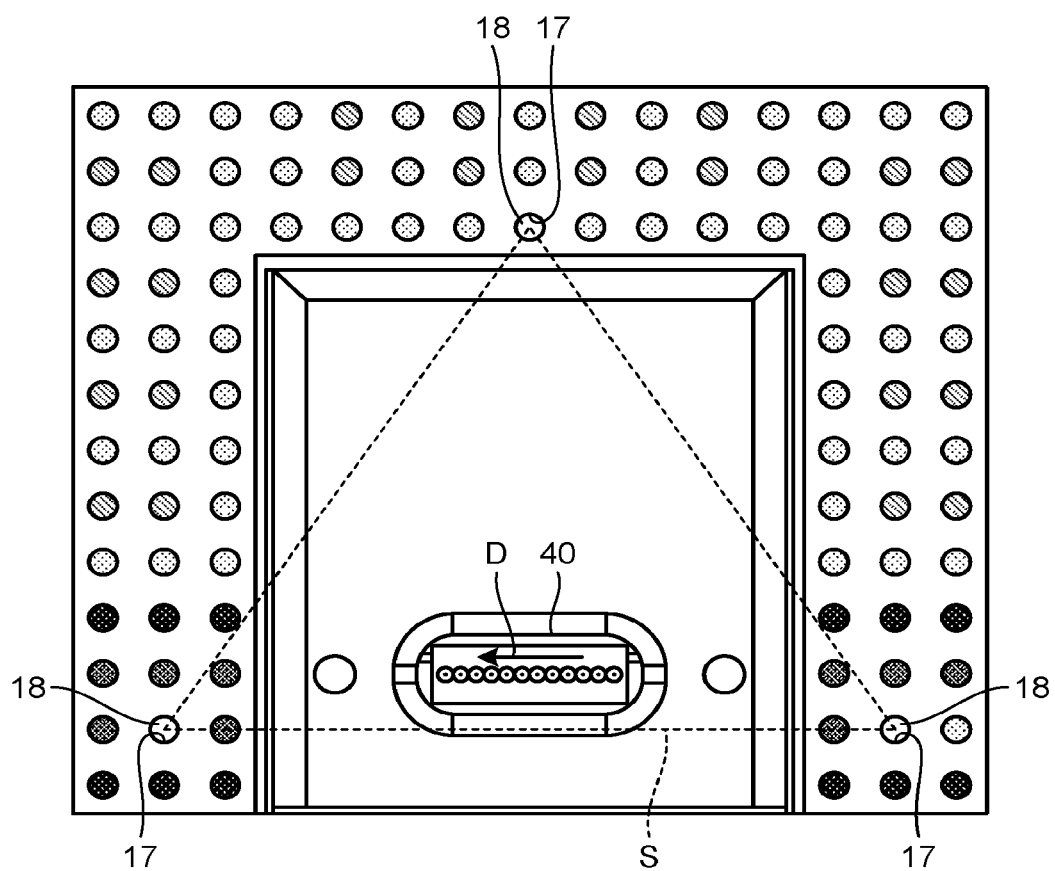
FIG. 15 is a plan view schematically illustrating an optical module according to a fifth embodiment.

FIG. 15 is a plan view schematically illustrating an optical module according to a fifth embodiment of the invention. The optical module according to the fifth embodiment illustrated in FIG. 15 differs from the optical module 100 according to the first embodiment in that optical members 18 are provided in each of the three guide holes 17. Each optical member 18 is, for example, an optical window or a lens. Each optical member 18 may be inserted into each guide hole 17 or may be provided so as to cover each guide hole 17.

In particular, when the optical member 18 is a lens, the following effect is obtained. That is, when the optical module is inclined with respect to the circuit substrate, the distances between the lenses and markers on the circuit substrate are different from each other. Therefore, when the markers on the circuit substrate are observed from the guide holes 17 through the lenses, the markers with the same size look to have different sizes. Therefore, it is possible to easily check the deviation of the optical module in the vertical direction. In addition, when the inclination of the optical module is adjusted such that the markers look to have the same size, it is possible to accurately mount the optical module.

In each embodiment, as illustrated in FIG. 15, one side S of an isosceles triangle formed by the guide holes 17 is substantially parallel to the arrangement direction D of unit elements (VCSEL elements or microlenses) of the microlens array element 40 and the VCSEL array element 20 provided below the microlens array element 40. As such, when the VCSEL array element 20 and the microlens array element 40 are mounted such that the direction of the side S is substantially parallel to the arrangement direction D, the accuracy of mounting is improved and, particularly, a variation in the optical coupling state of each unit element is suppressed, which is preferable.

In the fifth embodiment, the optical member 18 is provided in each of the three guide holes 17. However, the optical member 18 may be provided in at least one of the three guide holes 17.

Other Embodiments of Marker

Figure 16:
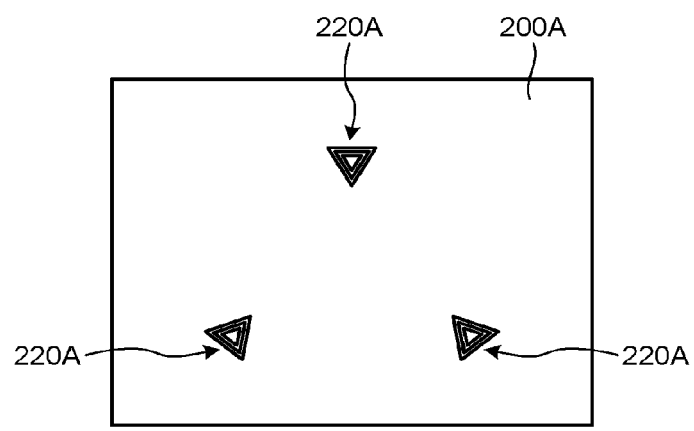
FIG. 16 is a diagram illustrating another embodiment of a marker formed on the circuit substrate.

Next, other embodiments of the marker formed on the circuit substrate will be described. FIG. 16 is a diagram illustrating another embodiment of the marker formed on the circuit substrate. In the embodiment illustrated in FIG. 16, three markers 220A which are formed by concentrically arranging three triangles with different sizes are formed on a circuit substrate 200A. One of the vertexes of each marker 220A faces the center of gravity of the three markers 220A.

Figure 17:
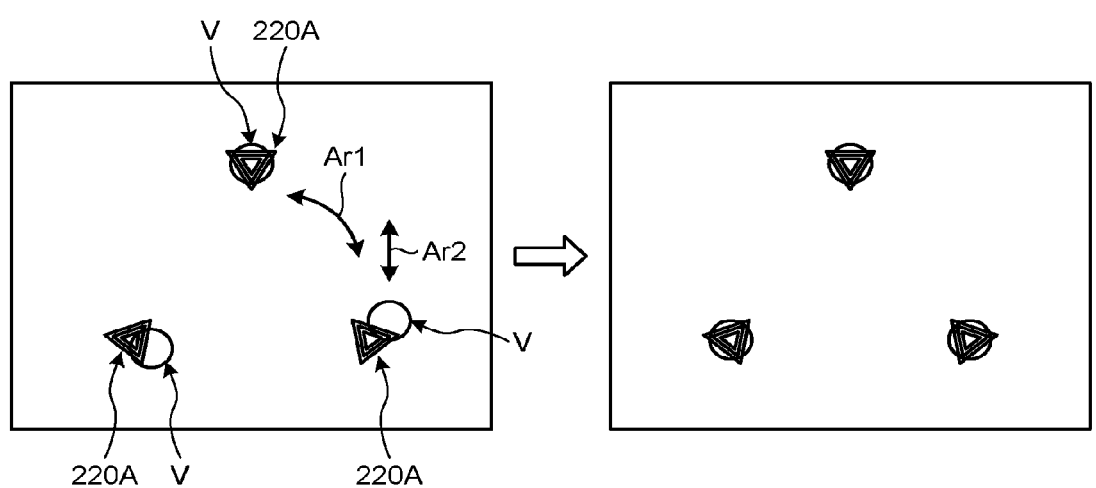
FIG. 17 is a diagram illustrating alignment with the marker illustrated in FIG. 16.

FIG. 17 is a diagram illustrating alignment with the markers illustrated in FIG. 16. Letter V indicates the range of the field of view when the circuit substrate 200A is seen through the guide hole 17. For example, each of the optical modules 100 and 100A to 100C according to the above-described embodiments is mounted on the circuit substrate 200A as follows. That is, the deviation of the circuit substrate 200A in a rotation direction Ar1 or a plane direction Ar2 is adjusted, on the basis of the shape or direction of the marker 220A which is seen in the field of view V from the guide hole 17, such that the aspects of the markers 220A seen in the field of view V are the same, thereby aligning, for example, the optical module 100 with the circuit substrate 200A. Therefore, mounting is performed with high positioning accuracy. In FIGS. 16 and 17, one of the vertexes of each marker 220A faces the center of gravity of the three markers 220A. However, one of the sides of each marker 220A may face the center of gravity of the three markers 220A.

Figure 18A:
FIG. 18A is a diagram illustrating still another embodiment of the marker formed on the circuit substrate.
Figure 18B:
FIG. 18B is a diagram illustrating still another embodiment of the marker formed on the circuit substrate.
Figure 18C:
FIG. 18C is a diagram illustrating still another embodiment of the marker formed on the circuit substrate.
Figure 18D:
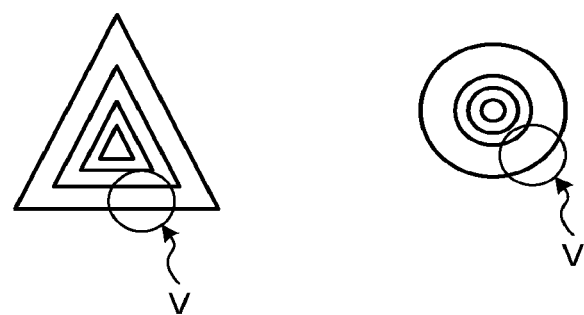
FIG. 18D is a diagram illustrating still another embodiment of the marker formed on the circuit substrate.

FIGS. 18A to 18O are diagrams illustrating other embodiments of the marker mounted on the circuit substrate. FIG. 18A illustrates a marker formed by a single triangle or circular. FIG. 18B illustrates a marker which is formed by concentrically arranging three triangles or circles with different sizes. FIG. 18C illustrates a marker which is formed by eccentrically arranging three triangles or circles with different sizes from a concentric position in a predetermined direction. FIG. 18D illustrates a marker which is formed by concentrically arranging four triangles or circles with different sizes. As such, the number of triangles or circles arranged is not particularly limited. In each marker illustrated in FIG. 18D, the gap between the triangles or the circles is smaller than the width of the field of view V through the guide hole. According to this structure, it is possible to simultaneously observe a plurality of triangles or circles. Therefore, it is easy to check the direction of the positional deviation between the optical module and the circuit substrate and to align the optical module and the circuit substrate.

Figure 19:
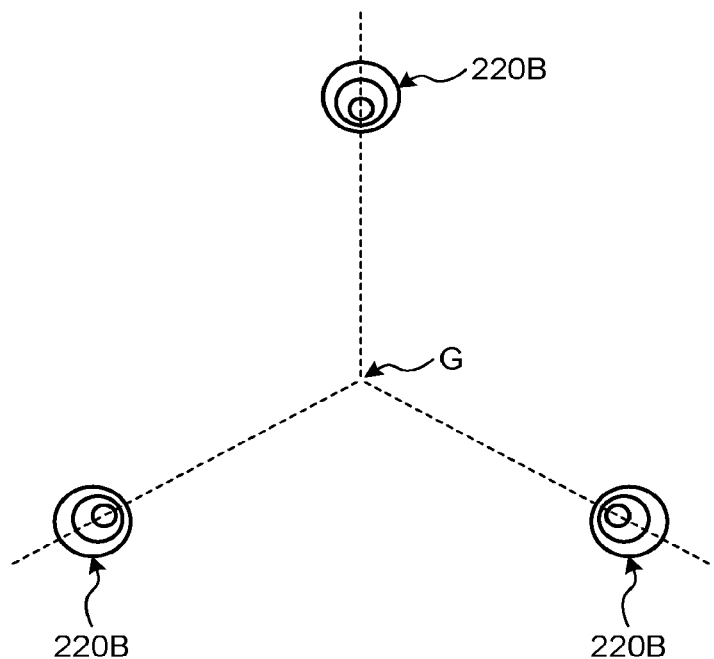
FIG. 19 is a diagram illustrating an example of the arrangement of the markers.

FIG. 19 is a diagram illustrating an example of the arrangement of the markers. In FIG. 19, the eccentric direction of a marker 220B illustrated in FIG. 18C which is formed by three eccentric circles is aligned with the direction of the center of gravity G of the three markers 220B. Therefore, it is easy to check the direction of the positional deviation between the optical module and the circuit substrate and to align the optical module and the circuit substrate.

In the above-described embodiment, the marker is formed by circles or triangles. However, the marker may be formed by other geometric figures, such as a cross and a polygon. In addition, the guide hole and the marker may have the same shape. When a plurality of geometric figures with different sizes are arranged to form a marker, a vernier scale is formed in any optical window. In this case, it is possible to accurately check the amount of positional deviation between the optical module and the circuit substrate. As a result, it is possible to accurately align the optical module and the circuit substrate.

In addition, for example, a CCD camera is mounted on a flip-chip bonder and captures the image of the shape of the marker seen through the guide hole. Then, the shape of the marker is compared with the various patterns of the positional relationship which have been stored in a memory in advance and a mounting position is corrected on the basis of the comparison result. According to this structure, it is possible to automate a mounting operation and to improve manufacturability.

For example, other elements, or one or more substrates having other elements mounted thereon may be stacked on the optical module according to each embodiment. The stacking of the substrates is implemented by, for example, a POP mounting method. In this case, other elements or other substrates can be accurately mounted by the guide holes which are provided so as to pass through the housing.

Sixth Embodiment

Next, an example of an optical module mounting system (hereinafter, referred to as a mounting system) according to a sixth embodiment of the invention will be described.

For example, the optical module 100 according to the first embodiment is mounted on the optical module mounting system according to the sixth embodiment. However, any of the optical modules according to the second to fifth embodiments may be mounted on the optical module mounting system.

Figure 20:
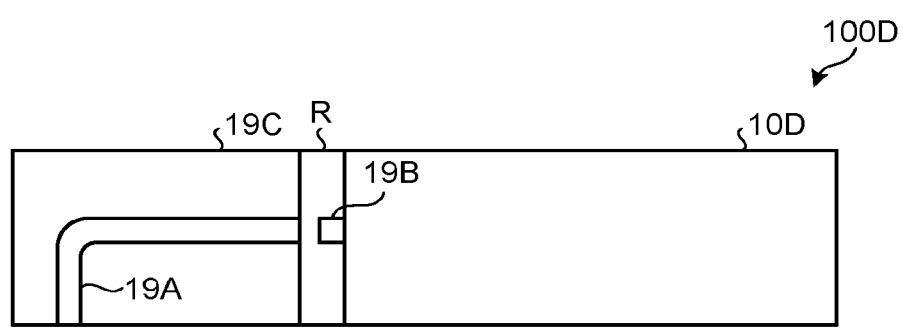
FIG. 20 is a diagram illustrating an example of an optical module according to another embodiment.

FIG. 20 illustrates an example of another optical module mounted on the optical module mounting system according to the sixth embodiment. In FIG. 20, reference numeral 100D indicates an optical module, reference numeral 10D indicates a package, reference numeral 19A indicates a waveguide (optical fiber), reference numeral 19B indicates an optical element, and reference numeral 19C indicates an optical connector. In this embodiment, the waveguide 19A is an optical fiber which is bent at an angle of 90 degrees. However, an optical path may be bent by, for example, a 90-degree bending mirror. In the optical module 100D, the 90-degree bending optical connector 19C and the package 10D are fixed by an adhesive R so as to be optically connected to each other.

Figure 21:
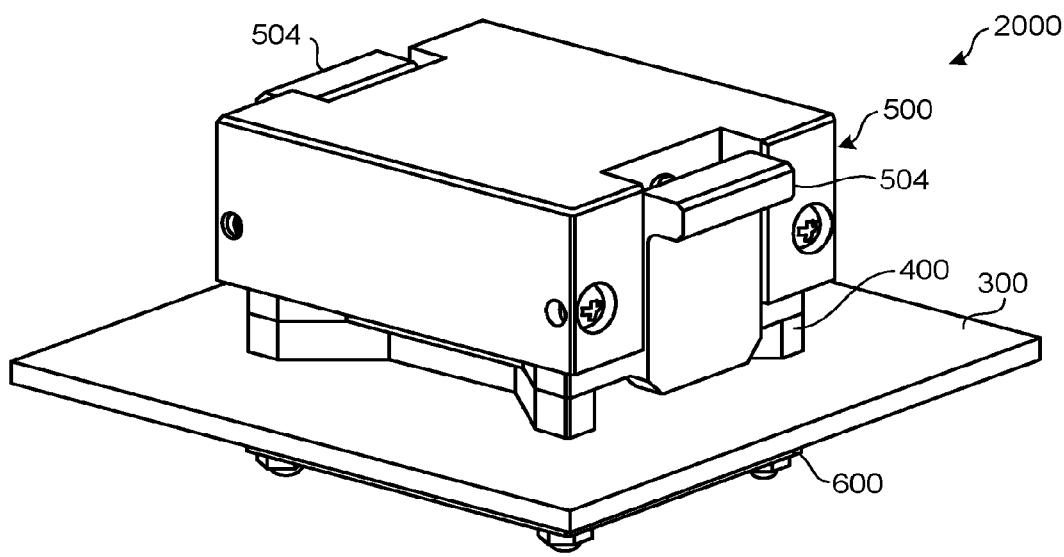
FIG. 21 is a perspective view schematically illustrating a mounting system according to a sixth embodiment.
Figure 22:
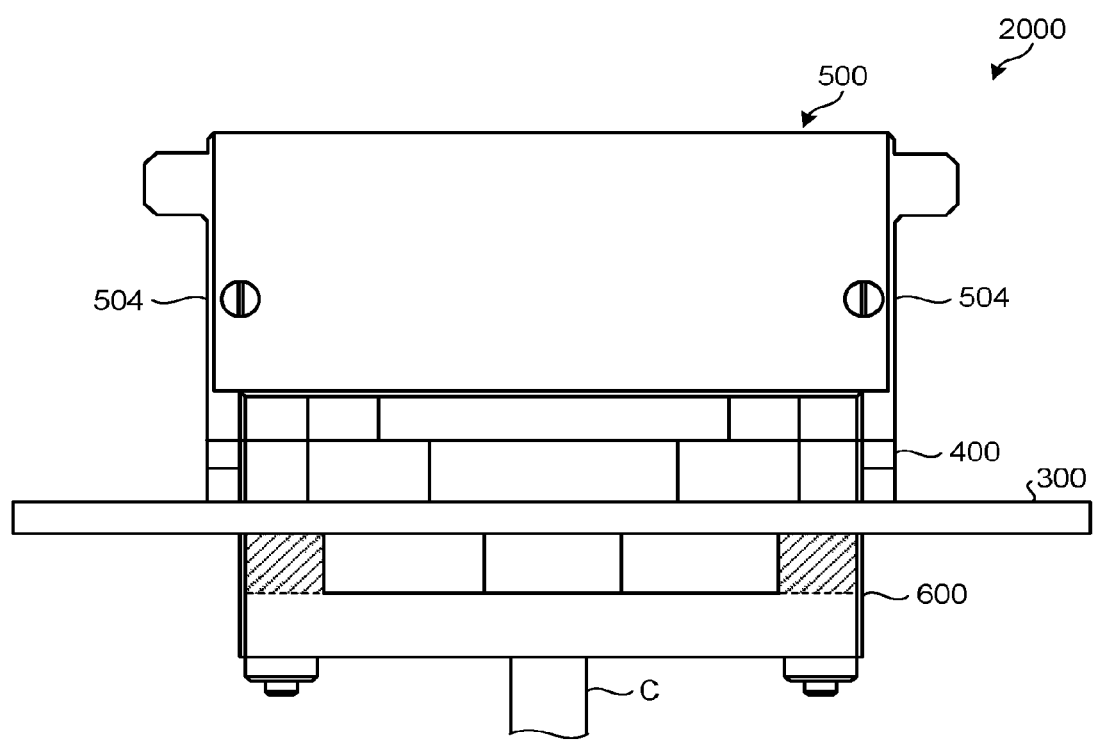
FIG. 22 is a side view of FIG. 21.
Figure 23:
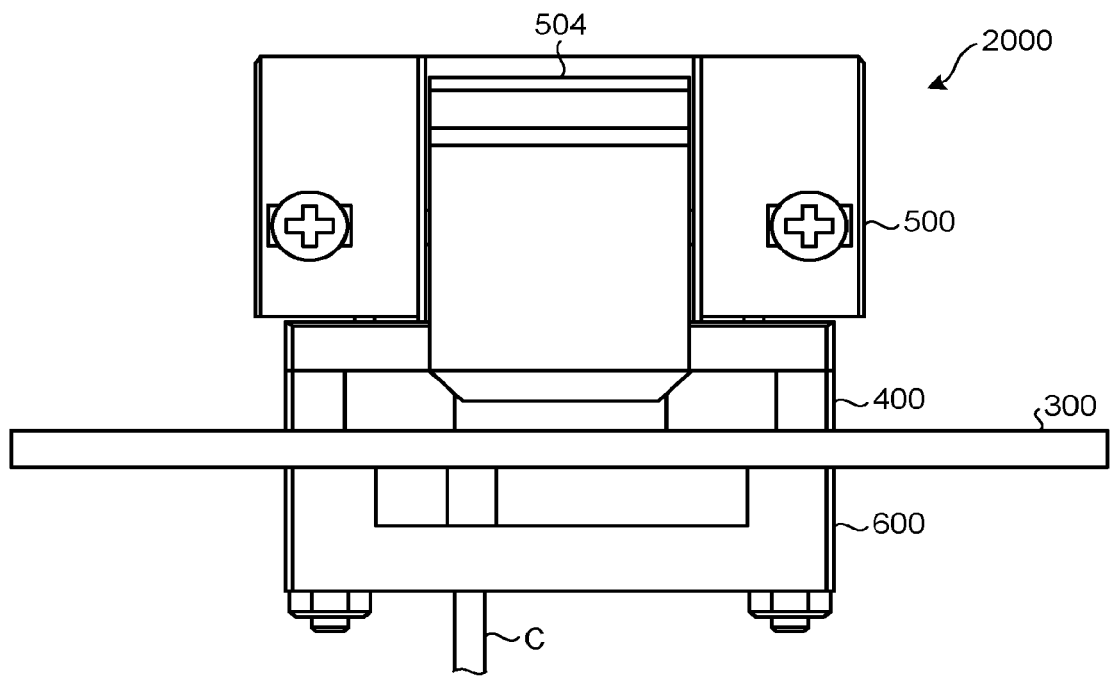
FIG. 23 is a front view of FIG. 21.
Figure 24:
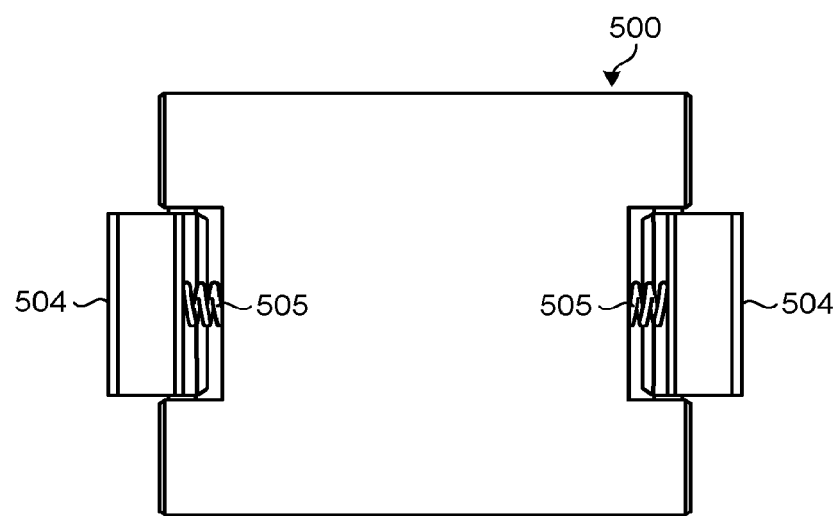
FIG. 24 is a plan view of FIG. 21.

Next, the optical module mounting system according to the invention will be described. FIG. 21 is a perspective view schematically illustrating the mounting system according to the sixth embodiment. FIGS. 22, 23, and 24 are a side view, a front view, and a plan view of FIG. 21, respectively.

Figure 25:
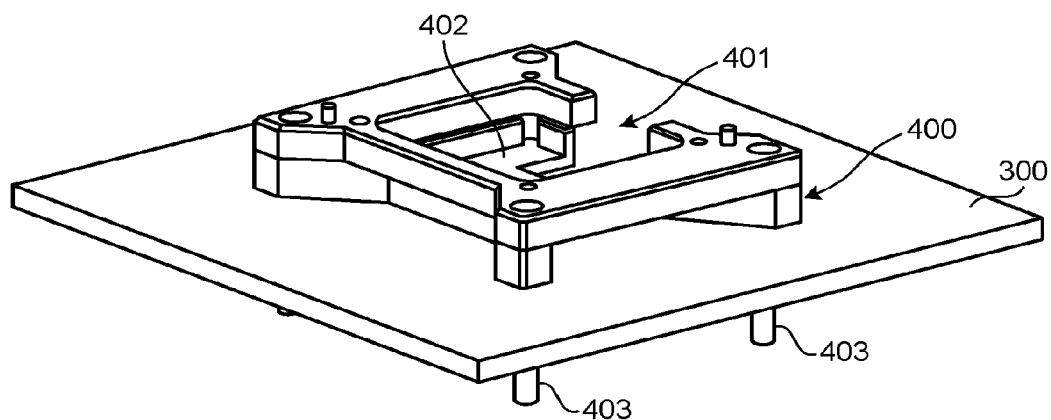
FIG. 25 is a perspective view illustrating a circuit substrate and a socket illustrated in FIG. 21.
Figure 26:
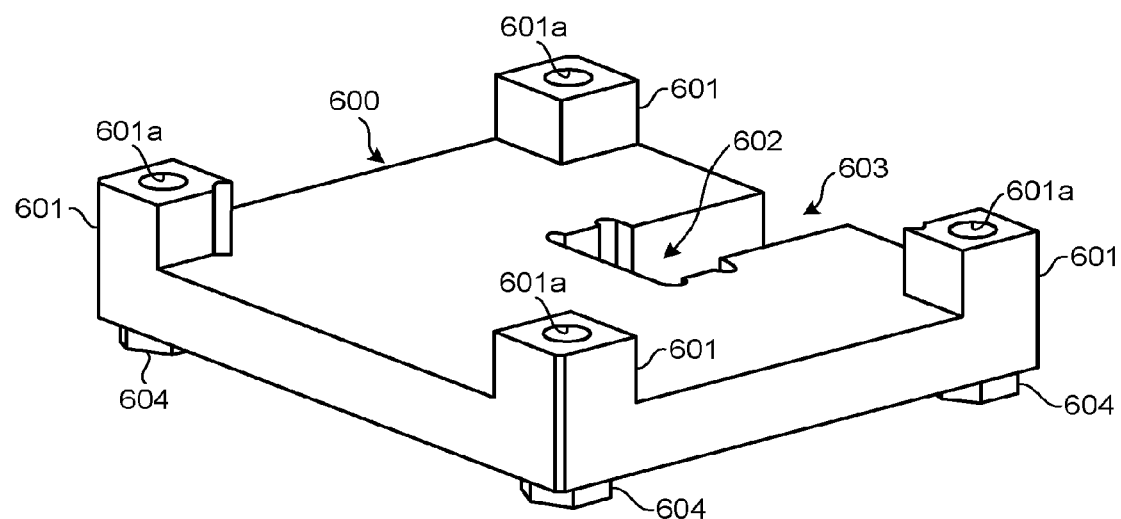
FIG. 26 is a perspective view illustrating an MT connector supporting member illustrated in FIG. 21.
Figure 27:
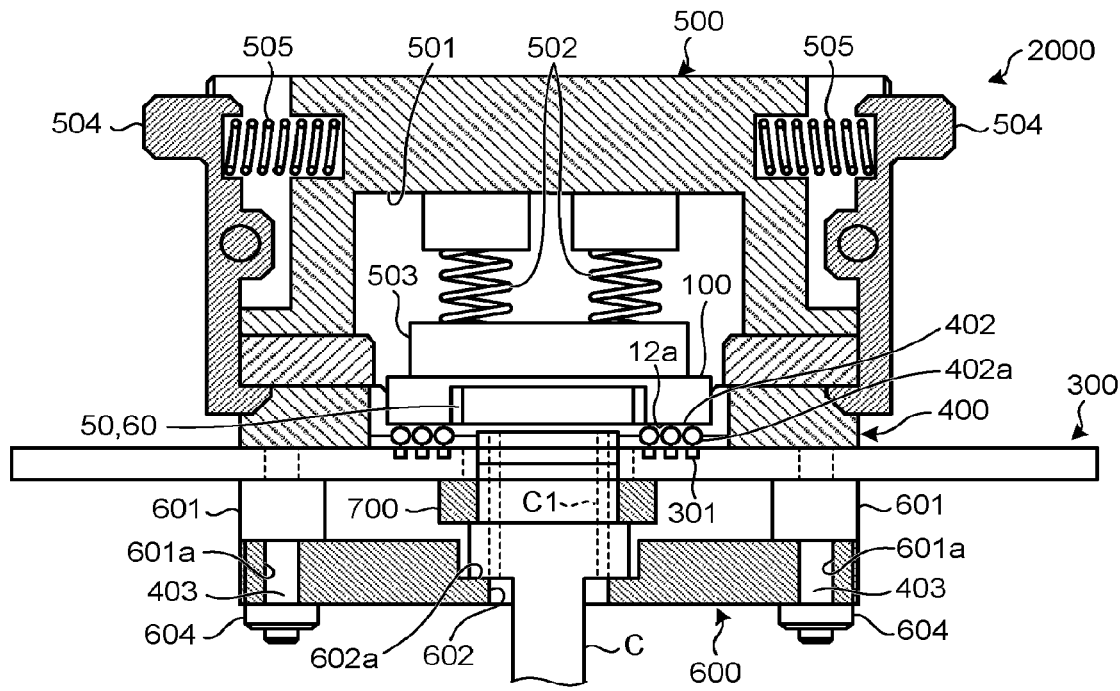
FIG. 27 is a cross-sectional view illustrating a portion of FIG. 22.
Figure 28:
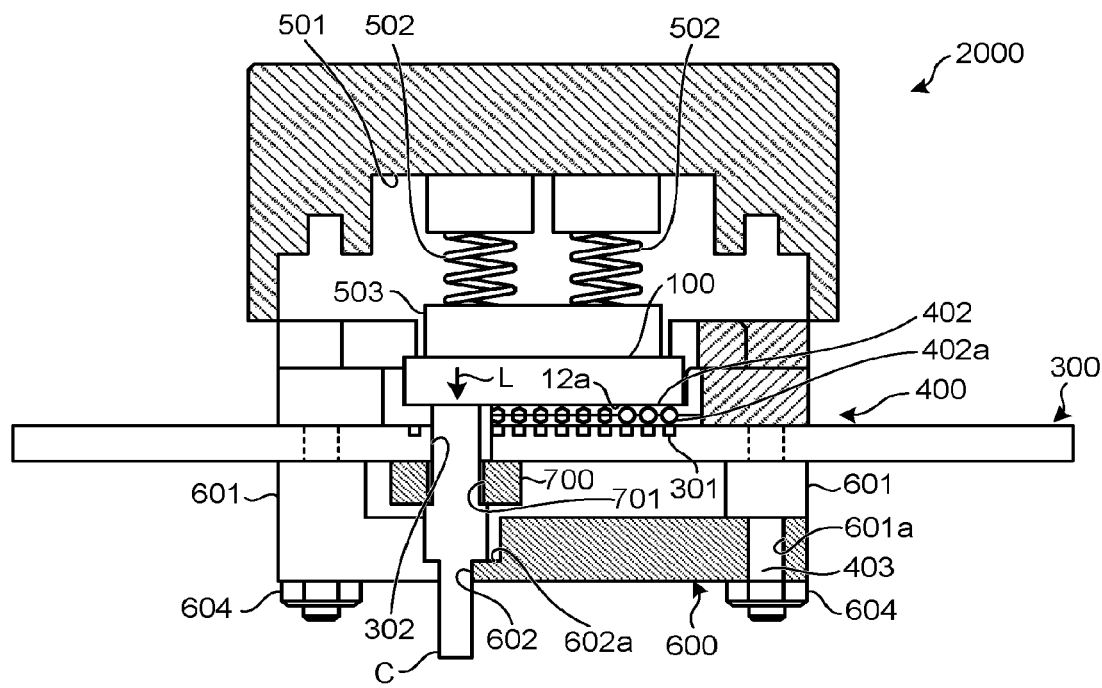
FIG. 28 is a cross-sectional view illustrating a portion of FIG. 23.

As illustrated in FIGS. 21 to 24, a mounting system 2000 includes a circuit substrate 300 including an electronic component for operating, for example, an optical module, a socket 400, a cover 500, and an MT connector supporting member 600. FIG. 25 is a perspective view illustrating the circuit substrate 300 and the socket 400. FIG. 26 is a perspective view illustrating the MT connector supporting member 600. FIG. 27 is a cross-sectional view illustrating a portion of FIG. 22. FIG. 28 is a cross-sectional view illustrating a portion of FIG. 23. As illustrated in FIGS. 27 and 28, the mounting system 2000 further includes a spacer 700. The spacer 700 is made of metal with rigidity such as copper.

The circuit substrate 300 includes a wiring pattern 301 which is formed on a main surface and supplies power and an electric signal for driving the optical module 100 to the optical module 100 and an insertion hole 302 that is an opening which is formed on the main surface and into which an MT connector C is inserted (see FIGS. 27 and 28).

The socket 400 is a frame which is placed on the circuit substrate 300 so as to accommodate the optical module 100 and includes an opening 401, a mounting portion 402 for mounting the optical module 100, and four screw portions 403 which are inserted into through holes provided in the circuit substrate 300. The mounting portion 402 is made of a dielectric, for example, a resin such as polyetherimide. A pin 402a with a spring, which is a conductive member for ensuring electrical connection to the wiring pattern 301 of the circuit substrate 300, is provided as an interface in the mounting portion 402 (see FIGS. 27 and 28).

The cover 500 includes four coil springs 502 which are provided in an internal space 501 of a cover body, a pressing plate 503 which is provided at the leading ends of the springs 502, two latch structures 504 which are provided on the front side, and coil springs 505 which urges the latch structures 504. The latch structures 504 urged by the springs 505 are fitted to the socket 400 and the cover 500 is locked to the socket 400. The springs 502 and the pressing plate 503 form a pressing mechanism.

The MT connector supporting member 600 includes four supporting pillars 601 that protrude from a plate-shaped body and are made of an elastic material such as rubber, an MT connector supporting hole 602 that supports an MT connector C which is a light receiving member (optical coupling member) to be optically coupled with the optical module 100, an opening 603 for introducing the MT connector C into the MT connector supporting hole 602, and nuts 604. A through hole 601a is provided in the supporting pillar 601. At that time, the opening 603 may have a width, a size, and a shape capable of introducing an optical fiber tape connected to the MT connector C, in order to introduce the MT connector C from the side. In this embodiment, an elastic member is used as the supporting pillar 601. However, instead of this structure, a structure may be used in which, for example, a spring is inserted between the MT connector supporting member 600 and the circuit substrate.

The MT connector supporting member 600 is provided on a surface of the circuit substrate 300 opposite to the socket 400. The socket 400 and the MT connector supporting member 600 are fixed to the circuit substrate 300 as follows. The MT connector C is introduced into the MT connector supporting hole 602 through the opening 603 and the circuit substrate 300 is interposed between the socket 400 and the MT connector supporting member 600. In this state, the screw portions 403 of the socket 400 are inserted into the through holes 601a of the supporting pillar 601 and the nuts 604 are threadably engaged with the screw portions 403.

The MT connector C is connected to an external device.

A step portion 602a is provided in the MT connector supporting hole 602 (see FIGS. 26 and 27). When the MT connector C is introduced into the MT connector supporting hole 602 through the opening 603, at least a portion of an end portion opposite to an optical connection end surface of the MT connector C is placed on the step portion 602a. The movement of the MT connector C in the lower direction (a direction in which the MT connector C becomes further away from the optical module) is regulated by the step portion 602a.

A spacer 700 which is slightly lower than the supporting pillar 601 is interposed between the MT connector supporting member 600 and the circuit substrate 300, with the MT connector C inserted into an insertion hole 701 of the spacer 700 (the nuts 604 are tightened to make the height of the supporting pillar 601 substantially equal to that of the spacer). The spacer 700 and a thick chin portion of the MT connector C are fitted to regulate the movement of the MT connector C in the upper direction. Therefore, the movement of the MT connector C in the upper and lower directions is regulated by the step portion 602a and the spacer 700. The MT connector supporting member 600 and the spacer 700 form a mechanism for positioning the MT connector C, which is a light receiving member, in the height direction. That is, for the positioning of the optical module and the MT connector in the optical axis direction during the optical coupling between the optical module and the MT connector, the position of the MT connector C is set relative to the circuit substrate. At that time, positioning in the vertical direction is performed by the MT connector supporting member 600 and the spacer 700. However, when the size of the insertion hole 302 is determined, the optical axis in the horizontal direction may be adjusted such that a slight clearance is formed in the lateral direction.

Figure 29A:
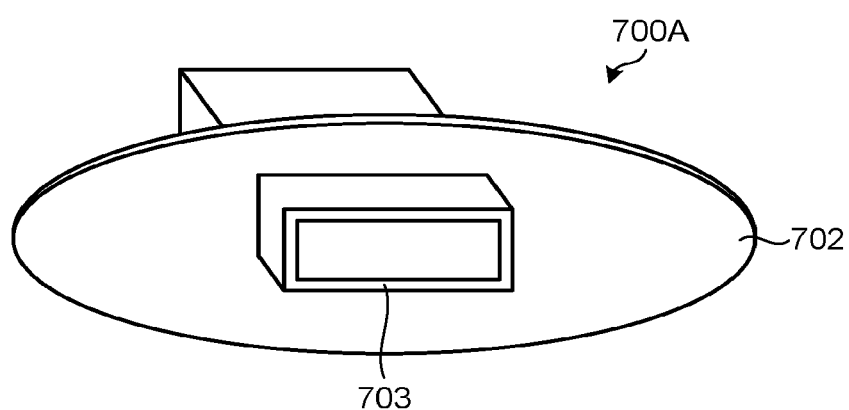
FIG. 29A is a diagram illustrating a preferred example of a spacer.
Figure 29B:
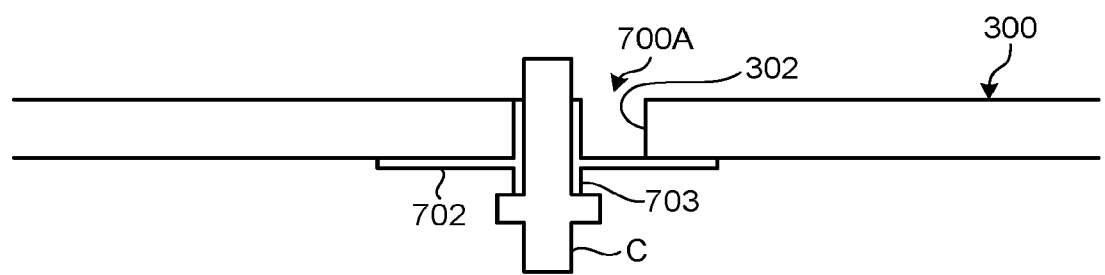
FIG. 29B is a diagram illustrating a preferred example of the spacer.

FIGS. 29A and 29B illustrate a preferred example of the spacer. A spacer 700A includes a guide portion 703 and a plate portion 702. The guide portion 703 regulates the insertion of the MT connector C. The plate portion 702 comes into surface contact with the circuit substrate 300. The size of the insertion hole 302 may be 0.5 mm to 1 mm greater than the outer size of the guide portion 703. In this case, the MT connector C can be moved in the plane and it is easy to perform alignment in the horizontal direction. In addition, the plate portion 702 may have, for example, a rectangular shape, a square shape, or an elliptical shape. In addition, the shape of the insertion hole 302 and the guide portion 703 is not limited to this embodiment and can be appropriately set.

An example of a process of mounting the optical module 100 on the mounting system 2000 will be described. First, the socket 400 is placed on the circuit substrate 300. Then, the MT connector C is introduced into the MT connector supporting hole 602 through the opening 603 of the MT connector supporting hole 602. Then, the MT connector C is inserted into the insertion hole 701 of the spacer 700 and the spacer 700 is interposed between the MT connector supporting member 600 and the circuit substrate 300. In this state, the nuts 604 are threadably engaged with the screw portions 403 of the socket 400 to fix the socket 400 and the MT connector supporting member 600 to the circuit substrate 300.

Then, the optical module 100 is placed on the mounting portion 402 such that the substrate mounting surface 12a comes into contact with the mounting portion 402 and is accommodated in the socket 400. Then, guide pin holes C1 of the MT connector C and the guide holes 53 of the optical module 100 are positioned while the MT connector C is finely adjusted in the insertion hole 302. Then, fitting pins are inserted into the holes. In this way, the relative position between the MT connector C and the optical module 100 in the in-plane direction of the circuit substrate 300 is exactly determined. That is, the guide pin holes C1 and the guide holes 53 form a mechanism for positioning in the in-plane direction. In this embodiment, the guide pin is inserted from the rear side. However, the position of the optical module 100 and the position of the MT connector C may be finely adjusted by the MT connector C with a guide pin and the optical module 100 and the MT connector C may be aligned with each other. In addition, the guide pin hole C1 and the guide hole 53 may be visually aligned with each other from the lower side in the insertion direction of the MT connector C, without using a guide pin. Alternatively, an alignment mark (not illustrated) provided on an optical connection surface of the optical module may be aligned with an alignment mark (not illustrated) provided on the MT connector C.

Then, the latch structure 504 of the cover 500 is fitted to the socket 400 to fix the cover 500 to the socket 400. Then, the pressing plate 503 is urged by the spring 502 to press the optical module 100 against the mounting portion 402. As a result, the height of the optical module 100 with respect to the circuit substrate 300 is fixed. The thickness of the optical module 100 varies in the range of a tolerance. The optical module 100 is pressed by the spring 502 and the pressing plate 503 and is stably pressed by pressing force, regardless of a variation in the thickness of the optical module 100. In particular, the optical module 100 is uniformly pressed by the pressing plate 503, which is preferable. In this embodiment, the cover 500 is fixed after positioning in the horizontal direction. However, the invention is not limited thereto. The cover 500 may be fixed to the socket before positioning in the horizontal direction.

In this case, the pin 402a with a spring which is provided in the mounting portion 402 is provided so as to correspond to each planar electrode pad 16 formed on the substrate mounting surface 12a of the optical module 100. The electrical connection between the wiring pattern 301 of the circuit substrate 300 and the planar electrode pads 16 of the optical module 100 is ensured by the pins 402a with springs.

That is, in the mounting system 2000, it is possible to ensure the electrical connection between the circuit substrate 300 and the optical module 100, without permanently mounting the optical module 100 to the circuit substrate 300 using, for example, solder, and to evaluate the optical module 100. In addition, it is possible to easily remove the optical module 100 and thus to easily perform maintenance.

The optical module 100 is combined with the optical waveguide which is installed in various ways or has various structures in actual use. Therefore, the height of the focusing position of laser light which is emitted from the VCSEL array element 20 through the microlens array element 40 in the optical module 100 is designed depending on the optical waveguide to be combined with the optical module 100.

In the mounting system 2000, the height-direction positioning mechanism formed by the MT connector supporting member 600 and the spacer 700 can determine the relative height between the end surface of the optical fiber provided in the MT connector C and the focusing position of the microlens array element 40 and accurately align the light receiving surface of the MT connector C with the focusing position of the microlens array element 40 in the height direction. In addition, the spacer 700 with a thickness corresponding to the height of the focusing position of the microlens array element 40 and the MT connector supporting member 600 including the supporting pillar 601 with a height corresponding to the height of the focusing position of the microlens array element 40 may be used. In this case, it is possible to accurately position the height of the light receiving surface of the MT connector C with respect to the optical module 100 to be combined with the optical waveguide which is provided in various ways or has various structures. Therefore, it is possible to apply the optical module 100 to a plurality of optical modules. When the spacer 700 is made of an elastic material, the relative distance between the circuit substrate and the connection end surface of the MT connector C can be changed. In this embodiment, the connection end surface of the MT connector C does not come into contact with the optical module. Therefore, even when unexpected force is applied to the MT connector, the damage of the optical mode due to the force is prevented.

The optical module mounting system according to this embodiment is suitably used as an optical module evaluation kit since the optical module is easily removed. In this case, the MT connector C is connected to an external device, such as a transmission characteristic evaluation device for evaluating the transmission characteristics (for example, a bit error rate or jitter) of the optical module 100, through a multi-core optical fiber cable.

As a detailed example of the evaluation method, for example, a power supply voltage, a differential high frequency signal, and a control signal are supplied from the wiring pattern 301 of the circuit substrate 300 to the optical module 100 through the planar electrode pads 16 to operate the optical module 100 in a state close to the actual use. The MT connector C receives the laser optical signal L output from the optical module 100 and the laser optical signal L is transmitted to the transmission characteristic evaluation device through the multi-core optical fiber cable. Then, transmission characteristics are evaluated in a state close to the actual use.

As described above, according to the mounting system 2000 of the sixth embodiment, it is possible to easily align the optical coupling member in both the horizontal direction and the vertical direction in a short time, using the insertion hole 302. Therefore, manufacturability is improved. In addition, it is possible to accurately position and fix the optical module, without mounting the optical module on the circuit substrate 300 using, for example, soldering, that is, without the damage of the optical module due to mounting. Therefore, it is easy to remove the optical module from the circuit substrate and maintenance is improved. Furthermore, when the mounting system 2000 according to this embodiment is used in an evaluation kit, it is possible to accurately evaluate the characteristics of the optical module 100 including high frequency characteristics.

Seventh Embodiment

Figure 30:
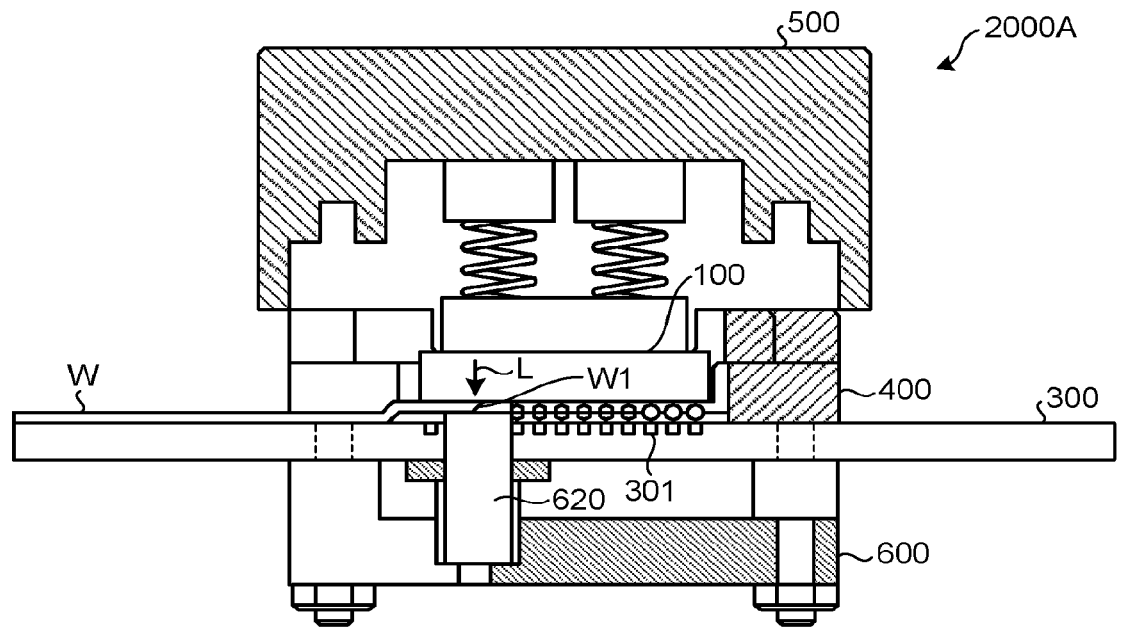
FIG. 30 is a cross-sectional view illustrating a portion of an evaluation kit according to a seventh embodiment.
Figure 31:
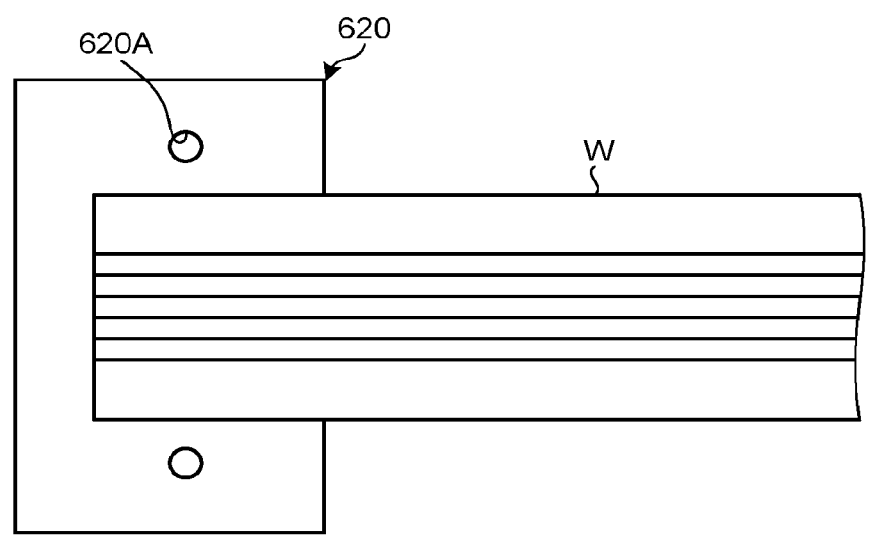
FIG. 31 is a diagram schematically illustrating a waveguide supporting member and an organic optical waveguide illustrated in FIG. 30.

FIG. 30 is a cross-sectional view illustrating a portion of a mounting system according to a seventh embodiment of the invention. A mounting system 2000A according to the seventh embodiment differs from the mounting system 2000 according to the sixth embodiment in that a waveguide supporting member 620 replaces the MT connector C and an organic optical waveguide W, which is a light receiving member (optical coupling member) optically coupled to the optical module 100, is provided on the waveguide supporting member 620. FIG. 31 is a diagram schematically illustrating the waveguide supporting member 620 and the organic optical waveguide W. In this embodiment, the waveguide supporting member 620 which is arranged only in the vicinity of the optical coupling portion is illustrated. However, the waveguide supporting member 620 may have a longitudinal shape along the lower surface of the organic optical waveguide W.

One end of the organic optical waveguide W is formed so as to be inclined at an angle of 45 degrees and is processed into a wedge portion W1. The waveguide supporting member 620 and the organic optical waveguide W are bonded to each other by, for example, an adhesive. The waveguide supporting member 620 has guide holes 620A. The organic optical waveguide W is connected to a transmission characteristic evaluation device through a multi-core optical fiber cable.

In the mounting system 2000A, the organic optical waveguide W is positioned in the height direction by the waveguide supporting member 620, similarly to the sixth embodiment. In addition, the position of the organic optical waveguide W in the horizontal direction is finely adjusted in the MT connector supporting hole 602 such that the guide holes 620A and the guide pin holes provided in the optical module are aligned by guide pins.

As described above, according to the mounting system 2000A of the seventh embodiment, it is possible to easily align an optical coupling member, using the insertion hole 302. Therefore, manufacturability is improved. In addition, it is possible to accurately position and fix the optical module, without mounting the optical module on the circuit substrate 300 using, for example, soldering. Therefore, maintenance is improved. Furthermore, when the mounting system 2000A according to this embodiment is used in an evaluation kit, it is possible to accurately evaluate the characteristics of the optical module 100 including high frequency characteristics.

In the mounting systems 2000 and 2000A according to the sixth and seventh embodiments, the optical module 100 may be mounted on the circuit substrate by a method for fixing the cover 500 to the socket 400 with, for example, screws, without using a latch structure, to form a circuit substrate which is actually used. In addition, when it is not necessary to replace the optical module, the optical module may be directly fixed to a circuit pattern provided on the circuit substrate by, for example, solder, without using a socket or a cover.

Figure 32:
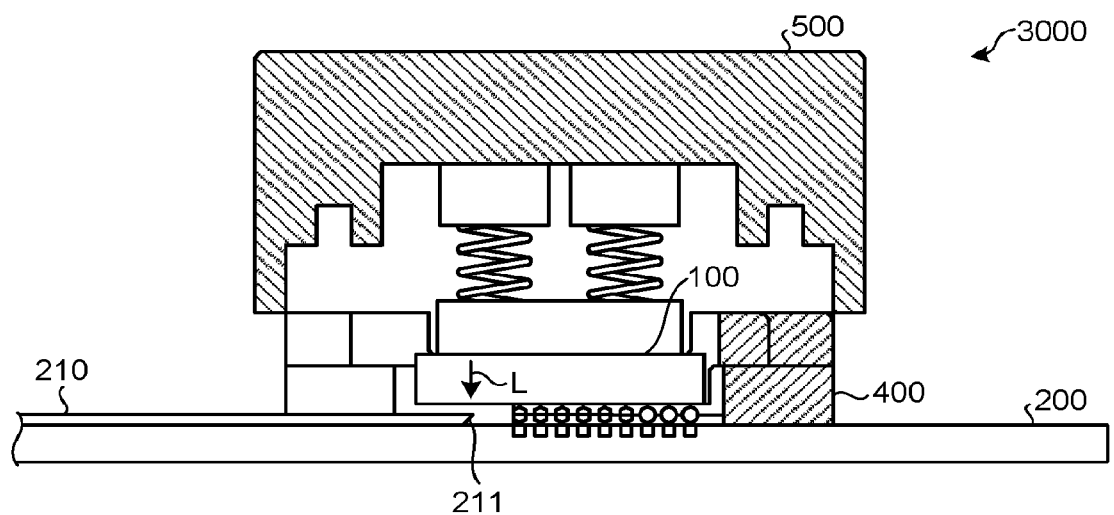
FIG. 32 is a diagram schematically illustrating an optical module-mounted circuit substrate on which an optical module is mounted using a component of the mounting system.

FIG. 32 is a diagram schematically illustrating a circuit substrate on which the optical module is mounted using components of the mounting system. An optical module-mounted circuit substrate 3000 illustrated in FIG. 32 is formed by mounting the optical module 100 on the circuit substrate 200 illustrated in FIG. 7 using the socket 400 and the cover 500. The mounting systems according to the sixth and seventh embodiments can evaluate the optical module in a state close to the actual use. Therefore, the mounting systems can be used when the optical module is mounted on the circuit substrate which is actually used. The optical module-mounted circuit substrate 3000 is suitable for a long-term use since the optical module 100 can be easily replaced.

Figure 33:
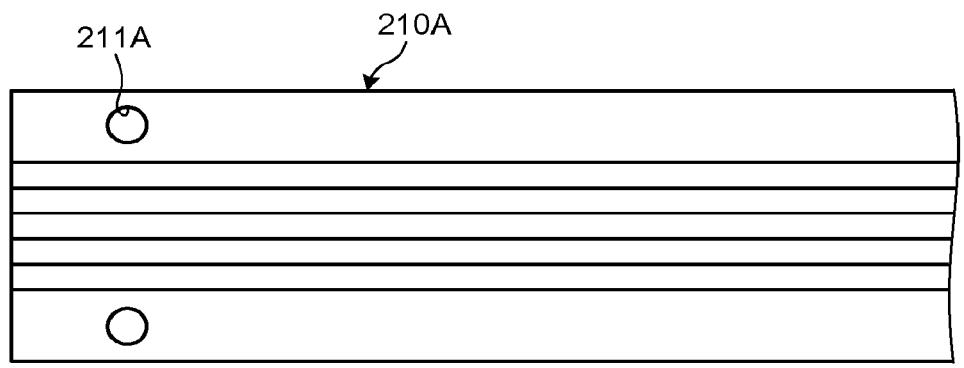
FIG. 33 is a diagram schematically illustrating an organic optical waveguide having a guide hole.

In the optical module-mounted circuit substrate 3000 illustrated in FIG. 32, an organic optical waveguide 210A having guide holes 211A illustrated in FIG. 33 may be used instead of the organic optical waveguide 210. In the organic optical waveguide 210A, fitting pins are inserted into the guide holes 211A and the guide holes 53 of the optical module 100 to accurately determine the relative position between the organic optical waveguide 210A and the optical module 100 in the plane direction of the circuit substrate 200.

The springs 502 and 505 provided in the cover 500 are not limited to a coil shape and may be, for example, leaf springs. In addition, it is preferable that the pressing plate 503 be made of a material with high thermal conductivity such as aluminum. In this case, it is possible dissipate heat generated during the operation of the optical module 100.

In addition, the socket may not include the mounting portion. In this case, instead of the pins as the conductive members, solder balls which have substantially the same height may be arranged as members for ensuring the electrical connection between the planar electrode pads 16 of the optical module 100 and the wiring pattern 301 of the circuit substrate 300 on the wiring pattern 301. Alternatively, an anisotropic conductive film may be provided between the optical module 100 and the circuit substrate 300. When the anisotropic conductive film is pressed by the planar electrode pads 16 protruding from the substrate mounting surface 12a, only the pressed portion has conductivity. Therefore, an electrical connection is made only between the planar electrode pad 16 and the wiring pattern 301 which face each other. In contrast, no electrical connection is made between the planar electrode pad 16 and the wiring pattern 301 which do not face each other, between the planar electrode pads 16, and between the wiring patterns 301.

In addition, instead of the supporting pillar, a coil spring or a leaf spring may be provided in the MT connector supporting member.

In the sixth embodiment, a spacer may be provided between the lens array element holder 50 of the optical module 100 and the MT connector C. In addition, other types of optical connectors may be used instead of the MT connector C.

The mounting system according to the above-described embodiment may be used as an optical module for reception. In this case, the MT connector C or the organic optical waveguide W is connected as a light emitting member (optical coupling member) which is optically coupled to the optical module for reception to an array signal light source through a multi-core optical fiber cable. The optical module for reception receives an optical signal from the array signal light source and outputs an electric signal. This system may also be used as an evaluation kit. In this case, the output electric signal is transmitted to the transmission characteristic evaluation device through the wiring pattern of the circuit substrate and the characteristics thereof are measured. In this way, it is possible to evaluate the optical module for reception.

In the sixth embodiment, instead of the MT connector C, a light receiving module including a photodiode array element and an amplifier may be directly provided. In this case, it is possible to accurately evaluate the characteristics of the optical module 100 itself without including the characteristics of the MT connector C or the multi-core optical fiber cable. When the optical module to be evaluated is an optical module for reception, a light emitting module including the VCSEL array element and the driver IC may be directly provided, instead of the MT connector C.

In the circuit substrate, for example, a ridge optical waveguide, such as a silicon wire waveguide, an optical fiber sheet, or a PLC chip may be used instead of the organic optical waveguide to be optically coupled.

Eighth and Ninth Embodiments

Figure 34:
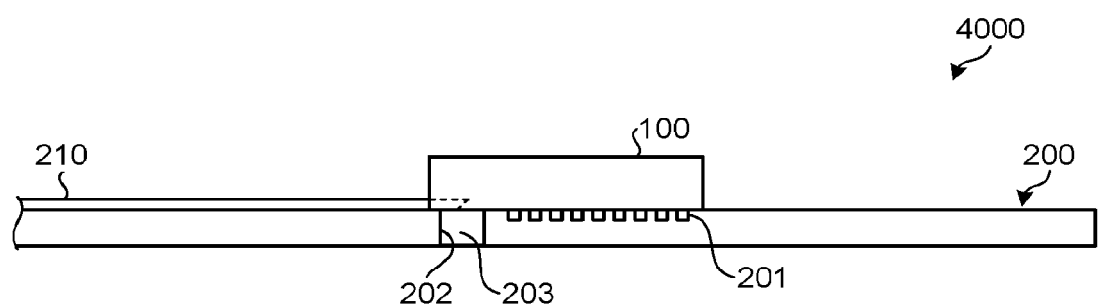
FIG. 34 is a diagram schematically illustrating an optical module-mounted circuit substrate according to an eighth embodiment.
Figure 35:
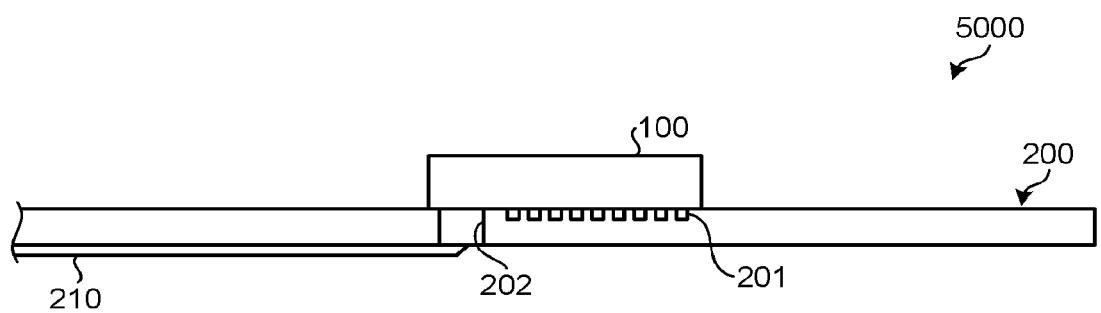
FIG. 35 is a diagram schematically illustrating an optical module-mounted circuit substrate according to a ninth embodiment.

FIG. 34 is a diagram schematically illustrating an optical module-mounted circuit substrate according to an eighth embodiment. FIG. 35 is a diagram schematically illustrating an optical module-mounted circuit substrate according to a ninth embodiment.

Optical module-mounted circuit substrates 4000 and 5000 each include an optical module 100, a circuit substrate 200, and an organic optical waveguide 210. The optical module-mounted circuit substrates 4000 and 5000 according to the eighth and ninth embodiments differ from the optical module-mounted circuit substrates according to the sixth and seventh embodiments in that, while the optical module is mounted on the circuit substrate through the socket in the sixth and seventh embodiments, the optical module 100 is directly fixed to a wiring pattern 201 on the circuit substrate 200 by, for example, solder and is electrically connected thereto and the organic optical waveguide 210, which is an optical coupling member, is directly fixed to the circuit substrate 200 by, for example, an adhesive (through a spacer if necessary) in the eighth and ninth embodiments. The eighth embodiment differs from the ninth embodiment in that the organic optical waveguide 210, which is an optical coupling member, is fixed between the optical module and the circuit substrate on the circuit substrate or the organic optical waveguide 210 is provided on the lower surface of the circuit substrate such that the circuit substrate is interposed between the optical module and the organic optical waveguide. According to these methods, after the optical module 100 is fixed, an alignment mark (not illustrated) provided on the organic optical waveguide 210 and an alignment mark (not illustrated) provided on the optical module are visually aligned with each other through an opening 202, which has the same shape as the insertion hole 302 of the circuit substrate 300, in the horizontal direction on the plane of the circuit substrate 200. Therefore, it is possible to easily determine an optical coupling position and manufacturability is improved. In the method using the guide pin hole as the alignment mark, the outside diameter of the organic optical waveguide can also be aligned with the mark provided on the optical module. In the eighth and ninth embodiments, the optical module may be detachably and electrically fixed using the socket, instead of using soldering.

As illustrated in FIGS. 34 and 35, the opening 202 may be a through hole provided in the circuit substrate 200 or an optical window in which a hole is filled with, for example, an optical glass 203. In addition, the opening 202 may be an optical via or a spot size conversion mechanism having a lens provided therein.

In this embodiment, the optical coupling member is not limited to the organic optical waveguide 210. For example, the organic optical waveguide 210 may be a planar waveguide, such as a PLC, or a 90-degree bent optical connector having a connection end surface on the optical module side.

In the sixth to ninth embodiments, after positioning in the horizontal direction is performed, it is possible to perform active alignment while seeing an output from an optical detector which is provided at the other end of the organic waveguide. Therefore, it is possible to accurately perform alignment.

It is most preferable that the opening 302 or 202 be provided in the vicinity of an optical coupling portion. When the position of the optical module and the position of the optical coupling member are aligned with each other through the opening, the opening 302 or 202 may be provided at a position other than the vicinity of the optical coupling portion.

Tenth Embodiment

Figure 36:
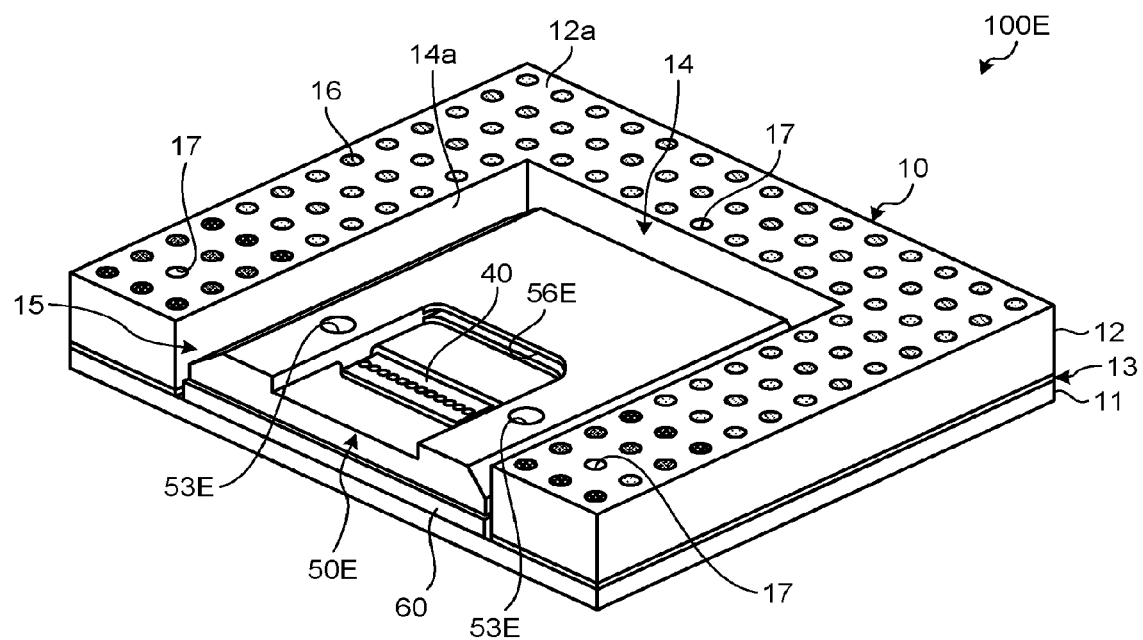
FIG. 36 is a perspective view schematically illustrating an optical module according to a tenth embodiment.

FIG. 36 is a perspective view schematically illustrating an optical module according to a tenth embodiment of the invention. An optical module 100E according to the tenth embodiment differs from the optical module 100 according to the first embodiment illustrated in FIG. 1 in that a lens array element holder 50E replaces the lens array element holder 50.

The lens array element holder 50E holds a microlens array element 40. In addition, the lens array element holder 50E has guide holes 53E for alignment.

The lens array element holder 50E includes a slit 56E as an attachment structure for attaching a protector which protects the microlens array element 40.

Figure 37:
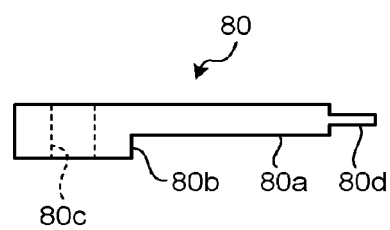
FIG. 37 is a side view schematically illustrating a protector.

FIG. 37 is a side view schematically illustrating a protector. A protector 80 has a plate shape as a whole and includes a main body 80a, a dustproof portion 80b which is formed at one end of the main body 80a and is thicker than the main body 80a, a through hole 80c which is formed in the dustproof portion 80b, and an insertion portion 80d which is formed at the other end of the main body 80a opposite to the dustproof portion 80b and is thinner than the main body 80a.

Figure 38:
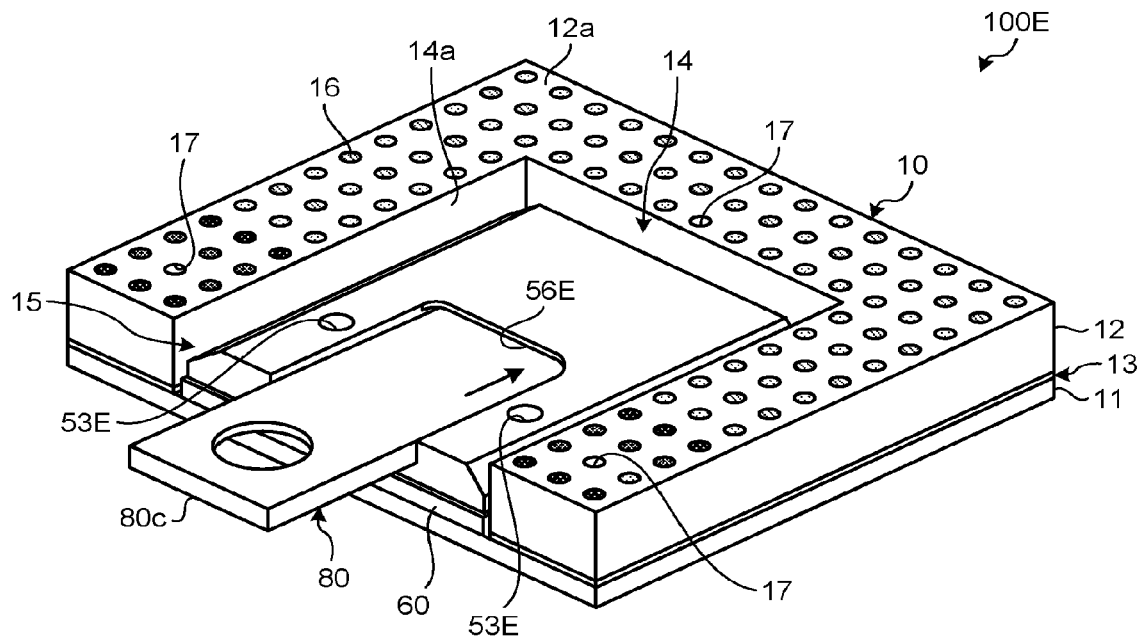
FIG. 38 is a diagram illustrating a state in which the protector is attached to the optical module.

FIG. 38 is a diagram illustrating a state in which the protector is attached to the optical module. When the protector 80 is attached to the optical module 100E, the insertion portion 80d of the protector 80 is inserted into the slit 56E of the lens array element holder 50E. In this way, the protector 80 is attached to the lens array element holder 50E, without interfering with the microlens array element 40.

In the optical module 100E, a surface of the microlens array element 40 on which microlens are formed is exposed. However, since the protector 80 is attached, the surface of the microlens array element 40 is covered and protected by the main body 80a. In addition, when the insertion portion 80d is inserted into the slit 56E, the dustproof portion 80b comes into contact with the front side wall of the lens array element holder 50E and prevents, for example, dust from reaching the microlens array element 40 from the outside.

The protector 80 is attached to the optical module 100E when the optical module 100E is in storage or while the optical module 100E is being transported with being accommodated in a reel tape. In some cases, dust is generated in the vicinity of the optical module 100E during the storage or transportation of the optical module 100E. When dust is attached to the surface of the microlens array element 40 on which the microlens are formed, the optical characteristics of the optical module 100E deteriorate due to the dust.

In contrast, the structure in which the protector 80 is attached to the optical module 100E can prevent, for example, dust from being attached to the surface of the microlens array element 40 on which the microlens are formed even when dust is generated in the vicinity of the optical module 100E during the storage or transportation of the optical module 100E. The optical module 100E is accommodated in a case while being transported. For example, dust is generated when the friction between the optical module 100E and the case occurs due to vibration. The protector 80 is effective in protecting the optical module 100E from, for example, dust.

The protector 80 may be attached to the optical module 100E during a solder reflow mounting process. During the solder reflow mounting process, dust or a scatter (for example, flux) from solder cream (paste) floats in a reflow furnace. The protector 80 is effective in protecting the optical module 100E from, for example, the floating matter.

For example, when the optical module 100E is mounted to the circuit substrate 200 illustrated in FIG. 7 by solder reflow, first, the protector 80 is attached to the optical module 100E. Then, the solder reflow mounting process is performed in the reflow furnace to mount the optical module 100E to the circuit substrate 200. Then, the circuit substrate 200 is taken out from the reflow furnace and the protector 80 is removed from the optical module 100E. When the protector 80 is removed, it is possible to ensure an optical path between the microlens array element 40 and an organic optical waveguide 210 mounted on the circuit substrate 200. In addition, for example, the user can insert a finger or a hook into the through hole 80c and draw the protector 80 to easily remove the protector 80 from the optical module 100E.

As described above, when the protector 80 is used in the solder reflow mounting process, the protector 80 is made of a material with a sufficient heat resistance to withstand the internal temperature of the reflow furnace. In addition, it is preferable that the protector 80 be made of a material with sufficient elasticity to press the insertion portion 80d into the slit 56E by press fitting. In this case, it is possible to easily fix the protector 80 to the lens array element holder 50E. Therefore, the material forming the protector 80 is preferably Teflon (registered trademark) which has high heat resistance and is capable of pressing the insertion portion 80d into the slit 56E.

Figure 39:
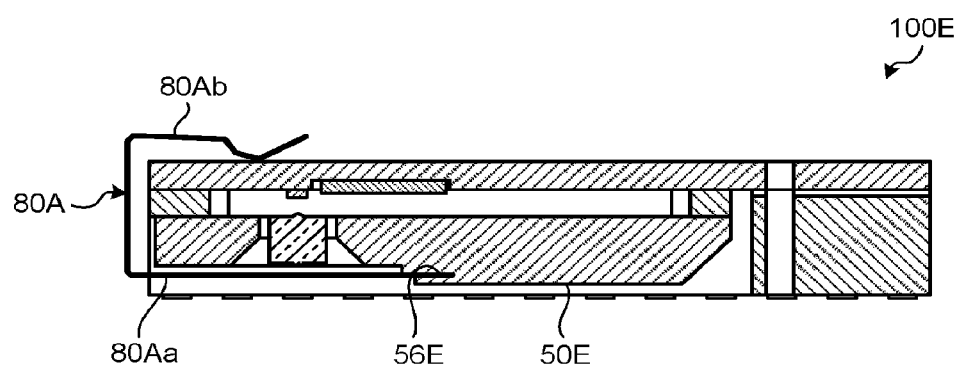
FIG. 39 is a diagram schematically illustrating a protector according to another embodiment.
Figure 40:
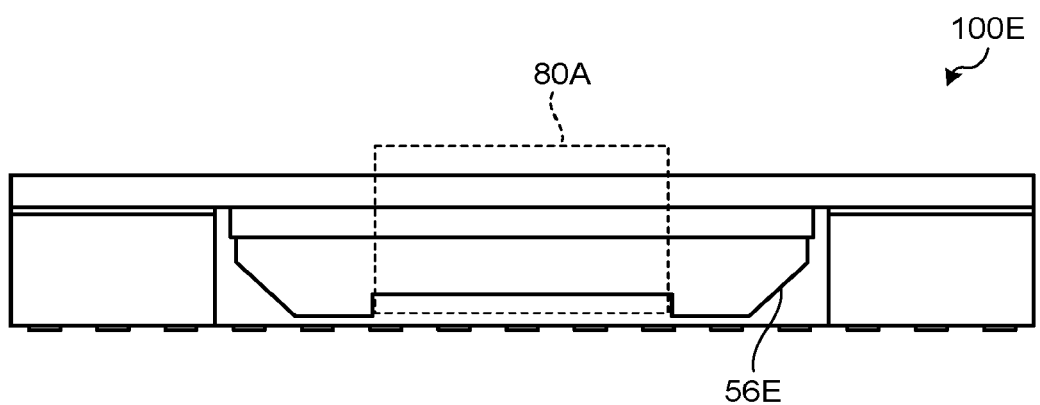
FIG. 40 is a diagram schematically illustrating a protector according to another embodiment.

FIGS. 39 and 40 are diagrams schematically illustrating protectors according to other embodiments. FIG. 39 is a cross-sectional view illustrating the optical module 100E having a protector 80A attached thereto (corresponding to the cross-sectional view of FIG. 4) and FIG. 40 is a front view. In FIG. 40, the protector 80A is represented by a dashed line. The protector 80A includes a protective portion 80Aa which has a plate shape, covers the surface of the microlens array element 40, and has one end inserted into the slit 56E of the lens array element holder 50E and a spring portion 80Ab which forms a U-shape together with the protective portion 80Aa as viewed from a side surface and is used to fix the protector 80A to the optical module 100E.

The protective portion 80Aa covers and protects the surface of the microlens array element 40, with one end of the protective portion 80Aa of the protector 80A being inserted into the slit 56E, and the protector 80A is fixed to the optical module 100E while the optical module 100E is interposed between the protective portion 80Aa and the spring portion 80Ab.

Figure 41A:
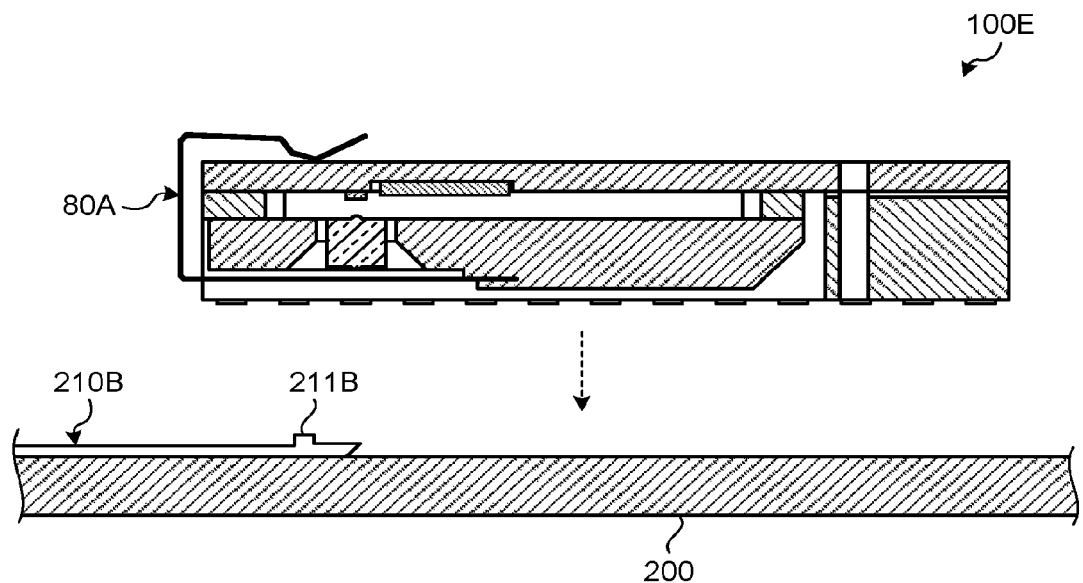
FIG. 41A is a diagram illustrating an aspect in which the optical module having the protector attached thereto is mounted on the circuit substrate.
Figure 41B:
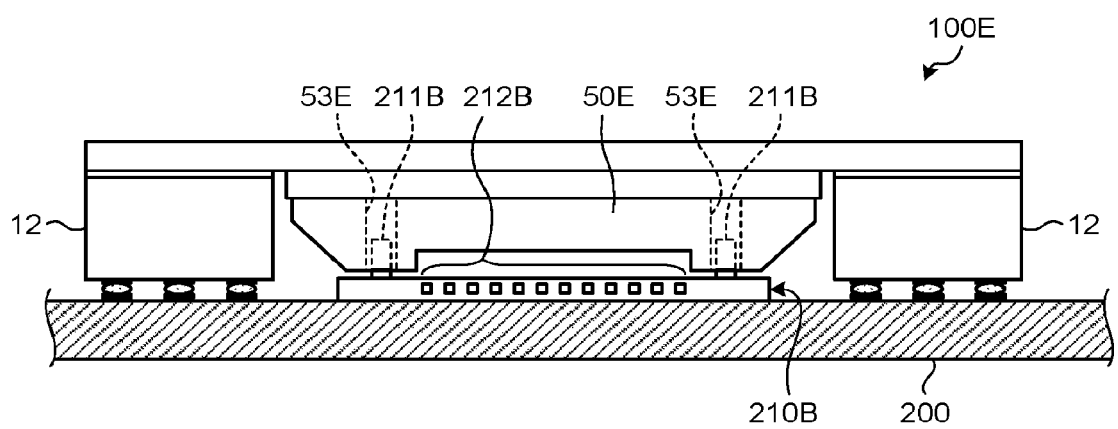
FIG. 41B is a diagram illustrating an aspect in which the optical module having the protector attached thereto is mounted on the circuit substrate.

FIGS. 41A and 41B are diagrams illustrating an aspect in which the optical module 100E having the protector 80A attached thereto is mounted to the circuit substrate 200. However, the protector BOA is not illustrated in FIG. 41B for convenience of explanation. When the optical module 100E is mounted on the circuit substrate 200, the optical module 100E is mounted on the circuit substrate 200 onto which solder has been applied. The same mounter as that used to mount an electronic component is used to mount the optical module 100E. In addition, pins 211B are formed on the circuit substrate 200 and an optical waveguide 210B having a waveguide core 212B is mounted on the circuit substrate 200. When the optical module 100E is mounted, for example, an image recognition process is performed for the guide holes 17 (see FIG. 36) of the optical module 100E and the pins 211B of the circuit substrate 200 and an alignment process is performed by the mounter. Then, the optical module 100E is mounted on the circuit substrate 200. In addition, holes may be formed instead of the pins 211B. Then, the circuit substrate 200 having the optical module 100E mounted thereon is guided into the reflow furnace and the solder reflow mounting process is performed for the circuit substrate 200.

Alternatively, an optical waveguide 210 having the pins 211B formed thereon is mounted. When the optical module 100E is mounted, an image recognition process is performed for the guide holes 53E (see FIG. 36) for alignment which are provided in the lens array element holder 50E of the optical module 100E and two pins 211B (see FIG. 41B) of the circuit substrate 200 and an alignment process is performed by the mounter. Then, the optical module 100E is mounted on the circuit substrate 200. Then, the circuit substrate 200 having the optical module 100E mounted thereon is guided into the reflow furnace and the solder reflow mounting process is performed for the circuit substrate 200.

The guide holes 53E of the optical module 100E and the pins 211B of the circuit substrate 200 are designed in advance so as to be fitted to each other when the alignment process is performed by the mounter and the optical module 100E is mounted on the circuit substrate 200. The optical module 100E is designed in advance such that a known MT ferrule attached to an optical fiber tape is aligned with the guide hole 53E through the guide pin and the optical module 100E is evaluated. That is, the optical module 100E is aligned and assembled such that the positional relationship among the optical fiber core of the MT connector, the microlens array element 40, and the VCSEL array element 20 falls within a desired optical loss range (optical coupling loss range). The positional relationship between the pin 211B and the waveguide core 212B is designed in advance such that light emitted from the microlens array element 40 of the optical module 100E is optically coupled to a predetermined waveguide core 212B of the optical waveguide 210B in a desired optical loss range (optical coupling loss range) when the optical module 100E is mounted on the circuit substrate 200. Then, the optical module 100E and the circuit substrate 200 are manufactured on the basis of the design.

According to the above-mentioned structure, the fitting between the (two) guide holes 53E and the (two) pins 211B makes it possible to solve the problem that the positional deviation between the optical module 100E and the optical waveguide 210B occurs due to, for example, vibration during a process for a period from the mounting of the optical module 100E by the mounter to the end of the solder reflow mounting process, which causes the damage of the favorable optical coupling between the optical module 100E and the optical waveguide 210B. In addition, the fitting makes it possible to reliably perform the optical coupling between the optical module 100E and the optical waveguide 210B formed on the circuit substrate 200.

It is assumed that the clearance (which is substantially equal to the difference between the inside diameter of the guide hole 53E and the outside diameter of the pin 211B) between the guide hole 53E of the lens array element holder 50E and the pin 211B is c1 and the clearance (which is substantially equal to the difference between the internal width of the frame member 12 and the width of the optical waveguide 210B in the left-right direction of the plane of paper in FIG. 41B) between the frame member 12 of the optical module 100E and the optical waveguide 210B is c2. In this case, the components are designed so as to satisfy c1<c2. According to this structure, the clearance c2 has the effect of guiding the fitting between the guide hole 53E and the pin 211B and the fitting is reliably performed.

Figure 59A:
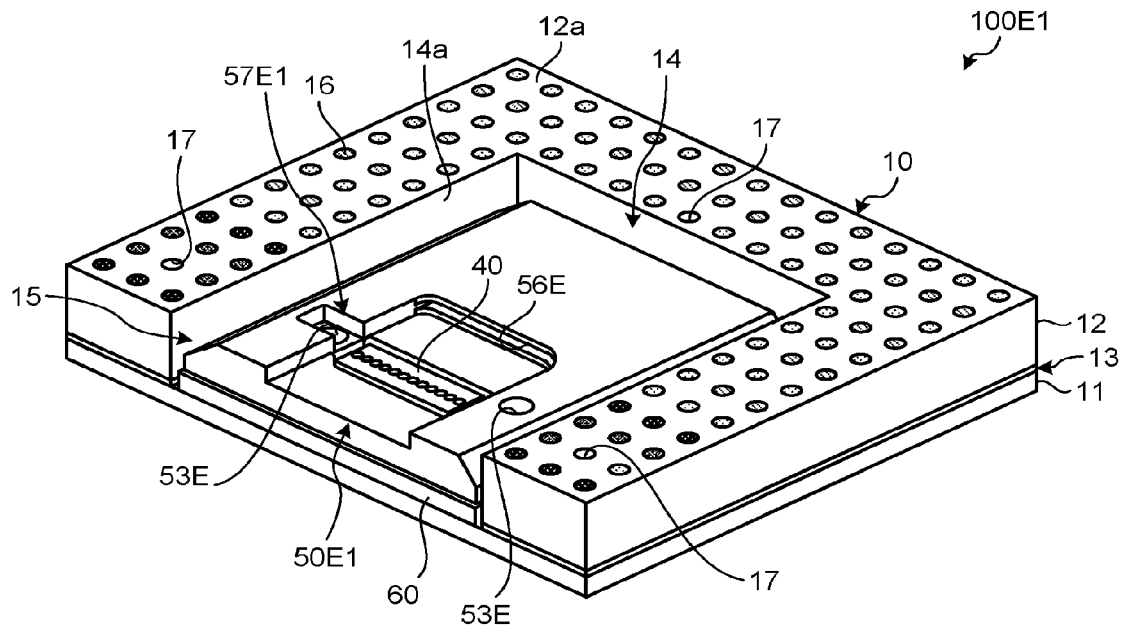
FIG. 59A is a perspective view schematically illustrating an optical module according to a modification of the tenth embodiment.
Figure 59B:
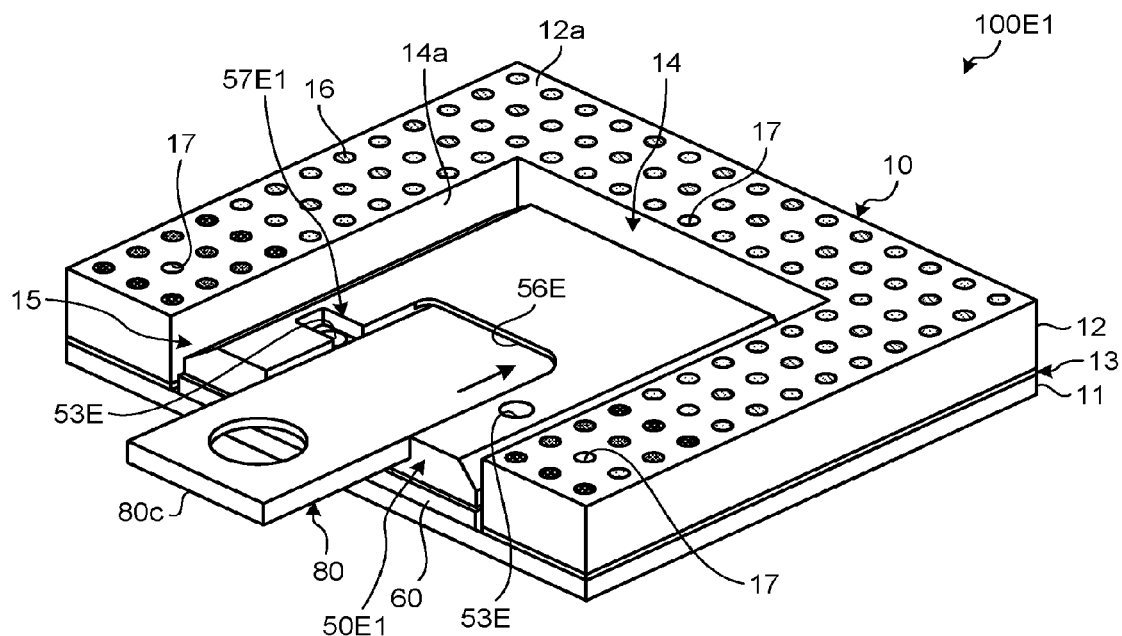
FIG. 59B is a diagram illustrating a state in which the protector is attached to the optical module.
Figure 59C:
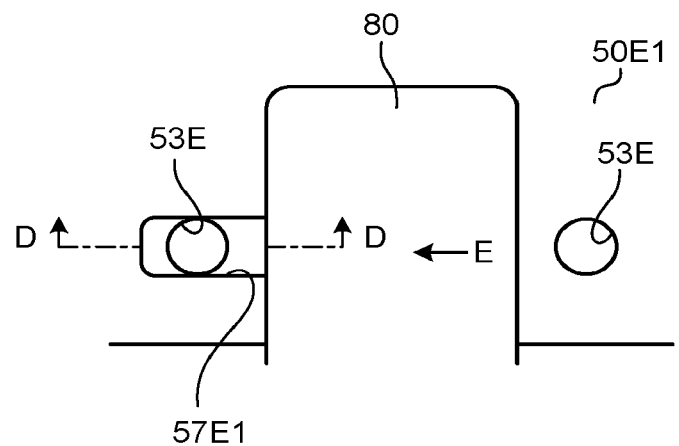
FIG. 59C is a top view illustrating a main portion of FIG. 59B.
Figure 59D:
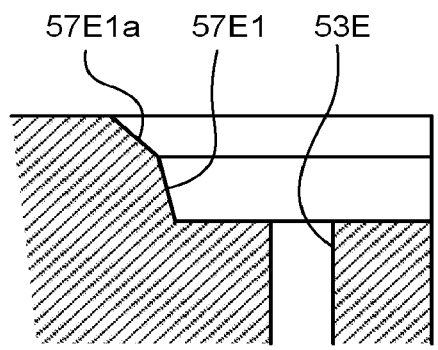
FIG. 59D is a cross-sectional view illustrating a main portion taken along the line D-D of FIG. 59C.
Figure 59E:
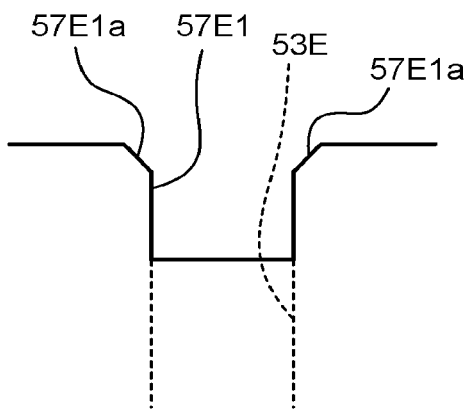
FIG. 59E is a diagram as viewed from an arrow E in FIG. 59C.

It is preferable to use the following structure in order to reliably perform the above-mentioned alignment and to easily perform mounting when the alignment process is performed by the mounter and the optical module 100E is mounted on the circuit substrate 200 by the fitting between the guide holes 53E provided in the optical module 100E and the pins 211B provided on the optical waveguide 210B. FIG. 59A is a perspective view schematically illustrating an optical module according to a modification of the tenth embodiment. FIG. 59B is a diagram illustrating a state in which the protector is attached to the optical module. FIG. 59C is a top view illustrating a main portion illustrated in FIG. 59B. FIG. 59D is a cross-sectional view illustrating a main portion taken along the line D-D of FIG. 59C. FIG. 59E is a diagram as viewed from an arrow E in FIG. 59C. An optical module 100E1 according to this modification differs from the optical module 100E according to the tenth embodiment in that a lens array element holder 50E1 replaces the lens array element holder 50E. The lens array element holder 50E1 differs from the lens array element holder 50E in that a groove-shaped depressed portion 57E1 is formed in the lens array element holder 50E1. One of the guide holes 53E is formed in the bottom of the depressed portion 57E1.

The depth of the depressed portion 57E1 is greater than the length of the pin 211B provided on the optical waveguide 210B and is less than the length of the guide pin used to fit the MT ferrule.

That is, when the optical module 100E is mounted on the circuit substrate 200, one of the two pins 211B provided on the optical waveguide 210B is fitted to the guide hole 53E and the other pint is fitted to the depressed portion 57E1. For example, when the guide pin is inserted into the guide hole 53E and the guide pin and a known MT ferrule are fitted so as to be optically connected to each other in order to evaluate only the optical module 100E1, one of the two guide pins is fitted to the guide hole 53E in which the depressed portion 57E1 is not formed and the other guide pin is fitted to the guide hole 53E provided in the bottom of the depressed portion 57E1.

The following effect is obtained by the formation of the depressed portion 57E1. In a case in which the alignment process is performed by the mounter and the optical module 100E1 is mounted on the circuit substrate 200, even when the clearance between the guide hole 53E and the pin 211B is reduced in order to improve the accuracy of fitting or even when there is a little deviation in the gap between the two pins 211B, it is possible to easily fit the pins 211B to the guide holes 53E and the depressed portion 57E1 since the depressed portion 57E1 is a long hole. As a result, it is possible to prevent the problem that it is difficult to fit the optical waveguide 210B to the optical module 100E.

That is, since one of the guide holes 53E is formed in the bottom of the depressed portion 57E1, the optical module 100E1 and a known MT ferrule are fitted so as to be optically connected to each other and the optical module 100E1 can be easily evaluated. In addition, when the optical module 100E is mounted on the circuit substrate 200, it is possible to easily fit the optical waveguide 210B to the optical module 100E.

The edge of the guide hole 53E (that is, the edge of the depressed portion 57E1) into which the pin 211B is inserted may be a tapered portion 57E1a (see FIGS. 59D and 59E) which is slightly chamfered, in order to reliably prevent non-fitting and to reliably fit the pin 211B to the guide hole 53E.

Figure 60:
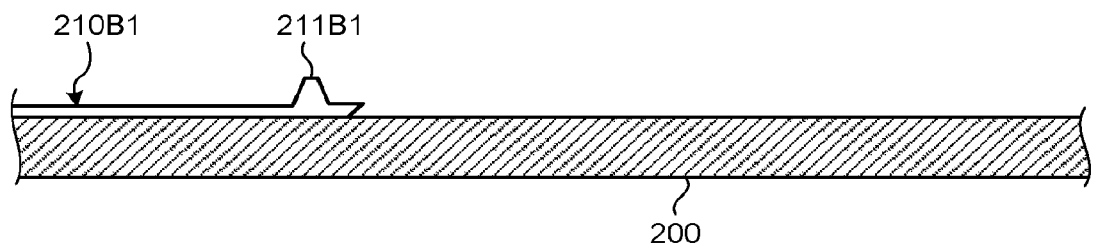
FIG. 60 is a diagram illustrating a pin which is formed in a tapered shape.

The pin is formed in a tapered shape, for example, a truncated cone shape by, for example, photolithography like a pin 211B1 formed on an optical waveguide 210B1 illustrated in FIG. 60. According to this structure, it is possible to improve ease of fitting during mounting and to improve the accuracy of the positioning between the optical module 100E and the optical waveguide 210B1.

Figure 42:
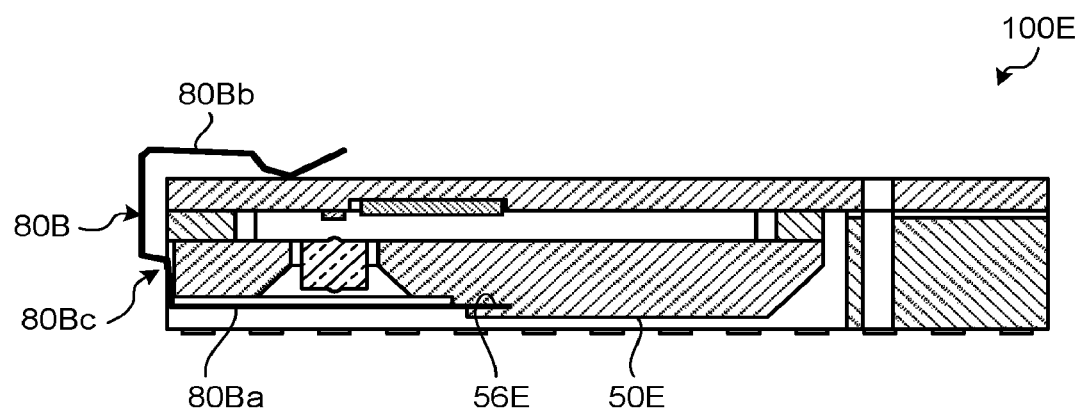
FIG. 42 is a diagram schematically illustrating a protector according to still another embodiment.
Figure 43:
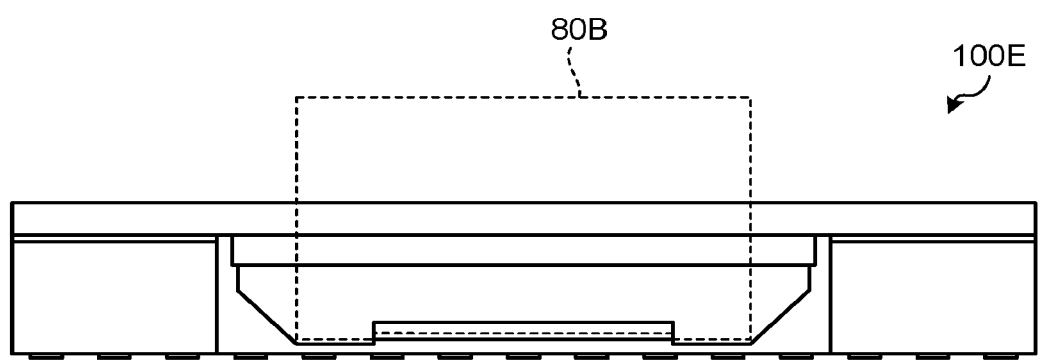
FIG. 43 is a diagram schematically illustrating the protector according to still another embodiment.

FIGS. 42 and 43 are diagrams schematically illustrating a protector according to another embodiment. FIG. 42 is a side cross-sectional view (corresponding to the cross-sectional view of FIG. 4) illustrating the optical module 100E having a protector 80B attached thereto and FIG. 43 is a front view. In FIG. 43, the protector 80B is represented by a dashed line. The protector 80B includes a protective portion 80Ba which has a plate shape, covers the surface of the microlens array element 40, and has one end inserted into the slit 56E of the lens array element holder 50E, a spring portion 80Bb which forms a U-shape together with the protective portion 80Ba as viewed from a side surface and is used to fix the protector 80B to the optical module 100E, and a bent portion 80Bc which is provided between the protective portion 80Ba and the spring portion 80Bb.

The protective portion 80Ba covers and protects the surface of the microlens array element 40, with one end of the protective portion 80Ba of the protector 80B being inserted into the slit 56E, and the protector 80B is fixed to the optical module 100E while the optical module 100E is interposed between the protective portion 80Ba and the spring portion 80Bb. In addition, the gap between the protector 80B and the lens array element holder 50E of the optical module 100E is reduced by the bent portion 80Bc. Therefore, it is possible to prevent, for example, dust from getting into the optical module 100E from the outside.

The protector 80A or 80B may be a plastic molding or may be a leaf spring manufactured by bending one metal plate. In the protectors 80A and 80B, the spring force of the spring portion 80Ab or 80Bb can reliably reduce the risk of the detachment of the protector 80A or 80B from the optical module 100E and it is possible to improve the reliability of a protection function.

In the solder reflow mounting process, the internal temperature of the reflow furnace is high. Therefore, when a closed space is present in the optical module, there is a concern that the internal pressure of the closed space will increase.

However, in the optical module according to the above-described embodiment, for example, in the optical module 100, the inner portion which is covered with the lens array element holder 50 is connected to an external space through the guide hole 53 or the gap between the microlens array element 40 and the holding hole 52 for fixing the microlens array element 40. Therefore, even in the solder reflow mounting process, an increase in the internal pressure of the optical module or damage due to pressure is prevented.

As described above, after the solder reflow mounting process, a process of filling the gap of the mounting surface with an underfill material is performed. In this process, it is preferable to use the following height adjuster.

Figure 44:
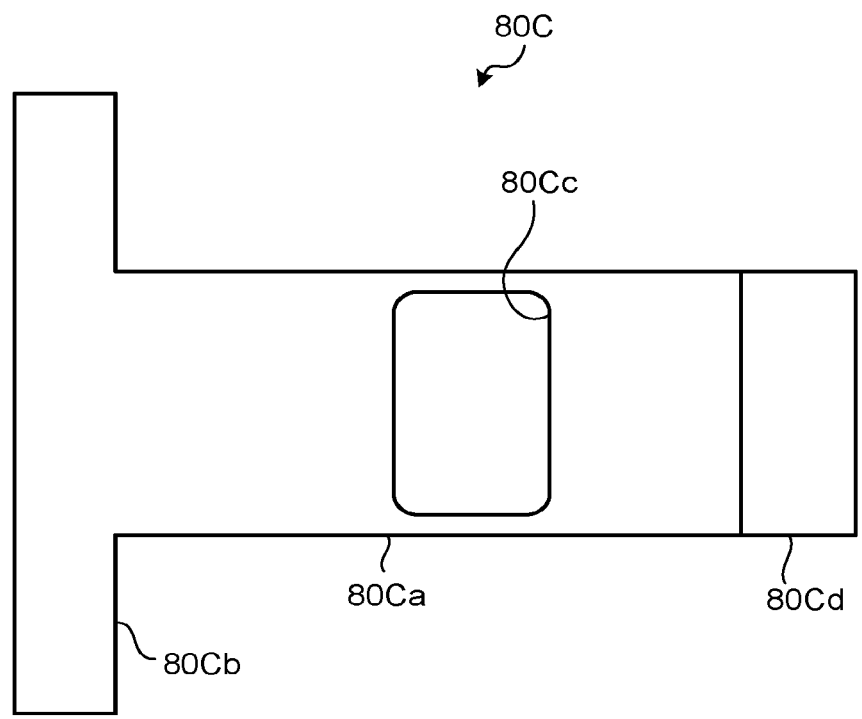
FIG. 44 is a top view schematically illustrating a height adjuster.
Figure 45:
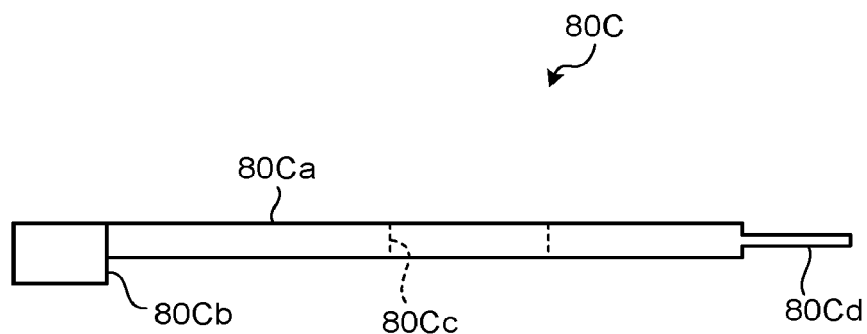
FIG. 45 is a side view schematically illustrating the height adjuster.

FIG. 44 is a top view schematically illustrating the height adjuster. FIG. 45 is a side view schematically illustrating the height adjuster. As illustrated in FIGS. 44 and 45, a height adjuster 80C has a plate shape as a whole and includes a main body 80Ca, a height adjustment portion 80Cb which is formed at one end of the main body 80Ca, is thicker than the main body 80Ca, and is wider than the main body 80Ca, a through hole 80Cc for an optical path which is formed in the main body 80Ca, and an insertion portion 80Cd which is provided at the other end of the main body 80Ca opposite to the height adjustment portion 80Cb and is thinner than the main body 80Ca.

Next, the usage and effect of the height adjuster 80C will be described. First, a case in which the gap of the mounting surface is filled with the underfill material, without using the height adjuster 80C, will be described.

Figure 46:
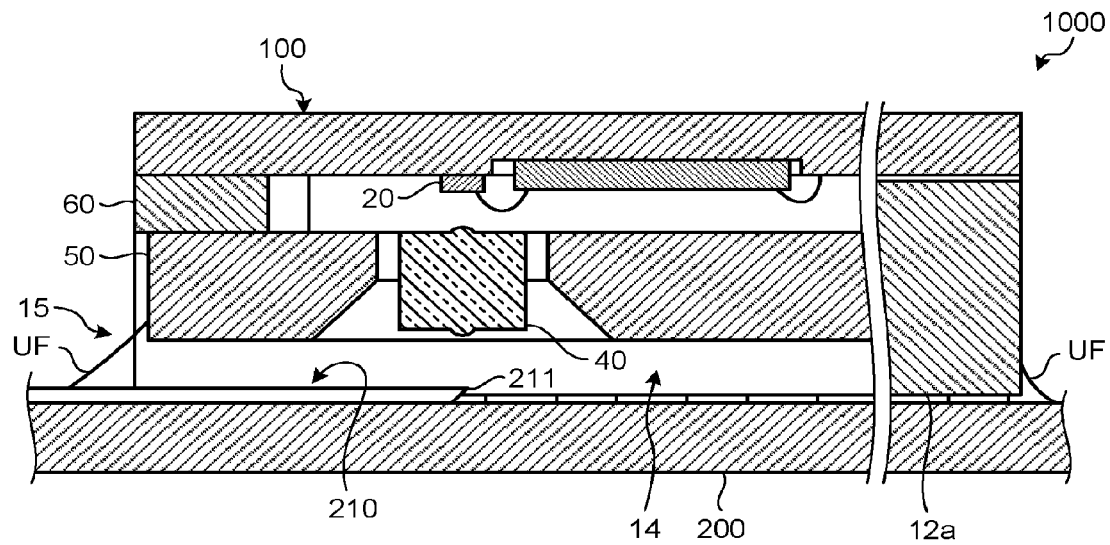
FIG. 46 is a diagram illustrating a case in which the height adjuster is not used.

FIG. 46 is a diagram illustrating a case in which the height adjuster is not used. Here, an example in which the circuit substrate 1000 (see FIG. 8) formed by mounting the optical module 100 on the circuit substrate 200 is filled with the underfill material will be described.

The gap between the optical module 100 and the circuit substrate 200 is filled with an underfill material UF. However, since the optical module 100 has the waveguide introduction opening 15, the height of the gap to be filled with the underfill material UF on the side of the waveguide introduction opening 15 is from the surface of the circuit substrate 200 to the surface of the lens array element holder 50E and is greater than the height from the surface of the circuit substrate 200 to the substrate mounting surface 12a. As such, when the large gap is filled with the underfill material UF, the amount of underfill material UF used increases. In addition, a material with high viscosity needs to be used as the underfill material UF. As a result, flexibility in the selection of the material to be used as the underfill material UF is reduced.

Figure 47:
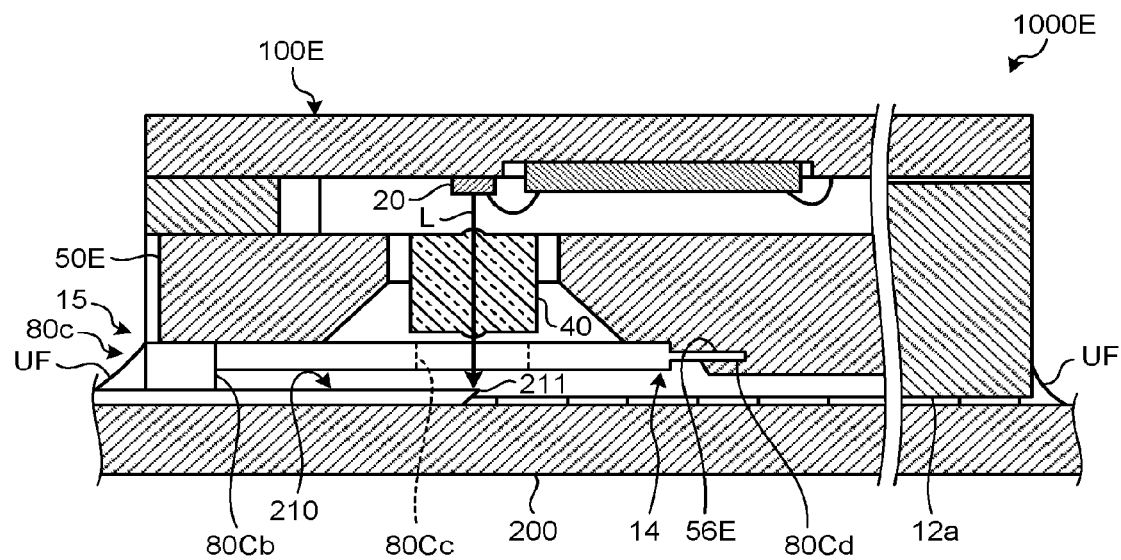
FIG. 47 is a diagram illustrating a case in which the height adjuster is used.

In contrast, FIG. 47 is a diagram illustrating a case in which the height adjuster is used. FIG. 47 illustrates a circuit substrate 1000E formed by mounting the optical module 100E on the circuit substrate 200.

As described above, in the case in which the protector is attached to the optical module 100E and the solder reflow mounting process is performed, the protector is removed after the optical module 100E is mounted. Then, the height adjuster 80C is attached to the optical module 100E. Specifically, the insertion portion 80Cd of the height adjuster 80C is inserted into the slit 56E of the lens array element holder 50E. In this way, the height adjuster 80C is attached to the lens array element holder 50E. In the inserted state, the through hole 80Cc for an optical path is located at a corresponding position on the surface of the microlens array element 40 on which the microlenses are formed. The optical path between the microlens array element 40 and the organic optical waveguide 210 is ensured by the through hole 80Cc for an optical path.

In the inserted state, the thickness of the height adjustment portion 80Cb is adjusted such that the lower end of the height adjustment portion 80Cb of the height adjuster 80C is substantially flush with or lower than the substrate mounting surface 12a of the optical module 100E. Therefore, when the gap between the optical module 100E and the circuit substrate 200 is filled with the underfill material UF, it may be filled up to a height corresponding to the lower end of the height adjustment portion 80Cb on the side of the waveguide introduction opening 15. In this case, an increase in the amount of underfill material UF used is prevented and flexibility in the selection of the material to be used as the underfill material UF increases. In addition, since the optical path between the microlens array element 40 and the organic optical waveguide 210 is ensured by the through hole 80Cc for an optical path, it is possible to use the circuit substrate 1000E, with the height adjuster 80C attached to the circuit substrate 1000E. It is preferable that the width of the height adjustment portion 80Cb be substantially equal to the width of the waveguide introduction opening 15.

The application of the protector is not limited to the optical module according to the above-described embodiment, but the protector may be applied to the optical modules according to other embodiments.

Figure 48:
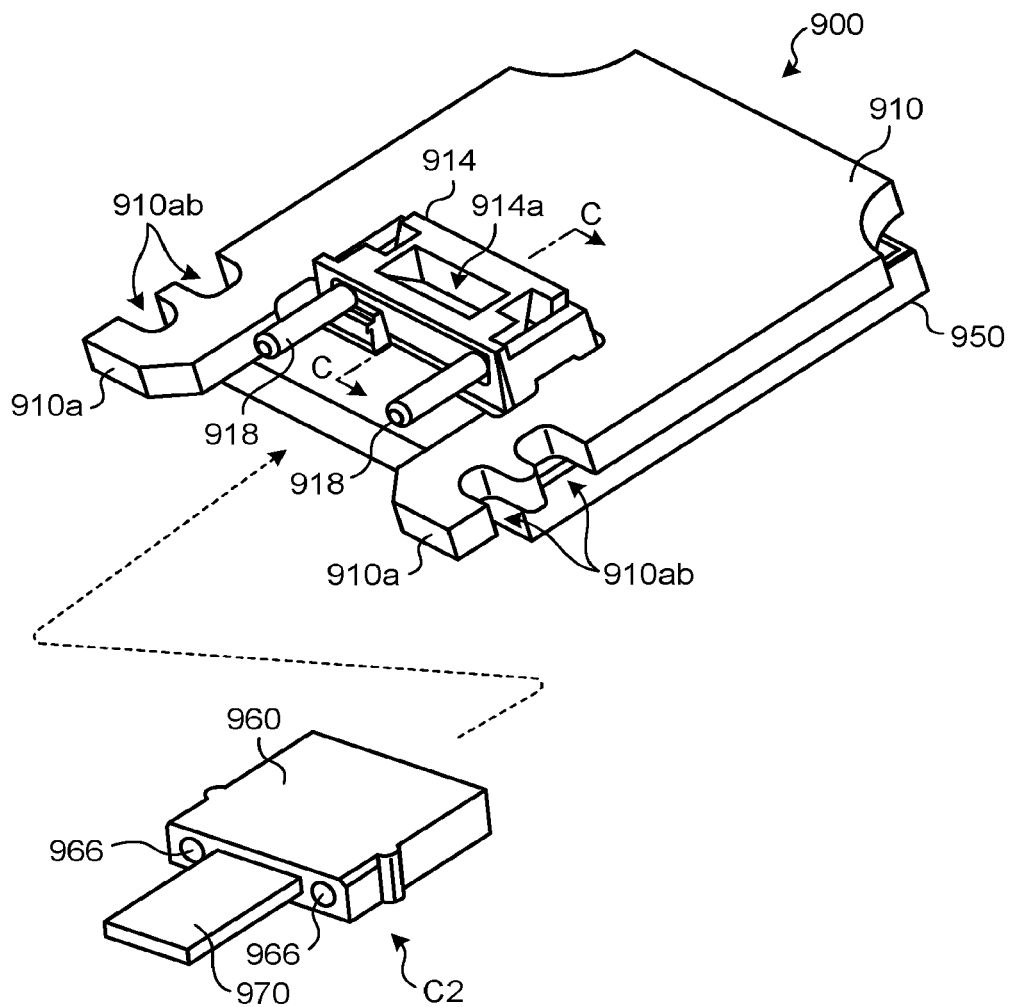
FIG. 48 is a perspective view schematically illustrating an optical module according to another embodiment to which a protector will be applied.

FIG. 48 is a perspective view schematically illustrating an optical module according to another embodiment to which the protector will be applied. An optical module 900 includes a circuit substrate 950, a housing 910 which covers the circuit substrate 950, a light input/output portion 914 which is formed on the circuit substrate 950, and two guide pins 918 which are formed on the light input/output portion 914. Two guide portions 910a for guiding an MT connector C2, which will be described below, to the light input/output portion 914 are formed at the leading end of the housing 910. Each guide portion 910a has two grooves 910ab formed in a side surface thereof. A driver IC which is an electronic element is mounted on the circuit substrate 950 in the housing 910, similarly to, for example, the optical module 100.

Figure 49:
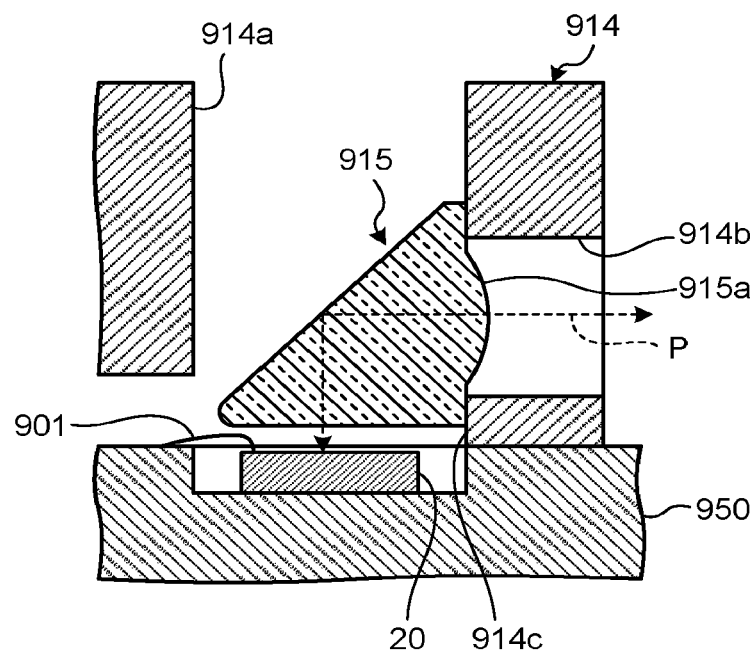
FIG. 49 is a cross-sectional view taken along the line C-C of FIG. 48.

FIG. 49 is a cross-sectional view taken along the line C-C of FIG. 48. The VCSEL array element 20 is mounted below the light input/output portion 914 on the circuit substrate 950. The VCSEL array element 20 is electrically connected to the driver IC by a bonding wire 901. The light input/output portion 914 has opening portions 914a, 914b, and 914c which are formed in the upper and lower surfaces and a side surface (the surface on which the guide pin 918 is formed). The light input/output portion 914 accommodates a prism lens array 915. The prism lens array 915 is arranged so as to correspond to the VCSEL array element 20. In the prism lens array 915, for example, 12 microlenses 915a corresponding to the number of VCSEL elements in the VCSEL array element 20 are arranged in a one-dimensional array on a side surface (the surface in which the opening portion 914b is formed) of a prism. The prism lens array 915 reflects a laser optical signal output from each VCSEL element and focuses the laser optical signal to achieve predetermined optical coupling to an external optical component, as represented by, for example, an optical path P. The prism lens array 915 is exposed to the outside through the opening portions 914a and 914b.

Returning to FIG. 48, the MT connector C2 is connected to the light input/output portion 914 of the optical module 900. The MT connector C2 has a structure in which a ferrule 960 is attached to the leading end of an optical fiber tape 970. The ferrule 960 has two guide holes 966 into which the two guide pins 918 of the light input/output portion 914 are inserted. When the MT connector C2 is connected to the light input/output portion 914, the ferrule 960 of the MT connector C2 is inserted between the two guide portions 910a and the two guide pins 918 are inserted into the two guide holes 966 to connect the light input/output portion 914 to the MT connector C2. Then, the MT connector C2 is fixed to the optical module 900 using the grooves 910ab of the guide portions 910a and a predetermined fixing tool.

Figure 50:
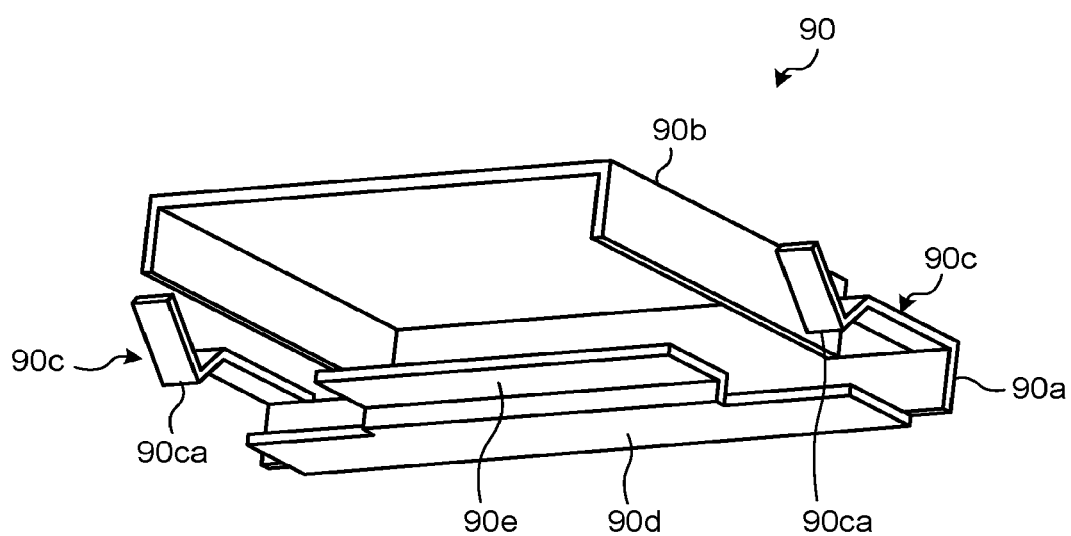
FIG. 50 is a perspective view schematically illustrating a protector which can be applied to the optical module illustrated in FIG. 48.

Next, a protector which can be applied to the optical module illustrated in FIG. 48 will be described. FIG. 50 is a perspective view schematically illustrating the protector which can be applied to the optical module illustrated in FIG. 48. A protector 90 includes a front protective portion 90a having a flat plate shape, an upper protective portion 90b which is a cover with a rectangular parallelepiped shape, extends from the front protective portion 90a in a direction perpendicular to the main surface of the front protective portion 90a, and has openings formed in a lower surface and a surface opposite to the front protective portion 90a, two fixing arms 90c which extend from the front protective portion 90a along both side surfaces of the upper protective portion 90b, a lower protective portion 90d which extends from the front protective portion 90a along an opening formed in the lower surface of the upper protective portion 90b, and a substrate fitting portion 90e which extends from the lower protective portion 90d and forms a step portion together with the lower protective portion 90d. The fixing arm 90c has a fitting portion 90ca which protrudes toward the lower protective portion 90d. The fixing arm 90c is substantially parallel to the lower protective portion 90d. For example, the protector 90 is manufactured by bending one metal plate.

Figure 51:
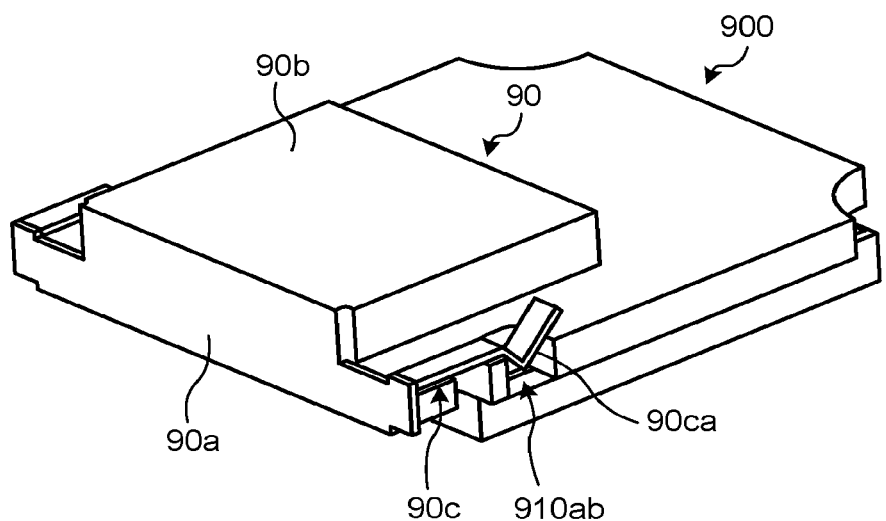
FIG. 51 is a diagram illustrating a state in which the protector illustrated in FIG. 50 is attached to the optical module illustrated in FIG. 48.
Figure 52:
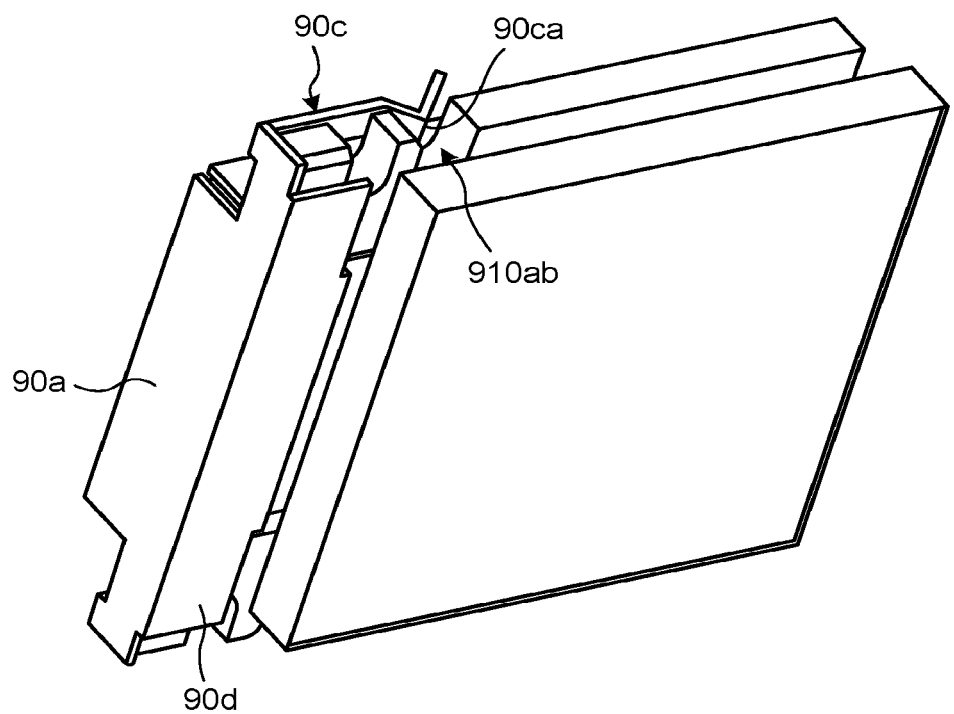
FIG. 52 is a diagram illustrating a state in which the protector illustrated in FIG. 50 is attached to the optical module illustrated in FIG. 48.

FIGS. 51 and 52 are diagrams illustrating a state in which the protector illustrated in FIG. 50 is attached to the optical module illustrated in FIG. 48. When the protector 90 is attached to the optical module 900, first, the light input/output portion 914 is covered with the upper protective portion 90b from the leading end of the optical module 900 and the protector 90 is slid to the optical module 900. Then, the substrate fitting portion 90e is inserted between the two guide portions 910a and each guide portion 910a is interposed between each fixing arm 90c and the lower protective portion 90d by the spring force of each fixing arm 90c. In this case, the fitting portion 90ca formed in the fixing arm 90c is fitted to the groove 910ab formed in the guide portion 910a. The protector 90 is fixed to the optical module 900 by the fitting.

In the state in which the protector 90 is attached to the optical module 900, a portion of the prism lens array 915 which is exposed through the opening portion 914a is covered and protected by the upper protective portion 90b. In addition, a portion of the prism lens array 915 which is exposed through the opening portion 914b is covered and protected by the front protective portion 90a. The lower protective portion 90d prevents, for example, dust from getting into the optical module from the lower side between the guide portions 910a. In this case, since the substrate fitting portion 90e is inserted between the guide portion 910a, the formation of a gap between the circuit substrate 950 and the lower protective portion 90d is prevented.

The protector 90 is attached to the optical module 900 when the optical module 900 is in storage or while the optical module 900 is being transported with being accommodated in a reel tape. In some cases, dust is generated in the vicinity of the optical module 900 during the storage or transportation of the optical module 900. When dust is attached to the surface of the prism lens array 915, the optical characteristics of the optical module 900 deteriorate due to the dust.

In contrast, the structure in which the protector 90 is attached to the optical module 900 can prevent, for example, dust from being attached to the surface of the prism lens array 915 even when dust is generated in the vicinity of the optical module 900 during the storage or transportation of the optical module 900.

When the optical module 900 is mounted on the circuit substrate, the protector 90 may be attached to the optical module 900 during the solder reflow mounting process. During the solder reflow mounting process, dust or a scatter from solder cream floats in the reflow furnace. The protector 90 is effective in protecting the optical module 900 from, for example, the floating matter.

After the optical module 900 is mounted on the circuit substrate, the protector 90 is removed. Then, the MT connector C2 is connected as illustrated in FIG. 48.

Figure 53:
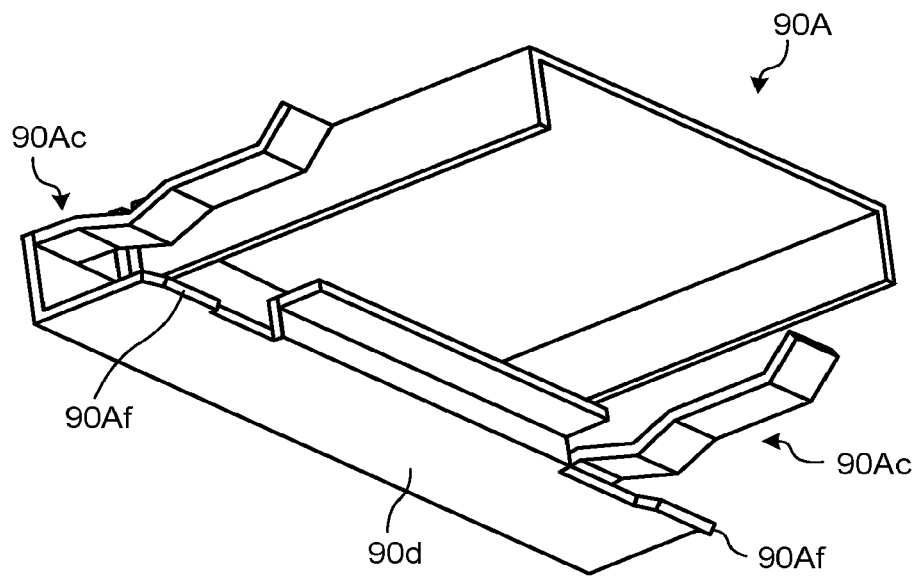
FIG. 53 is a perspective view schematically illustrating a protector according to another embodiment.
Figure 54:
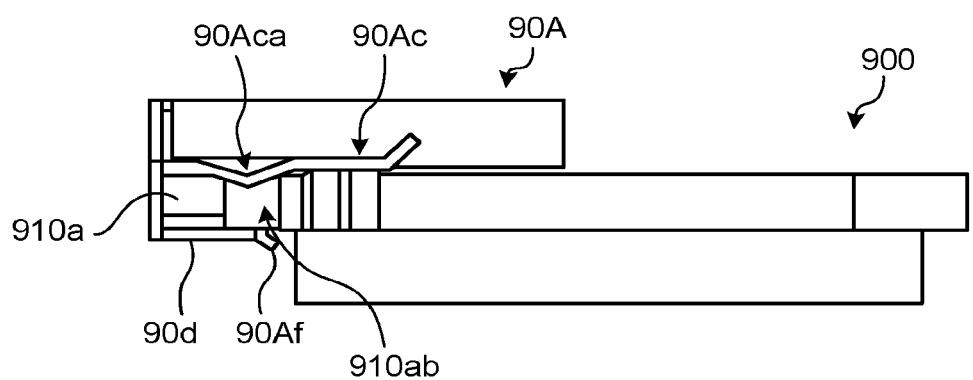
FIG. 54 is a diagram illustrating a state in which the protector illustrated in FIG. 53 is attached to the optical module illustrated in FIG. 48.

FIG. 53 is a perspective view schematically illustrating a protector according to another embodiment. FIG. 54 is a diagram illustrating a state in which the protector illustrated in FIG. 53 is attached to the optical module illustrated in FIG. 48. A protector 90A illustrated in FIGS. 53 and 54 differs from the protector 90 illustrated in FIG. 50 in the shape of a fixing arm. That is, while the fitting portion 90ca of the fixing arm 90c of the protector 90 is fitted to the rear groove of the two grooves 910ab formed in the guide portion 910a, a fitting portion 90Aca of a fixing arm 90Ac of the protector 90A is fitted to the front groove of the two grooves 910*ab* formed in the guide portion 910*a*. The leading end of a protruding portion of the fitting portion 90Aca may be closer to the front protective portion 90*a* than the substrate fitting portion 90*e*. In this case, the clamping force of each fixing arm 90Ac and the lower protective portion 90*d* on each guide portion 910*a* interposed therebetween is increased by the spring force of each fixing arm 90Ac. As a result, the risk of the protector 90A being detached from the optical module 900 is further reduced and a gap between the protector 90A and the optical module 900 is less likely to occur. Therefore, the effect of the protector 90A preventing the entrance of, for example, dust is further improved.

The protector 90A illustrated in FIGS. 53 and 54 includes plate-shaped guide portions 90Af which are provided at positions facing the fixing arms 90*c* so as to extend from the lower protective portion 90*d*. The guide portion 90Af extends from the lower protective portion 90*d* so as to be inclined downward. The guide portion 90Af makes it easy for the guide portion 910*a* of the optical module 900 to be inserted between the fixing arm 90*c* and the lower protective portion 90*d*.

Figure 61:
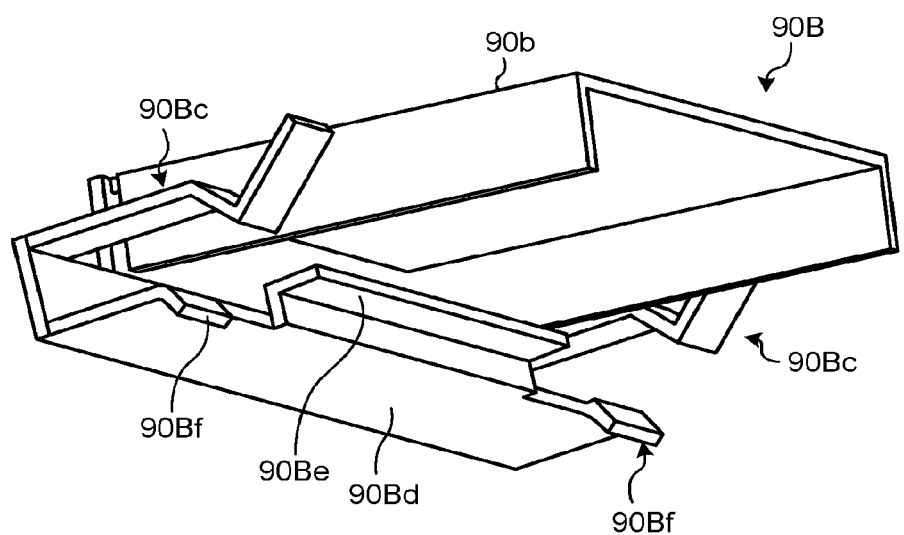
FIG. 61 is a perspective view schematically illustrating a protector according to still another embodiment.
Figure 62:
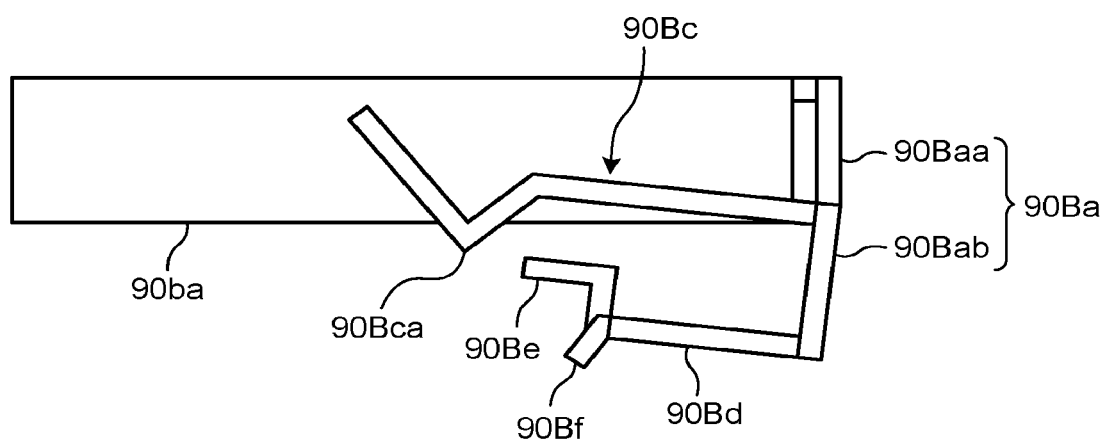
FIG. 62 is a side view schematically illustrating the protector illustrated in FIG. 61.
Figure 63:
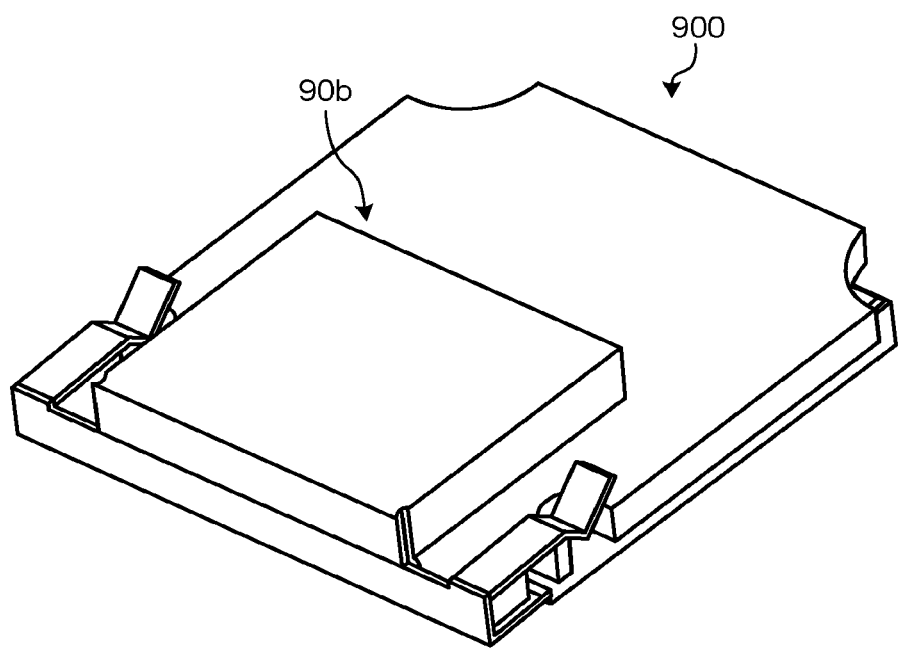
FIG. 63 is a diagram illustrating a state in which the protector illustrated in FIG. 61 is attached to the optical module illustrated in FIG. 48.
Figure 64:
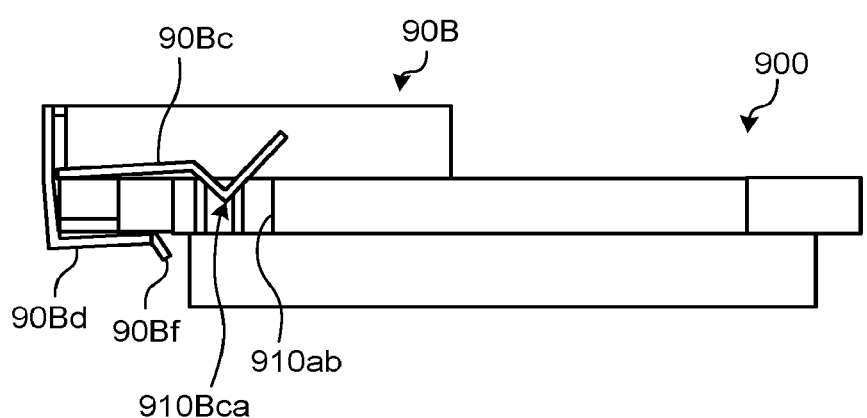
FIG. 64 is a diagram illustrating a state in which the protector illustrated in FIG. 61 is attached to the optical module illustrated in FIG. 48.

FIG. 61 is a perspective view schematically illustrating a protector according to another embodiment. FIG. 62 is a side view schematically illustrating the protector illustrated in FIG. 61. FIG. 63 is a diagram illustrating a state in which the protector illustrated in FIG. 61 is attached to the optical module illustrated in FIG. 48. FIG. 64 is a diagram illustrating a state in which the protector illustrated in FIG. 61 is attached to the optical module illustrated in FIG. 48.

Next, the difference between the protector 90 and a protector 90B will be mainly described. In the protector 90B, a front protective portion 90Ba includes a front protective portion upper part 90Baa and a front protective portion lower part 90Bab. The main surface of the front protective portion upper part 90Baa extends in a direction perpendicular to an upper protective portion 90*b*. The front protective portion lower part 90Bab is inclined with respect to the front protective portion upper part 90Baa in the direction in which the upper protective portion 90*b* extends.

In the protector 90B, two fixing arms 90Bc extend from the front protective portion lower part 90Bab along both side surfaces of an upper protective portion 90*b* so as to be inclined with respect to the upper protective portion 90*b*. The fixing arm 90Bc includes a fitting portion 90Bca which protrudes toward a lower protective portion 90Bd. The lower protective portion 90Bd extends from the front protective portion lower part 90Bab along an opening provided in the lower surface of the upper protective portion 90*b* so as to be inclined with respect to the upper protective portion 90*b*. A substrate fitting portion 90Be extends from the lower protective portion 90Bd so as to form a step portion together with the lower protective portion 90Bd. A guide portion 90Bf extends from the lower protective portion 90Bd at a position facing the fixing arm 90Bc. As illustrated in FIG. 62, the fixing arm 90Bc and the lower protective portion 90Bd are both inclined with respect to a lower-surface-side opening 90*bd* of the upper protective portion 90*b*. The fixing arm 90Bc is substantially parallel to the lower protective portion 90Bd.

When the protector 90B is attached to the optical module 900, first, the light input/output portion 914 is covered with the upper protective portion 90*b* from the leading end of the optical module 900 and the protector 90B is slid to the optical module 900. Then, the substrate fitting portion 90Be is inserted between two guide portions 910*a* and each guide portion 910*a* is interposed between each fixing arm 90Bc and the lower protective portion 90Bd by the spring force of each fixing arm 90Bc. In this case, the fitting portion 90Bca formed in the fixing arm 90Bc is fitted to the groove 910*ab* formed in the guide portion 910*a*. The protector 90B is fixed to the optical module 900 by the fitting. In addition, the guide portion 90Bf makes it easy for the guide portion 910*a* to be inserted between the fixing arm 90Bc and the lower protective portion 90Bd.

In the protector 90B, the fixing arm 90Bc and the lower protective portion 90Bd are both inclined with respect to the upper protective portion 90*b*. Therefore, the optical module 900 can be interposed between the upper protective portion 90*b* and the lower protective portion 90Bd. Then, the fixing arm 90Bc is fitted to the guide portion 910*a* and the guide portion 910*a* is interposed between the fixing arm 90Bc and the lower protective portion 90Bd. Therefore, even when the optical module 900 is inclined, the protector 90B does not come off the optical module 900.

However, in the case of the optical module 900 having the above-mentioned structure, in the actual use, the opening portion provided at the upper part of the light input/output portion is opened. Therefore, the upper opening portion may be protected by the following protective structure.

Figure 55:
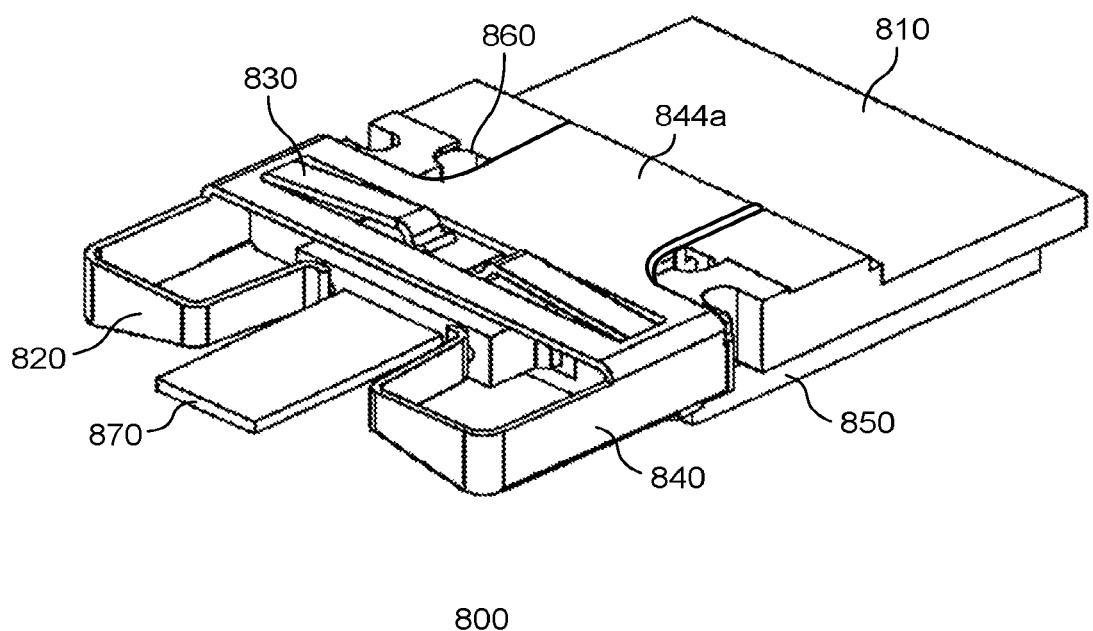
FIG. 55 is a diagram illustrating an optical module to which a protective structure is applied.

FIG. 55 is a diagram illustrating an optical module to which a protective structure is applied (see Japanese Patent No. 5117640). An optical module 800 includes a circuit substrate 850, a housing 810 which is mounted on the circuit substrate 850, an optical fiber tape 870 which transmits an optical signal through a ferrule 860, and a fixing member 840 which fixes the ferrule 860 to the housing 810 so as to be detachable from the housing 810.

A laser module including a light emitting element, such as a semiconductor laser, or a light receiving element, such as a photodiode, may be mounted on the circuit substrate 850. The semiconductor laser may be a surface-emitting semiconductor laser. The photodiode may be a pin photodiode. The thickness of the circuit substrate is, for example, about 1.5 mm.

The housing 810 may be made of ceramic. The thickest portion of the housing 810 may have a thickness of about a few millimeters. The thickness of the ferrule 860 is equal to or less than 1.6 mm. The fixing member 840 includes a first pressing portion 830 and a second pressing portion 820, which will be described below. The fixing member 840 is formed by processing a metal plate member with a thickness of about 0.2 mm. The metal material forming the fixing member 840 may be, for example, an aluminum alloy, a copper alloy, or stainless steel.

In the optical module 800, the circuit substrate 850 is coupled to the optical fiber tape 870 through the ferrule 860. That is, the optical module 800 converts an electric signal from the circuit substrate 850 into light and couples the light to the optical fiber tape 870 through the ferrule 860. In addition, the optical module 800 converts an optical signal from the optical fiber tape 870 into an electric signal and supplies the electric signal to an element on the circuit substrate 850. In this way, a detachable optical-electric connection is made between the circuit substrate 850 and the optical fiber tape 870.

Figure 56:
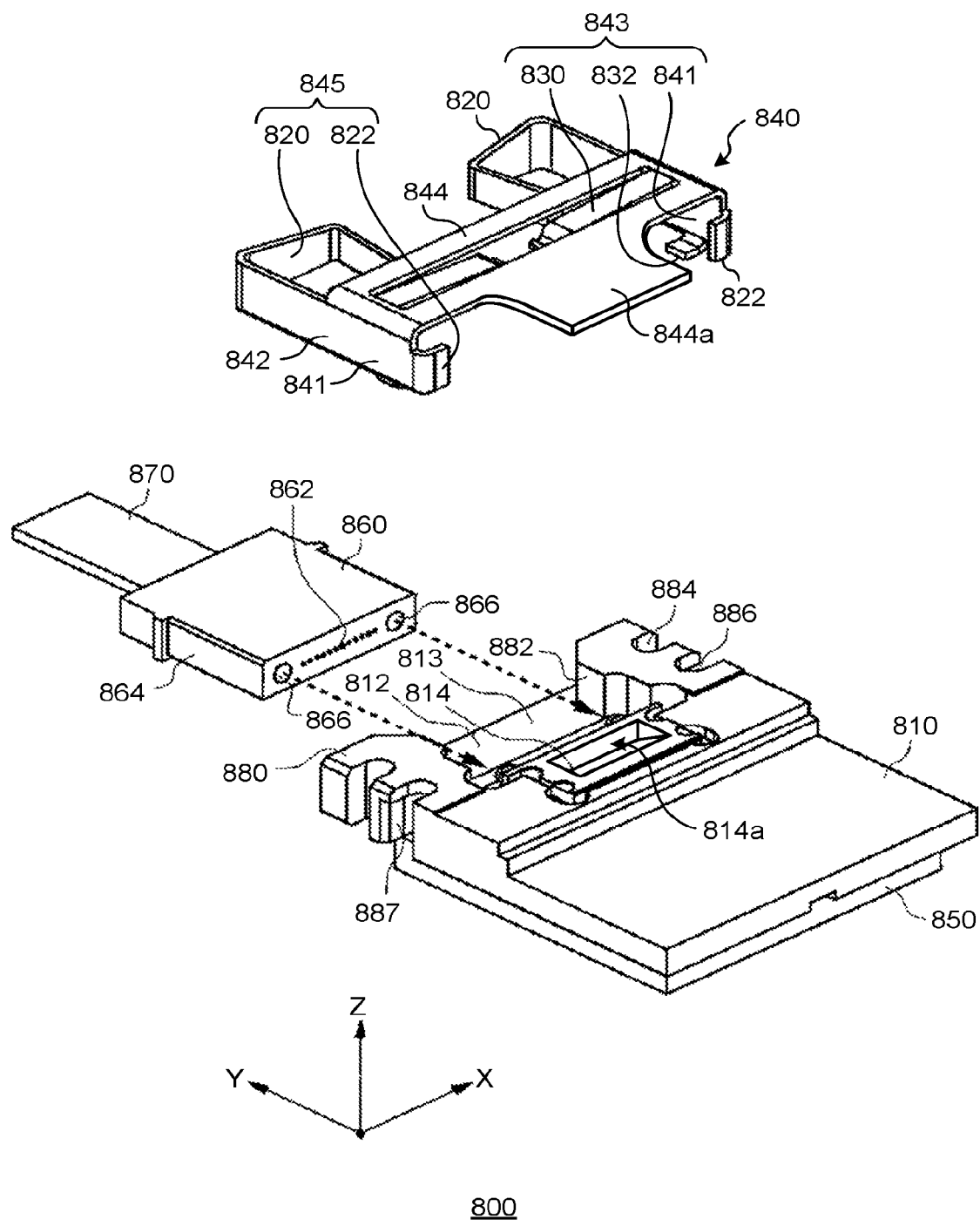
FIG. 56 is an exploded view illustrating the optical module illustrated in FIG. 55.

FIG. 56 is an exploded view illustrating the optical module 800. The ferrule 860 has a light input/output surface 862 to and from which an optical signal transmitted through a core portion of the optical fiber tape 870 is input and output. In FIG. 56, it is assumed that the normal direction of the light input/output surface 862 is the Y-axis. In addition, it is assumed that the normal direction of a mounting surface 813, which will be described below, is the Z-axis. It is assumed that a direction perpendicular to both the Y-axis and the Z-axis is the X-axis. At least two guide holes 866 are provided in the light input/output surface 862 of the ferrule 860. The guide holes 866 are fitted to guide pins formed on a light input/output portion 814, which will be described below, to position the ferrule 860. The ferrule 860 has a side surface 864 having the X-axis as the normal direction.

The housing 810 has a mounting portion 812 on which the ferrule 860 is placed. The mounting portion 812 may be a thin plate-shape member having a substantially parallelepiped shape which is provided at an end of the housing 810 close to the optical fiber tape 870. The mounting portion 812 may be provided such that the rear surface of the mounting portion 812 is in the same plane as the rear surface of the housing 810. In addition, the thickness of the mounting portion 812 in the Z-axis direction is less than that of a region of the housing 810 in which the light input/output portion 814, which will be described below, is provided. The mounting portion 812 may have substantially the same width as the housing 810 in the X-axis direction.

The mounting portion 812 has the mounting surface 813 which supports the ferrule 860. The mounting surface 813 has the Y-axis as a normal direction. The housing 810 includes the light input/output portion 814 which faces the light input/output surface 862 of the ferrule 860. The light input/output portion 814 is fixed to the housing 810. The light input/output portion 814 receives an optical signal between the light input/output surface 862 of the ferrule 860 and the circuit substrate 850. An optical element, such as a prism lens array, is accommodated in the light input/output portion 814. In addition, an opening portion 814a is formed in the upper surface of the light input/output portion 814 and a portion of the surface of the optical element accommodated in the light input/output portion 814 is exposed to the outside through the opening portion 814a.

The housing 810 includes guide portions 880 which guide the side surface 864 of the ferrule 860 in the Y-axis direction. The guide portion 880 may be a block-shaped member which extends from a surface of the housing 810 facing the ferrule 860 to the optical fiber tape 870. The guide portions 880 are provided at both ends of the mounting portion 812 in the X-axis direction so as to face each other. Each guide portion 880 has a guide surface 882 which is vertical to the mounting surface 813 and is parallel to the Y-axis direction. When the ferrule 860 is placed on the mounting portion 812, the guide surface 882 comes into contact with the side surface 864 of the ferrule 860.

The guide portion 880 includes a first groove 884 and a second groove 886 which extend from the front surface to the rear surface of the guide portion 880 in the Z-axis direction. The front surface of the guide portion 880 indicates a surface of the guide portion 880 opposite to the mounting portion 812. The rear surface of the guide portion 880 indicates a surface of the guide portion 880 which comes into contact with the mounting portion 812. The first groove 884 and the second groove 886 may be through holes which are formed at the outer end of the guide portion 880 and have a U-shape in a cross-sectional view. The outer end means an end of the guide portion 880 which is opposite to the surfaces of the two guide portions 880 facing each other.

The first groove 884 and the second groove 886 are arranged in a line in the Y-axis direction. A distance between the first groove 884 and the second groove 886 may be substantially equal to a distance between a supporting portion 832 and a contact portion 822, which will be described below, in the Y-axis direction. The term "substantially equal" means that, when a fixing member 840 is mounted from the upper side of the guide portion 880, the distance between the supporting portion 832 and the contact portion 822 is equal to the distance between the first and second grooves such that the supporting portion 832 and the contact portion 822 can pass through the first groove 884 and the second groove 886.

The first groove 884 is formed so as to further pass through the mounting portion 812. That is, the first groove 884 is formed so as to pass through both the guide portion 880 and the mounting portion 812. The second groove 886 may be formed in a region of the guide portion 880 which is placed on the circuit substrate 850. The second groove 886 does not pass through the circuit substrate 850. In addition, the second groove 886 may be formed so as to extend from the front surface of the guide portion 880 to the middle of the guide portion 880. That is, the second groove 886 may not pass through the guide portion 880.

The first groove 884 and the second groove 886 may have different widths in the Y-axis direction. The first groove 884 has a larger width than the supporting portion 832 and the second groove 886 has a larger width than the contact portion 822. The second groove 886 has a wall surface 887 on the side of the optical fiber tape 870. The wall surface 887 may be a flat surface having the Y-axis direction as the normal direction.

The fixing member 840 includes a first fixing portion 843 and a second fixing portion 845. The first fixing portion 843 fixes the ferrule 860 to the housing 810 in the Z-axis direction perpendicular to the mounting surface 813. The second fixing portion 845 fixes the ferrule 860 to the housing 810 in the Y-axis direction.

The first fixing portion 843 includes a base 841, a first pressing portion 830, and the supporting portion 832. The base 841 includes two wall portions 842 and a bridge portion 844 which connects the two wall portions 842. The base 841 is a rigid member and gives rigidity to the fixing member 840. The two wall portions 842 are provided so as to be perpendicular to the mounting surface 813, to extend in parallel to the Y-axis direction, and to face each other. The bridge portion 844 is parallel to the mounting surface 813, extends in a direction perpendicular to the Y-axis direction, and connects the two wall portions 842 at the upper end of the wall portion 842.

The first pressing portion 830 is provided in the base 841 and presses the ferrule 860 from the side opposite to the mounting surface 813. The first pressing portion 830 may be two leaf springs. The leaf spring has elastic force for pressing the ferrule 860 to the mounting surface 813. One end of each leaf spring is fixed to the upper end of the corresponding wall portion 842 of the base 841 and the leaf spring extends to the base 841 opposite to thereto. The other end of the leaf spring which is not fixed to the base 841 presses the ferrule 860 to the mounting surface 813.

The base 841 includes the two bridge portions 844. The two leaf springs are provided between the two bridge portions 844 so as to face each other. Before the fixing member 840 is fitted to the housing 810, the other end of the leaf spring which presses the ferrule 860 is located below the surface of the bridge portion 844 in the Z-axis direction. A protective structure 844a with a plate shape which extends in the negative Y-axis direction is provided in the bridge portion 844 close to the contact portion 822.

The supporting portion 832 extends from the lower end of each wall portion 842 to the opposite wall portion 842. The distance between the lower end of the wall portion 842 and the surface of the supporting portion 832 which extends to the opposite wall portion 842 in the Z-axis direction may be substantially equal to the thickness of the mounting portion 812 in the Z-axis direction. The supporting portion 832 may include two lower L-shaped portions provided in the base 841. The lower L-shaped portion has one end which is fixed to the lower end of the wall portion 842 of the base 841 opposite to the optical fiber tape 870 and the other end which supports the rear surface of the mounting portion 812. The two lower L-shaped portions extends from the lower end of the wall portion 842 in a direction in which it becomes further away from the wall portion 842 along the Z-axis direction and extends to the opposite wall portion 842. The two supporting portions 832 may be provided so as to face each other. The two lower L-shaped portions extend a distance of about 1 mm to 5 mm from the wall portion 842 in a direction close to the Y-axis.

The second fixing portion 845 includes a second pressing portion 820 and the contact portion 822. The second pressing portion 820 is provided in the base 841 and pressing the ferrule 860 to the light input/output portion 814 in the Y-axis direction. The second pressing portion 820 has a first state in which the second pressing portion 820 presses the ferrule 860 to the light input/output portion 814 in the Y-axis direction and a second state in which the second pressing portion 820 does not press the ferrule 860 to the light input/output portion 814. The second pressing portion 820 may include two springs which are provided in the corresponding base 841. Each spring may be formed in each base 841 so as to be symmetric with respect to a middle line between the two bases 841.

The second pressing portion 820 extends from an end of each wall portion 842 opposite to the contact portion 822 in the Y-axis direction, extends to the opposite wall portion 842, and extends to the contact portion 822 in the Y-axis direction. However, the second pressing portion 820 is not limited to the above-mentioned shape. Each of the two springs has one end which is fixed to the rear end of the wall portion 842 of the base 841 and the other end which presses the ferrule 860 in the Y-axis direction. The rear end of the wall portion 842 indicates a side end of the wall portion 842 close to the optical fiber tape 870.

When the second pressing portion 820 is in the first state, the contact portion 822 comes into contact with the housing 810 and fixes the second fixing portion 845 to the housing 810. For example, when the second pressing portion 820 is in the first state and presses the rear end of the ferrule 860 in a first direction facing the light input/output portion 814, the contact portion 822 presses the housing 810 in a direction opposite to the first direction to fix the second fixing portion 845.

The contact portions 822 are formed so as to extend from the opposite surfaces of the wall portions 842 to the opposite wall portions 842. The opposite surfaces mean the surfaces of the wall portions 842 which face each other. The contact portion 822 is formed so as to extend from an end, which is close to the light input/output portion 814, of the ends of the wall portion 842 in the Y-axis direction. The distance between the opposite surfaces of the two wall portions 842 is substantially equal to the distance between two end surfaces, in which the grooves are formed, in the two guide portions 880.

The contact portions 822 includes two lateral L-shaped portions which are formed in the two bases 841 so as to be symmetric with respect to a middle line between the two bases 841. Each lateral L-shaped portion extends from the end of the wall portion 842 in a direction in which it becomes further away from the end of the wall portion 842 along the Y-axis direction and extends to the opposite wall portion 842. The lateral L-shaped portion extends a distance of about 1 mm to 5 mm from the wall portion 842 to the opposite wall portion 842.

The first fixing portion 843 and the second fixing portion 845 are formed in the common base 841. The second pressing portion 820 is changed from the second state to the first state to move the base 841 relative to the mounting portion 812 in the Y-axis direction. For example, when the second pressing portion 820 presses the rear end of the ferrule 860, the base 841 is moved in a direction opposite to the pressing direction by reaction force to the pressing force. The first fixing portion 843 is moved from a second position to a first position with the movement of the base 841. For example, pressing working using a die may be performed for one metal plate to form the first fixing portion 843 and the second fixing portion 845.

As illustrated in FIGS. 55 and 56, the ferrule 860 is attached to the light input/output portion 814 and is fixed to the housing 810 by the fixing member 840. In this state, the protective structure 844a covers the opening portion 814a of the light input/output portion 814. Therefore, in the actual use, the optical element accommodated in the light input/output portion 814 is protected from, for example, dust.

Figure 57:
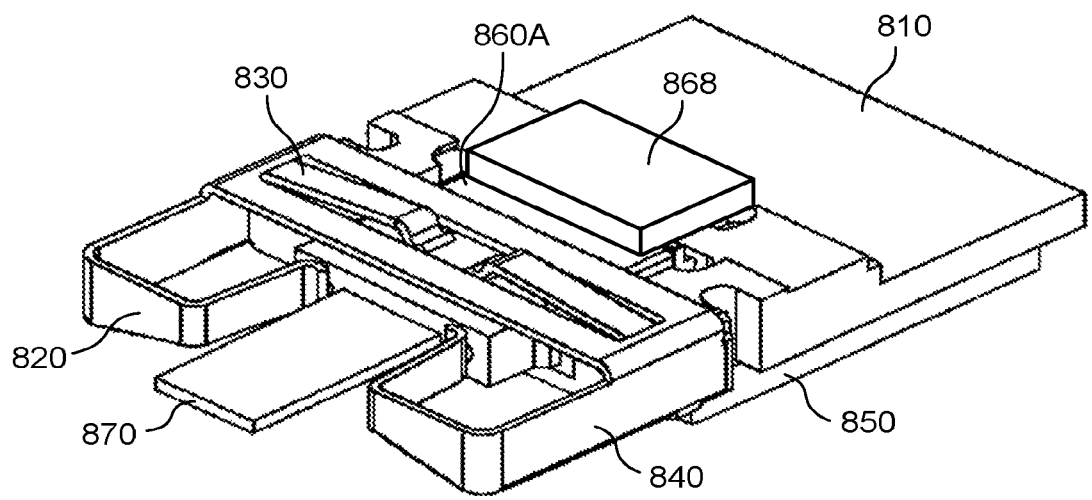
FIG. 57 is a diagram illustrating an optical module to which a protective structure according to another embodiment is applied.
Figure 58:
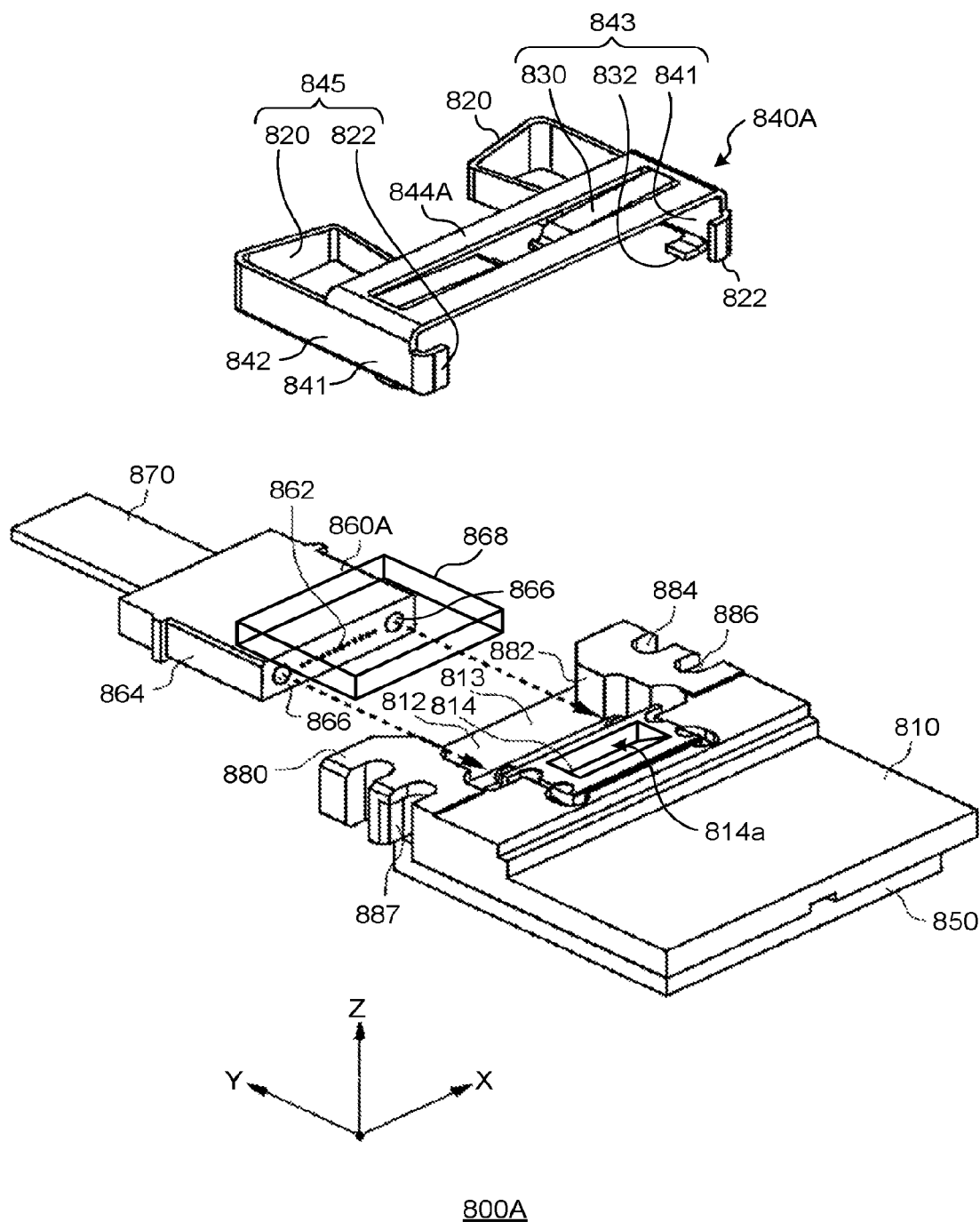
FIG. 58 is an exploded view illustrating the optical module illustrated in FIG. 57.

FIG. 57 is a diagram illustrating an optical module to which a protective structure according to another embodiment is applied. FIG. 58 is an exploded view illustrating the optical module illustrated in FIG. 57. An optical module 800A illustrated in FIGS. 57 and 58 differs from the optical module 800 illustrated in FIGS. 55 and 56 in that a fixing member 840A and a ferrule 860A replace the fixing member 840 and the ferrule 860, respectively.

The fixing member 840A differs from the fixing member 840 in that a bridge portion 844A without the protective structure 844a replaces the bridge portion 844. In addition, the ferrule 860A differs from the ferrule 860 in that it includes a plate-shape protective structure 868. In FIG. 58, for convenience of explanation, the protective structure 868 is transparently illustrated.

As illustrated in FIGS. 57 and 58, the ferrule 860A is attached to the light input/output portion 814 and is fixed to the housing 810 by the fixing member 840A. In this state, the protective structure 868 covers the opening portion 814a of the light input/output portion 814. Therefore, in the actual use, an optical element accommodated in the light input/output portion 814 is protected from, for example, dust.

In the above-described embodiment, the housing of the optical module has the waveguide introduction opening. However, when a circuit substrate in which an optical waveguide does not protrude from the surface is mounted, a housing without the waveguide introduction opening may be used. That is, for example, the frame member may have a square shape without an opening. However, it is preferable that the frame member have a U-shape in order to increase the arrangement area of the LGA.

The optical waveguide provided on the circuit substrate is not limited to the organic optical waveguide. Any optical waveguide may be provided on the circuit substrate as long as it protrudes from the surface of the substrate. For example, a ridge optical waveguide, such as a silicon wire waveguide, an optical fiber sheet, or a PLC chip may be used as the optical waveguide.

A method for mounting the optical module on the circuit substrate is not limited to the flip-chip bonding method. For example, the optical module may be mounted on the circuit substrate by reflow or solder stud welding. In addition, a communication system using the optical module or the circuit substrate may be constructed.

As described above, the invention is mainly useful for optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
a housing including an internal space that has an opening in a substrate mounting surface, an element mounting surface that forms a portion of an inner surface of the internal space, and a waveguide introduction opening that is formed in a side surface intersecting the substrate mounting surface and is connected to the opening and the internal space;
an optical element that is mounted on the element mounting surface;
an electronic element that is mounted on the element mounting surface and is connected to the optical element;
a lens element that is arranged to correspond to the optical element;
a holding mechanism that holds the lens element at an arranged position;
an attachment structure that attaches a protector to the optical module, the protector being configured to cover and protect an exposed surface of the lens element,
wherein, when the substrate mounting surface is mounted on a circuit substrate, an optical waveguide that protrudes from a surface of the circuit substrate is introduced into the internal space through the waveguide introduction opening, and
the protector is attached through the waveguide introduction opening.

2. The optical module according to claim 1, wherein the housing further includes a plate member that has the element mounting surface and a frame member that is bonded to the plate member and has the substrate mounting surface.

3. The optical module according to claim 1, wherein the housing further includes a guide hole for alignment when the optical module is mounted on the circuit substrate.

4. The optical module according to claim 1,
wherein the holding mechanism has two guide holes which are formed so as to be fitted to an MT-type optical connector.

5. The optical module according to claim 4, further comprising a spacer that is interposed between the holding mechanism and the element mounting surface.

6. The optical module according to claim 5, wherein a thickness of the spacer is selected such that a variation in a distance from the substrate mounting surface to a focusing point of the lens element due to a tolerance of the height of the internal space is corrected to be reduced.

7. The optical module according to claim 4, wherein the holding mechanism is made of metal, and a gap between the holding mechanism and the electronic element is filled with a resin with thermal conductivity.

8. The optical module according to claim 1, wherein the electronic element is mounted in a concave portion that is formed in the element mounting surface.

9. The optical module according to claim 1, wherein the housing has a radiation structure that is formed so as to pass through the housing from a rear surface side of the electronic element.

10. The optical module according to claim 9, wherein the radiation structure is a radiation member that is buried in the housing.

11. A circuit substrate comprising:
an optical waveguide that protrudes from a surface of the circuit substrate; and
the optical module according to claim 1 that has the substrate mounting surface mounted on the circuit substrate such that the optical waveguide is introduced into the internal space through the waveguide introduction opening.

12. An optical module-mounted circuit substrate comprising:
the optical module according to claim 1;
an optical coupling member that is optically coupled with the optical module; and
a circuit substrate on which the optical module and the optical coupling member are mounted and which has a main surface having an opening formed therein and is electrically connected to the optical module,
wherein the positioning of the optical module and the optical coupling member in at least a horizontal direction of the main surface of the circuit substrate is performed through the opening.

13. The optical module-mounted circuit substrate according to claim 12, wherein the positioning in the horizontal direction is performed by alignment between positioning means which are provided in the optical module and the optical coupling member.

14. The optical module-mounted circuit substrate according to claim 13, wherein the horizontal-direction positioning means are a structure for fitting a guide pin to a guide pin hole.

15. The optical module-mounted circuit substrate according to claim 12, further comprising a fixing means that positions the height of an optical connection portion of the optical coupling member in a direction perpendicular to the circuit substrate.

16. The optical module-mounted circuit substrate according to claim 12, wherein the optical module is fixed to a circuit pattern provided on the circuit substrate by soldering.

17. The optical module-mounted circuit substrate according to claim 12, wherein the optical module is detachably fixed to a circuit pattern provided on the circuit substrate and is electrically connected to the circuit pattern.

18. The optical module-mounted circuit substrate according to claim 12, wherein an optical glass, a lens, or a spot size conversion means is provided in the opening.

19. An optical module evaluation kit system for evaluating an optical module, comprising:
the optical module-mounted circuit substrate according to claim 12.

20. A communication system comprising:
the optical module according to claim 1.

21. A communication system comprising:
a circuit substrate according to claim 11.

22. A communication system comprising:
an optical module-mounted circuit substrate according to claim 12.

23. An optical module mounting method comprising:
attaching, to the optical module according to claim 1, the protector that covers and protects a surface from which the optical element is exposed; and
mounting the optical module on the circuit substrate, with the substrate mounting surface facing the circuit substrate.

24. The optical module according to claim 1, wherein the attachment structure includes a slit formed in the holding mechanism and the protector includes a plate section, part of the plate section being inserted into the slit to attach the protector to the optical module.

25. The optical module according to claim 24, wherein the protector further includes a spring part, wherein a part of the plate section is inserted into the slit, a shape of a combination of the plate section and the spring part covers the waveguide introduction opening and sandwich the optical module in a thickness direction of the optical module.

* * * * *